US012684925B2

(12) United States Patent
Park et al.

(10) Patent No.: US 12,684,925 B2
(45) Date of Patent: Jul. 14, 2026

(54) DISPLAY DEVICE AND METHOD OF FABRICATING THE SAME

(71) Applicant: Samsung Display Co., LTD., Yongin-si (KR)

(72) Inventors: Do Yeong Park, Yongin-si (KR); Sung Chul Hong, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 493 days.

(21) Appl. No.: 18/118,871

(22) Filed: Mar. 8, 2023

(65) Prior Publication Data

US 2024/0038821 A1     Feb. 1, 2024

(30) Foreign Application Priority Data

Jul. 28, 2022     (KR) ........................ 10-2022-0093793

(51) Int. Cl.
  *H10H 29/14*          (2025.01)
  *G09G 3/32*           (2016.01)
      (Continued)
(52) U.S. Cl.
  CPC ............. *H10H 29/142* (2025.01); *G09G 3/32* (2013.01); *H10H 20/01* (2025.01);
      (Continued)
(58) Field of Classification Search
  CPC .... H10H 29/142; H10H 20/01; H10H 20/821; H10H 20/84; H10H 20/85;
      (Continued)

(56) References Cited

U.S. PATENT DOCUMENTS 11,239,300 B2     2/2022  Lee et al.
11,716,887 B2     8/2023  Kim
          (Continued)

FOREIGN PATENT DOCUMENTS

KR     10-2017-0141305      12/2017
KR     10-2018-0009014       1/2018
          (Continued)

*Primary Examiner* — S M Sohel Imtiaz
(74) *Attorney, Agent, or Firm* — Womble Bond Dickinson (US) LLP

(57)          ABSTRACT

A display device includes a light-emitting element layer on a substrate, and a circuit element layer between the substrate and the light-emitting element layer. The circuit element layer includes a first metal layer including lines, and metal patterns, all in a same layer and extending in a direction and spaced apart from one another, and an upper gate line on the first metal layer. The light-emitting element layer includes first alignment electrodes and a second alignment electrode, disposed in a same layer and spaced apart from one another, light-emitting elements in gaps between the first alignment electrodes and the second alignment electrode, a first contact electrode on the light-emitting elements and in contact with first end portions of the light-emitting elements, and a first power connector, disposed in a same layer as the first contact electrode and electrically connecting the first voltage line and the metal patterns.

15 Claims, 33 Drawing Sheets

(51) Int. Cl.
 *H10H 20/01* (2025.01)
 *H10H 20/821* (2025.01)
 *H10H 20/84* (2025.01)
(52) U.S. Cl.
 CPC .......... *H10H 20/821* (2025.01); *H10H 20/84* (2025.01); *G09G 2300/0426* (2013.01); *G09G 2310/0202* (2013.01); *G09G 2320/041* (2013.01); *G09G 2330/021* (2013.01)
(58) Field of Classification Search
 CPC .... H10H 20/8314; G09G 3/32; H01L 25/167; H10D 86/60; H10D 86/451; H10D 86/021; H10D 86/441
 See application file for complete search history.

(56) References Cited

U.S. PATENT DOCUMENTS

| | | | |
|---|---|---|---|
| 12,408,519 B2 | 9/2025 | Lee et al. | |
| 12,490,569 B2 | 12/2025 | Kang et al. | |
| 2017/0256520 A1* | 9/2017 | Moon | H10H 20/857 |
| 2020/0135971 A1* | 4/2020 | Beak | H10K 59/173 |
| 2020/0168777 A1* | 5/2020 | Kang | H01L 25/0753 |
| 2020/0176391 A1* | 6/2020 | Lim | H01L 23/5226 |
| 2020/0273906 A1* | 8/2020 | Li | H10H 20/831 |
| 2021/0005794 A1* | 1/2021 | Sakong | H10H 20/851 |
| 2021/0111323 A1* | 4/2021 | Kim | H10H 20/819 |
| 2021/0202659 A1* | 7/2021 | Lee | H10K 71/60 |
| 2022/0199677 A1 | 6/2022 | Park et al. | |
| 2023/0118885 A1* | 4/2023 | Rhe | G06F 3/0412 345/173 |
| 2026/0090162 A1 | 3/2026 | Kang et al. | |

FOREIGN PATENT DOCUMENTS

| | | |
|---|---|---|
| KR | 10-2018-0011404 | 2/2018 |
| KR | 1020200064207 A | 6/2020 |
| KR | 1020210074456 A | 6/2021 |
| KR | 10-2022-0034271 | 3/2022 |
| KR | 1020220094310 A | 7/2022 |

* cited by examiner

FIG. 1

GL: VGL, HGL, BGL
SP: SP1, SP2, SP3

FIG. 3

MDCL: MDCL1, MDCL2, MDCL3
RSA: RSA1, RSA2, RSA3

CNP : CNP1, CNP2

MTL1 : VDL, CPE1, VIL, DL1
ACTL : DE1, ACT1, SE1, DE2, ACT2, SE2
MTL2 : AUP1d, GE1, CPE2, GE2
MTL3 : AUP2d, CE6, CE7, CE10, CE8

MTL1 : VVSL, VVSP
MTL3 : CE1, CE2, CE3
CNEL1 : CNP
CNP : CNP1

EDL

RME1
EMA2
EMA1

ED1

BP1
BP3
ED2
BP2

RME2
RME1

ED3
ED4

RMH

BP1
ED4
X5 BP3
ED3
BP2

ED1

ED2

RMH

X5'

ED1
ED2

RME1

EMA3

ED4

BNL

BP3
BP1
ED3
BP2

RME2
RME1

DR2

DR3 → DR1

CNE : CNEL1, CNEL2
CNEL1 : CNE1, CNE3, CNE5, CNP
RME : RME1, RME2
ED : ED1, ED2, ED3, ED4
CNP : CNP1, CNP2

CNP_2 : CNP1_2, CNP2_2

MDCL: MDCL1, MDCL2, MDCL3
RSA: RSA1, RSA2, RSA3
CNA: CNA1, CNA2

DISPLAY DEVICE AND METHOD OF FABRICATING THE SAME

CROSS-REFERENCE TO RELATED APPLICATION(S)

This application claims priority to and benefits of Korean Patent Application No. 10-2022-0093793 under 35 U.S.C. § 119, filed on Jul. 28, 2022 in the Korean Intellectual Property Office, the entire contents of which are herein incorporated by reference.

BACKGROUND

1. Technical Field

The disclosure relates to a display device and a method of fabricating the same.

2. Description of the Related Art

Display devices have increasingly become of importance with the development of multimedia, and various types of display devices, such as an organic light-emitting diode (OLED) display device, a liquid crystal display (LCD) device, or the like, have been used.

A display device, which is a device for displaying an image, may include a display panel such as an OLED display panel or an LCD panel. The display panel may include light-emitting elements such as light-emitting diodes (LEDs), and the LEDs may be classified into OLEDs using an organic material as a fluorescent material and inorganic LEDs using an inorganic material as a fluorescent material.

Inorganic LEDs, which use an inorganic semiconductor as a fluorescent material, may be durable even in a high-temperature environment and may have a higher blue light efficiency than OLEDs.

SUMMARY

Aspects of the disclosure provide a display device capable of enhancing the degree of alignment of light-emitting elements and improving power consumption and heat dissipation.

Aspects of the disclosure also provide a method of fabricating a display device capable of enhancing the degree of alignment of light-emitting elements and improving power consumption and heat dissipation.

However, aspects of the disclosure are not restricted to those set forth herein. The above and other aspects of the disclosure will become more apparent to one of ordinary skill in the art to which the disclosure pertains by referencing the detailed description of the disclosure given below.

According to an embodiment of the disclosure, a display device may include a light-emitting element layer disposed on a substrate, and a circuit element layer disposed between the substrate and the light-emitting element layer. The circuit element layer may include a first metal layer including data lines, a first voltage line, and first metal patterns, which may all be disposed in a same layer and extend in a first direction and may be spaced apart from one another in a second direction intersecting the first direction, and an upper gate line, which may be disposed on the first metal layer and extend in the second direction. The light-emitting element layer may include first alignment electrodes and a second alignment electrode, which may be disposed in a same layer and may be spaced apart from one another, light-emitting elements, which may be disposed in gaps between the first alignment electrodes and the second alignment electrode, a first contact electrode, which may be disposed on the light-emitting elements and may be in contact with first end portions of the light-emitting elements, and a first power connector, which may be disposed in a same layer as the first contact electrode and electrically connects the first voltage line and the first metal patterns.

In an embodiment, a display device may further include an interlayer insulating layer disposed between the first metal layer and the upper gate line. The first metal layer may further include a lower gate line, which extends in the first direction. The upper gate line may be electrically connected to the lower gate line through a contact penetrating the interlayer insulating layer. The lower gate line and the first metal patterns may be spaced apart from one another in the first direction and may be electrically insulated from one another.

In an embodiment, gaps between the lower gate line and the first metal patterns may be disposed between the first metal patterns and the contact.

In an embodiment, the lower gate line and the first voltage line may be electrically insulated from each other.

In an embodiment, a display device may further include a via insulating layer disposed between the light-emitting element layer and the circuit element layer, a first connecting electrode disposed in a same layer as the upper gate line and electrically connected to the first voltage line through a first contact hole penetrating the interlayer insulating layer, and a second connecting electrode disposed in the same layer as the upper gate line and electrically connected to the first metal patterns through a second contact hole penetrating the interlayer insulating layer. The first power connector may be in direct contact with the first connecting electrode through a third contact hole penetrating the via insulating layer and may be in direct contact with the second connecting electrode through a fourth contact hole penetrating the via insulating layer.

In an embodiment, the first alignment electrodes and the second alignment electrode may be disposed on the via insulating layer, the display device may further include a first insulating layer disposed on the first alignment electrodes and the second alignment electrode. The light-emitting elements may be disposed on the first insulating layer.

In an embodiment, the third and fourth contact holes may penetrate the first insulating layer, and the third and fourth contact holes may penetrate the via insulating layer.

In an embodiment, a display device may further include a bank layer disposed on the first insulating layer and defining an emission area where the light-emitting elements are disposed, wherein at least part of the emission area overlaps the first metal patterns in a thickness direction.

In an embodiment, the first power connector may not overlap the emission area in the thickness direction, and the first power connector may not overlap the bank layer in the thickness direction.

In an embodiment, the first metal layer may further include second metal patterns, which extend in the first direction, the second metal patterns may be spaced apart from the data lines, the first voltage line, and the first metal patterns in the second direction, and the first power connector may electrically connect the first voltage line, the first metal patterns, and the second metal patterns.

In an embodiment, first, second, and third display areas, which are sequentially arranged in the second direction, may be defined on the substrate, the first metal layer may further include first, second, and third lower gate lines, which extend in the first direction and are spaced apart from one another, the first lower gate line may overlap the first display area, the second lower gate line may overlap the second display area, the third lower gate line may overlap the third display area, and the upper gate line may extend in the second direction across the first, second, and third display areas and may be electrically connected to the first, second, and third lower gate lines through first, second, and third contacts, respectively.

In an embodiment, the first metal patterns may be electrically insulated from the first, second, and third lower gate lines, and the second metal patterns may be electrically insulated from the first, second, and third lower gate lines.

In an embodiment, a display device may further comprise a second power connector disposed in a same layer as the first power connector. The first metal layer may further include a second voltage line and second metal patterns, which extend in the first direction. The second voltage line and the second metal patterns may be spaced apart from the data lines, the first voltage line, and the first metal patterns in the second direction. First and second voltages, which have different electric potential levels, may be applied to the first and second voltage lines, respectively. The second power connector may electrically connect the second voltage line and the second metal patterns.

In an embodiment, the first and second power connectors may be electrically connected.

In an embodiment, the first metal patterns and the second metal patterns may be disposed in a gap between the first and second voltage lines.

According to an embodiment of the disclosure, a method of fabricating a display device may include forming, on a substrate, a first metal layer including data lines, a first voltage line, and first metal patterns, which are disposed in a same layer and extend in a first direction and are spaced apart from one another in a second direction intersecting the first direction, forming, on the first metal layer, a second metal layer including gate lines, which are disposed on the data lines and extend in the second direction, forming, on the second metal layer, a third metal layer including first alignment electrodes and a second alignment electrode, which are disposed in the same layer and are spaced apart from one another, aligning light-emitting elements in gaps between the first alignment electrodes and the second alignment electrode, and forming, on the aligned light-emitting elements, a fourth metal layer including a first connecting electrode, which is in contact with first end portions of the light-emitting elements, and a power connector, which is disposed in a same layer as the first connecting electrode and electrically connects the first voltage line and the first metal patterns.

In an embodiment, the aligning of the light-emitting elements, may include forming a bank layer, which defines an emission area where the light-emitting elements are disposed.

In an embodiment, the aligning of the light-emitting elements, may further include ejecting ink having the light-emitting elements dispersed therein onto the emission area.

In an embodiment, the aligning of the light-emitting elements, may further include forming electric fields by applying voltages having different electric potential levels to the first alignment electrodes and the second alignment electrode, and aligning the light-emitting elements dispersed in the ink, by using dielectrophoretic forces from the electric fields.

In an embodiment, in the aligning of the light-emitting elements, the first metal patterns and the first voltage may be electrically insulated from one another.

According to the aforementioned and other embodiments of the disclosure, the degree of alignment of light-emitting elements can be enhanced, and power consumption and heat dissipation can be improved.

Also, a display device capable of enhancing the degree of alignment of light-emitting elements and improving power consumption and heat dissipation can be provided.

It should be noted that the effects of the disclosure are not limited to those described above, and other effects of the disclosure will be apparent from the following description.

BRIEF DESCRIPTION OF THE DRAWINGS

The above and other aspects and features of the disclosure will become more apparent by describing in detail embodiments thereof with reference to the attached drawings, in which:

FIG. 1 is a schematic plan view of a display device according to an embodiment of the disclosure;

FIG. 3 schematically illustrates contact lines that divide remainder areas and signal areas of the display device and also illustrates dummy areas of the display device of FIG. 1;

DETAILED DESCRIPTION OF THE EMBODIMENTS

Figure 2:
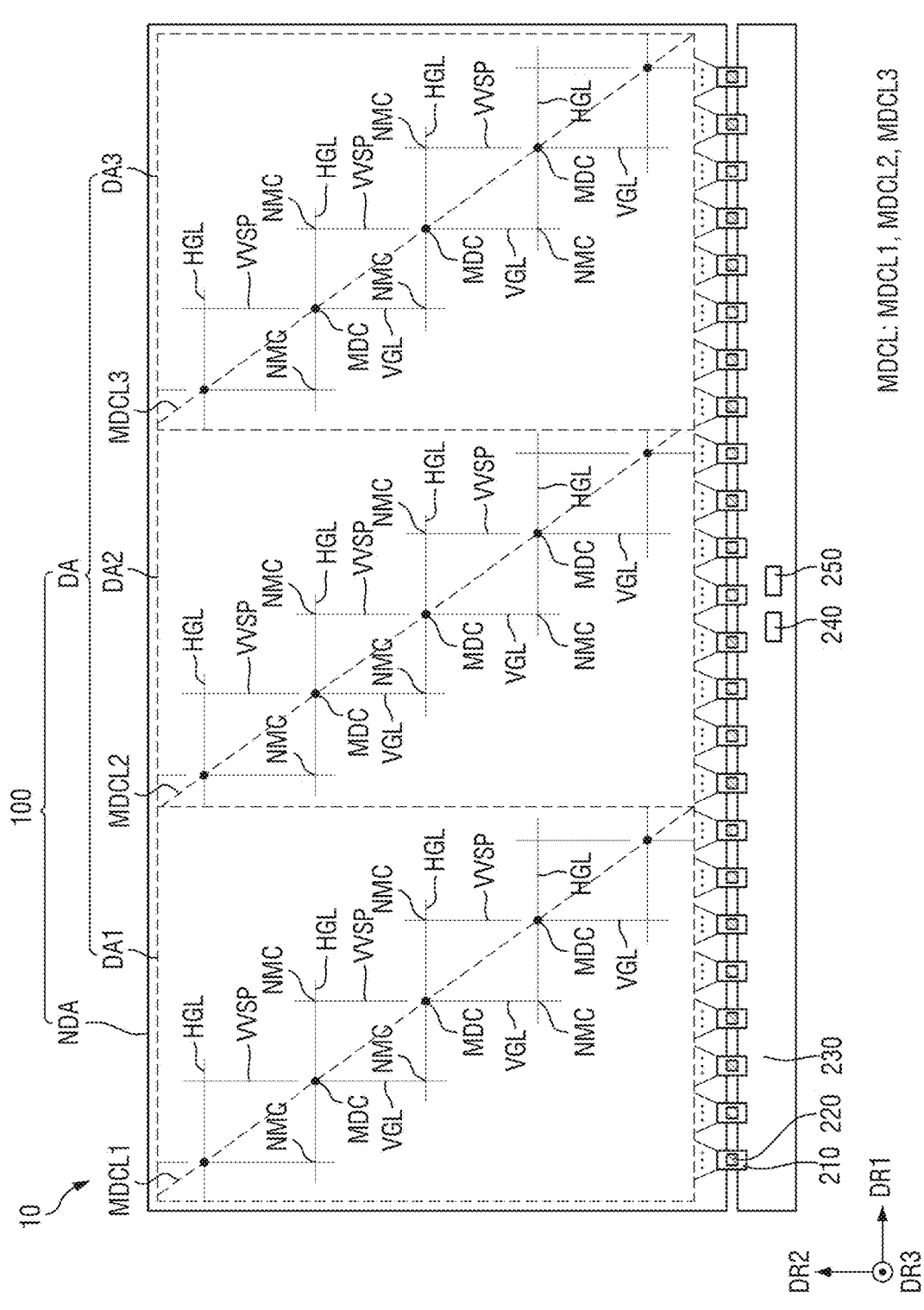
FIG. 2 is a schematic plan view illustrating contacts of vertical gate lines and horizontal lines of the display device of FIG. 1.

The disclosure will now be described more fully hereinafter with reference to the accompanying drawings, in which embodiments of the disclosure are shown. This disclosure may, however, be embodied in different forms and should not be construed as limited to the embodiments set forth herein. Rather, these embodiments are provided so that this disclosure will be thorough and complete, and will fully convey the scope of the disclosure to those skilled in the art.

As used herein, the singular forms, "a," "an," and "the" are intended to include the plural forms as well, unless the context clearly indicates otherwise.

It will also be understood that when a layer is referred to as being "on" another layer or substrate, it can be directly on the other layer or substrate, or intervening layers may also be present. The same reference numbers indicate the same components throughout the specification.

It will be understood that, although the terms "first," "second," etc. may be used herein to describe various elements, these elements should not be limited by these terms. These terms are only used to distinguish one element from another element. For instance, a first element discussed below could be termed a second element without departing from the teachings of the disclosure. Similarly, the second element could also be termed the first element.

Features of each of various embodiments of the disclosure may be partially or entirely combined with each other and may technically variously interwork with each other, and respective embodiments may be implemented independently of each other or may be implemented together in association with each other.

The terms "overlap" or "overlapped" mean that a first object may be above or below or to a side of a second object, and vice versa. Additionally, the term "overlap" may include layer, stack, face or facing, extending over, covering, or partly covering or any other suitable term as would be appreciated and understood by those of ordinary skill in the art.

When an element is described as "not overlapping" or to "not overlap" another element, this may include that the elements are spaced apart from each other, offset from each other, or set aside from each other or any other suitable term as would be appreciated and understood by those of ordinary skill in the art.

In the specification and the claims, the term "and/or" is intended to include any combination of the terms "and" and "or" for the purpose of its meaning and interpretation. For example, "A and/or B" may be understood to mean any combination including "A, B, or A and B." The terms "and" and "or" may be used in the conjunctive or disjunctive sense and may be understood to be equivalent to "and/or."

In the specification and the claims, the phrase "at least one of" is intended to include the meaning of "at least one selected from the group of" for the purpose of its meaning and interpretation. For example, "at least one of A and B" may be understood to mean any combination including "A, B, or A and B."

Unless otherwise defined, all terms (including technical and scientific terms) used herein have the same meaning as commonly understood by one of ordinary skill in the art to which the disclosure pertains. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 1:
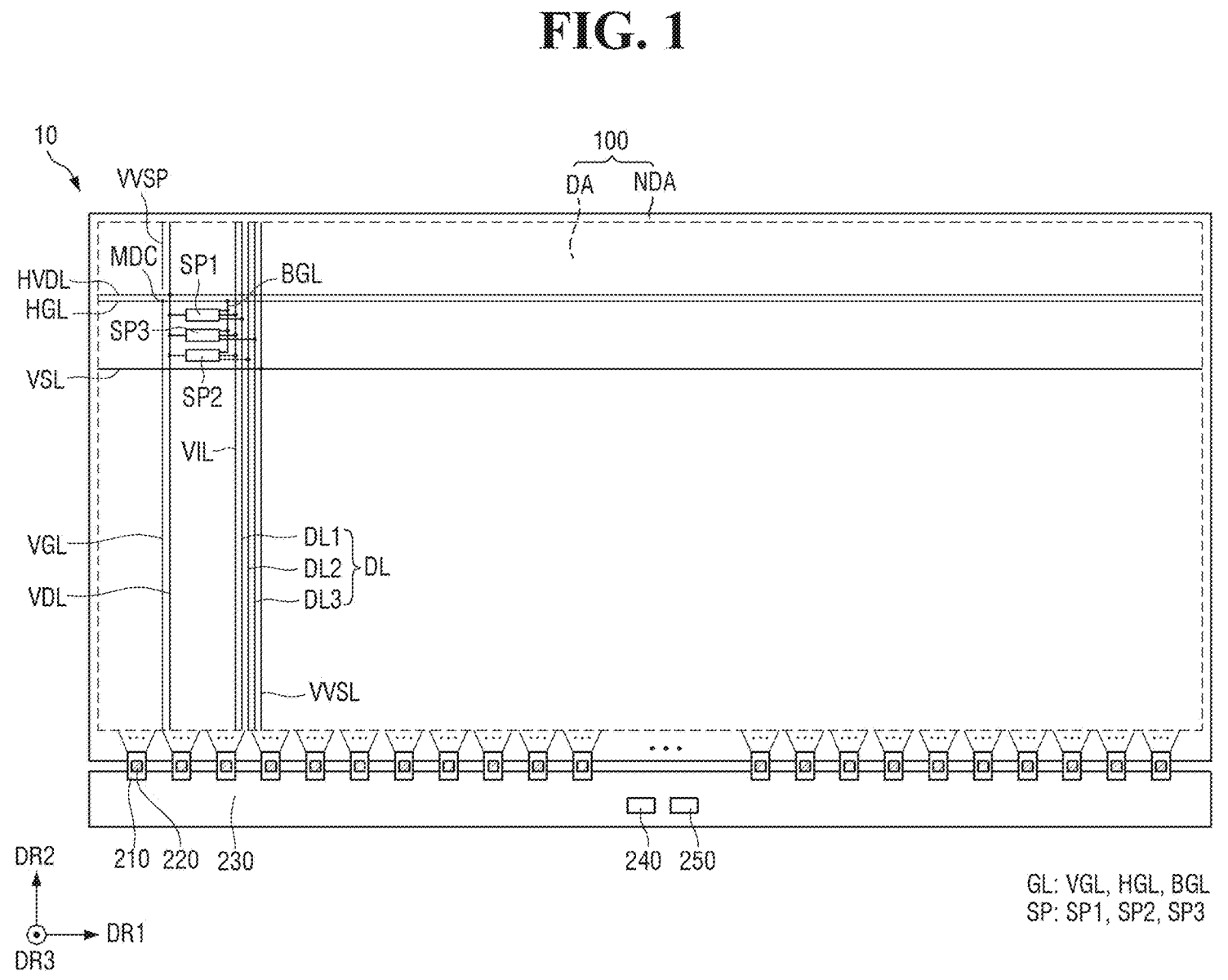

FIG. 1 is a schematic plan view of a display device according to an embodiment of the disclosure.

First, second, and third directions DR1, DR2, and DR3 may be defined as illustrated in FIG. 1. The first and second directions DR1 and DR2 may be orthogonal to each other, and the second and third directions DR2 and DR3 may be orthogonal to each other. The first direction DR1 may be a horizontal direction, the second direction DR2 may be a vertical direction, and the third direction DR3 may be a top-to-down direction. Unless otherwise specified, a particular direction may refer to both sides in the particular direction. If there is the need to distinguish one side from the other side in the particular direction, one side in the particular direction may be referred to as a first side, and the other side in the particular direction may be referred to as a second side. Referring to FIG. 1, a direction indicated by an arrow may be referred to as a first side, and the opposite direction thereof may be referred to as a second side.

For convenience, a surface of the display device 10 (or each element of the display device 10) that faces the direction where an image is displayed, i.e., the third direction DR3, will hereinafter be referred to as, but is not limited to, a top surface, and the other surface of the display device 10 (or each element of the display device 10 will hereinafter be referred to as, but is not limited to, a bottom surface. In other embodiments, the surface of the display device 10 (or each element of the display device 10) that faces the third direction DR3 may be referred to as a front surface or a first surface, and the other surface of the display device 10 (or each element of the display device 10) may be referred to as a rear surface or a second surface. One side or a first side, in the third direction DR3, of each element of the display device 10 may be referred to as a top side, and the other side or a second side, in the third direction DR3, of each element of the display device 10 may be referred to as a bottom side.

Referring to FIG. 1, the display device 10, which is a device for displaying a moving or still image, may be used not only as the display screen of a portable electronic device such as a mobile phone, a smartphone, a tablet personal computer (PC), a smartwatch, a watchphone, a mobile communication terminal, an electronic notepad, an electronic book (e-book), a portable multimedia player (PMP), a navigation device, or a ultra-mobile PC (UMPC), but also as the display screen of various other products such as a television (TV), a laptop computer, a monitor, a billboard, or an Internet-of-Things (IoT) device.

The display device 10 may include a display panel 100, flexible films 210, display driving units 220, a circuit board 230, a timing control unit 240, and a power supply unit 250.

The display panel 100 may have a rectangular shape in a plan view. For example, the display panel 100 may have a rectangular shape having long sides extending in the first direction DR1 and short sides extending in the second direction DR2, in a plan view. The corners where the long sides and the short sides of the display panel 100 meet may be right-angled or may be rounded to have a predetermined or given curvature. The planar shape of the display panel 100 is not particularly limited, and the display panel 100 may have various other shapes such as a non-tetragonal polygonal shape, a circular shape, or an elliptical shape. In some embodiments, the display panel 100 may be formed to be flat, but the disclosure is not limited thereto. In other embodiments, in some embodiments, the display panel 100 may be formed to be bent to have a predetermined or given curvature.

The display panel 100 may include a display area DA and a non-display area NDA.

The display area DA, which is an area that displays an image, may be disposed in the middle of the display panel 100. The display area DA may include pixels SP, gate lines GL, data lines DL, initialization voltage lines VIL, first voltage lines VDL, horizontal voltage lines HVDL, vertical voltage lines VVSL, second voltage lines VSL, and line patterns VVSP. The pixels SP may be formed in pixel regions at the intersections between the data lines DL and the gate lines GL.

Each of the pixels SP may include first, second, and third pixels SP1, SP2, and SP3. Each of the first, second, and third pixels SP1, SP2, and SP3 may be connected to a horizontal gate line HGL and a data line DL. The first, second, and third pixels SP1, SP2, and SP3 may be defined as minimal areas for outputting light.

First subpixels SP1, second subpixels SP2, and third subpixels SP3 may emit light of different wavelengths. In some embodiments, the first subpixels SP1 may emit first-color light, for example, red light, the second subpixels SP2 may emit second-color light, for example, green light, and the third subpixels SP3 may emit third-color light, for example, blue light. The pixel circuits of the first subpixels SP1, the pixel circuits of the third subpixels SP3, and the pixel circuits of the second subpixels SP2 may be sequentially arranged along the opposite direction of the second direction DR2, but the disclosure is not limited thereto.

The gate lines GL may include vertical gate lines VGL, horizontal gate lines HGL, and auxiliary gate lines BGL.

The vertical gate lines VGL may be connected to the display driving units 220, may extend in the second direction DR2, and may be spaced apart from one another in the first direction DR1. The vertical gate lines VGL may be arranged in parallel to the data lines DL. The horizontal gate lines HGL may extend in the first direction DR1 and may be spaced apart from one another in the second direction DR2. The horizontal gate lines HGL may intersect the vertical gate lines VGL. For example, the horizontal gate lines HGL may be connected to the vertical gate lines VGL through contacts MDC. The contacts MDC may be parts of the horizontal gate lines HGL that are inserted in contact holes to be in contact with the vertical gate lines VGL. The vertical gate lines VGL may also be referred to as lower gate lines, and the horizontal gate lines HGL may also be referred to as upper gate lines.

The term "connect" (and variations thereof) is used herein to mean connecting one member to another member or through yet another member, and may include a physical and/or electrical connection. Also, an integral member may be understood as having parts connected integrally to one another.

The auxiliary gate lines BGL may extend in the second direction DR2 from the horizontal gate lines HGL and may provide gate signals to the first subpixels SP1, the second subpixels SP2, and the third subpixels SP3.

The data lines DL may extend in the second direction DR2 and may be spaced apart from one another in the first direction DR1. The data lines DL may include first data lines DL1, second data lines DL2, and third data lines DL3. The first data lines DL1, the second data lines DL2, and the third data lines DL3 may provide data voltages to the first subpixels SP1, the second subpixels SP2, and the third subpixels SP3, respectively.

The initialization voltage lines VIL may extend in the second direction DR2 and may be spaced apart from one another in the first direction DR1. The initialization voltage lines VIL may provide initialization voltages from the display driving units 220 to the pixel circuits of the first subpixels SP1, the pixel circuits of the second subpixels SP2, and the pixel circuits of the third subpixels SP3 and may provide sensing signals from the pixel circuits of the first subpixels SP1, the pixel circuits of the second subpixels SP2, and the pixel circuits of the third subpixels SP3 to the display driving units 220.

The first voltage lines VDL may extend in the second direction DR2 and may be spaced apart from one another in the first direction DR1. The first voltage lines VDL may provide a driving voltage or a high-potential voltage from the power supply unit 250 to the first subpixels SP1, the second subpixels SP2, and the third subpixels SP3.

The horizontal voltage lines HVDL may extend in the first direction DR1 and may be spaced apart from one another in the second direction DR2. The horizontal voltage lines HVDL may be connected to the first voltage lines VDL. Accordingly, the first voltage lines VDL may provide the driving voltage or the high-potential voltage to the horizontal voltage lines HVDL.

The vertical voltage lines VVSL may extend in the second direction DR2 and may be spaced apart from one another in the first direction DR1. The vertical voltage lines VVSL may be connected to the second voltage lines VSL. The vertical voltage lines VVSL may provide a low-potential voltage from the power supply unit 250 to the second voltage lines VSL.

The second voltage lines VSL may extend in the first direction DR1 and may be spaced apart from one another in the second direction DR2. The second voltage lines VSL may provide the low-potential voltage to the first subpixels SP1, the second subpixels SP2, and the third subpixels SP3.

The line patterns VVSP may extend in the second direction DR2 and may be spaced apart from one another in the first direction DR1. As the line patterns VVSP are electrically connected to the vertical voltage lines VVSL and the second voltage lines VSL, RC delays can be reduced, and driving margins can be secured. The line patterns VVSP may also be referred to as metal patterns.

Some of the line patterns VVSP may be disposed on the same lines as the vertical gate lines VGL. For example, the vertical gate lines VGL may extend in the second direction DR2 from a second side, in the second direction DR2, of the display area DA to the contacts MDC, and some of the line patterns VVSP may extend in the second direction DR2 from near the contacts MDC to a first side, in the second direction DR2, of the display area DA. Such line patterns VVSP, which are initially formed integrally with the vertical gate lines VGL and are separated later from the vertical gate lines VGL, may be disposed in remainder areas RSA (of FIG. 3). For example, the line patterns VVSP may be spaced apart from the vertical gate lines VGL in the second direction DR2 by disconnection parts (BWP of FIG. 7) and may thus be electrically insulated from the vertical gate lines VGL.

Some of the line patterns VVSP may extend in the second direction DR2 from the second side, in the second direction DR2, of the display area DA to the first side, in the second direction DR2, of the display area DA. Such line patterns VVSP may be disposed in dummy areas DMA. The remainder areas RSA and the dummy areas DMA will be described later.

Depending on the number and the layout of the pixels SP, it may vary how the pixels SP, the gate lines GL, the data lines DL, the initialization voltage lines VIL, the first voltage lines VDL, and the second voltage lines VSL are connected to one another.

The non-display area NDA may be defined as an area of the display panel 100 other than the display area DA. For example, the non-display area NDA may include fan-out lines, which connect the vertical gate lines VGL, the data lines DL, the initialization voltage lines VIL, the first voltage lines VDL, and the vertical voltage lines VVSL to the display driving units 220, and pad units, which are connected to the flexible films 210.

Input terminals provided at first sides of the flexible films 210 may be attached to the circuit board 230 by a film attachment process, and output terminals provided at second sides of the flexible films 210 may be attached to the pad units by a film attachment process. For example, the flexible films 210 may be flexible, like tape carrier packages or chip-on-films (COFs). The flexible films 210 may be bent toward the bottom of the display panel 100 to reduce the size of the non-display area NDA of the display device 10.

The display driving units 220 may be mounted on the flexible films 210. For example, the display driving units 220 may be implemented as integrated circuits (ICs). The display driving units 220 may receive digital video data and data control signals from the timing control unit 240 and may convert the digital video data into analog data voltages and provide the analog data voltages to the data lines DL through the fan-out lines in accordance with the data control signals. The display driving units 220 may generate gate signals in accordance with gate control signals from the timing control unit 240 and may sequentially provide the gate signals to the vertical gate lines VGL in a predefined or given order. Thus, the display driving units 220 may function as both data drivers and gate drivers at the same time. As the display device 10 includes the display driving units 220 in part of the non-display area NDA on a second side, in the second direction DR2, of the display device 10, gate driving units may not be provided on both sides, in the first direction DR1, of the display device 10 or on a first side, in the second direction DR2, of the display device 10, and as a result, the size of the non-display area NDA can be minimized.

The circuit board 230 may support the timing control unit 240 and the power supply unit 250 and may provide signals and power to the display driving units 220. For example, the circuit board 230 may provide signals from the timing control unit 240 and power supply voltages from the power supply unit 250 to the display driving units 220 to display an image. To this end, signal lines and power lines may be provided on the circuit board 230.

The timing control unit 240 may be mounted on the circuit board 230 and may receive image data and timing synchronization signals from a display driving system or a graphics device through a user connector on the circuit board 230. The timing control unit 240 may generate digital video data by aligning the image data in accordance with the timing synchronization signals to fit the layout of the pixels SP, and may provide the digital video data to the display driving units 220. The timing control unit 240 may generate data control signals and gate control signals based on the timing synchronization signals. The timing control unit 240 may control the timing of providing data voltages from the display driving units 220, based on the data control signals and may control the timing of providing gate signals from the display driving units 220, based on the gate control signals.

The power supply unit 250 may be disposed on the circuit board 230 and may provide power supply voltages to the display driving units 220 and the display panel 100. For example, the power supply unit 250 may generate a driving voltage or a high-potential voltage and provide the high-potential voltage to the first voltage lines VDL, may generate a low-potential voltage and provide the low-potential voltage to the vertical voltage lines VVSL, and may generate an initialization voltage and provide the initialization voltage to the initialization voltage lines VIL.

The remainder areas RSA and the dummy areas DMA where the line patterns VVSP are disposed will hereinafter be described with reference to FIGS. 2 and 3.

FIG. 2 is a schematic plan view illustrating the contacts of the vertical gate lines and the horizontal lines of the display device of FIG. 1. FIG. 3 schematically illustrates contact lines that divide the remainder areas and signal areas of the display device 10 and also illustrates the dummy areas of the display device of FIG. 1.

Figure 3:
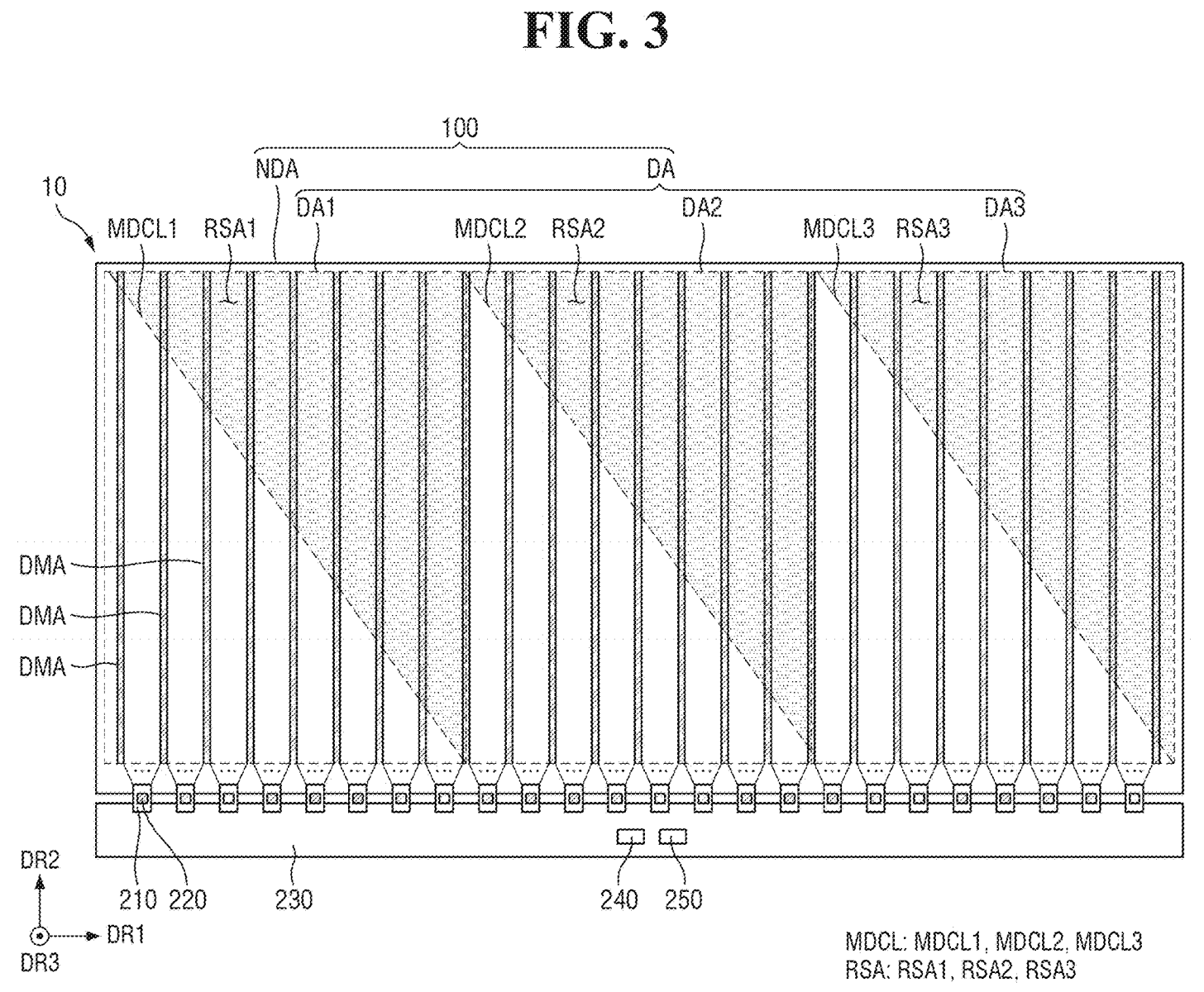

Referring to FIGS. 2 and 3, the display area DA may include first, second, and third display areas DA1, DA2, and DA3, which are sequentially arranged along the first direction DR1. In some embodiments, the first, second, and third display areas DA1, DA2, and DA3 may have substantially the same size, but the disclosure is not limited thereto. Multiple pixels SP, which are arranged in multiple rows and multiple columns, may be disposed in the display area DA.

For convenience, if the display panel 100 includes M pixels SP in each row in a direction parallel to the first direction DR1 and N pixels in each column in a direction parallel to the second direction DR2, the display panel 100 may have a total of M×N pixels SP. In other words, the pixels SP may be arranged in M columns and N rows.

The horizontal gate lines HGL may extend in the first direction DR1 across the entire display area DA, i.e., the entire first, second, and third display areas DA1, DA2, and DA3. Accordingly, the horizontal gate lines HGL may provide gate signals to the pixels SP in each row. For example, one horizontal gate line HGL may be connected to M auxiliary gate lines BGL and may provide gate signals to M pixels SP in its corresponding row. As the pixels SP are arranged in M columns and N rows, at least N horizontal gate lines HGL may be provided in the display panel 100. The display panel 100 will hereinafter be described as having N horizontal gate lines HGL.

The horizontal gate lines HGL may intersect the vertical gate lines VGL, at the contacts MDC and non-contacts NMC in the display area DA. For example, each of the horizontal gate lines HGL may be connected to one of the vertical gate lines VGL through one of the contacts MDC and may be insulated from the rest of the vertical gate lines VGL at non-contacts NMC.

As N horizontal gate lines HGL are disposed in the display panel 100, at least N vertical gate lines VGL, which are connected to the display driving units 220 and transmit gate signals, may need to be provided. For example, N horizontal gate lines HGL and N vertical gate lines VGL may be connected and may be connected one-to-one to one another. However, if one vertical gate line VGL is connected to each horizontal gate line HGL, which extends in the first direction DR1 across the entire display area DA, i.e., the entire first, second, and third display areas DA1, DA2, and DA3, an IR drop may occur. To address this problem, multiple vertical gate lines VGL may be connected to each horizontal gate line HGL. The number of vertical gate lines VGL connected to each horizontal gate line HGL is not particularly limited. For convenience, it is assumed that three vertical gate lines VGL are connected to each horizontal gate line HGL, in which case, as N horizontal gate lines HGL are provided, at least 3N vertical gate lines VGL may need to be provided.

Each of the horizontal gate lines HGL may be connected to one vertical gate line VGL in the first display area DA1, another vertical gate line VGL in the second display area DA2, and another vertical gate line VGL in the third display area DA3, thereby preventing an IR drop. In other words, if there are N horizontal gate lines HGL, N contacts MDC may be formed in each of the first, second, and third display areas DA1, DA2, and DA3.

The contacts MDC in each of the first, second, and third display areas DA1, DA2, and DA3 may be disposed on extension lines MDCL. The extension lines MDCL may include a first extension line MDCL1, which is disposed in the first display area DA1, a second extension line MDCL2, which is disposed in the second display area DA2, and a third extension line MDCL3, which is disposed in the third display area DA3.

For example, contacts MDC in the first display area DA1 may be disposed along the first extension line MDCL1 from an upper left part of the first display area DA1 to a lower right part of the first display area DA1. Contacts MDC in the second display area DA2 may be disposed along the second extension line MDCL2 from an upper left part of the second display area DA2 to a lower right part of the second display area DA2. Contacts MDC in the third display area DA3 may be disposed along the third extension line MDCL3 from an upper left part of the third display area DA3 to a lower right part of the third display area DA3. Accordingly, the contacts MDC may be arranged along a diagonal line between the first direction DR1 and the opposite direction of the second direction DR2, in each of the first, second, and third display areas DA1, DA2, and DA3.

The line patterns VVSP may be disposed in the remainder areas RSA, on upper sides of the first, second, and third extension lines MDCL1, MDCL2, and MDCL3. For example, the line patterns VVSP of the first display area DA1 may be disposed on a first side, in the second direction DR2, of the first extension line MDCL1, the line patterns VVSP of the second display area DA2 may be disposed on a first side, in the second direction DR2, of the second extension line MDCL2, and the line patterns VVSP of the third display area DA3 may be disposed on a first side, in the second direction DR2, of the third extension line MDCL3.

The remainder areas RSA may include first, second, and third remainder areas RSA1, RSA2, and RSA3. For example, part of the first display area DA1 where line patterns VVSP are disposed may be defined as the first remainder area RSA1, part of the second display area DA2 where line patterns VVSP are disposed may be defined as the second remainder area RSA2, and part of the third display area DA3 where line patterns VVSP are disposed may be defined as the third remainder area RSA3.

To prevent IR drops in N horizontal gate lines HGL, at least 3N vertical gate lines VGL may need to be provided. For convenience, more than 3N vertical gate lines VGL may actually be provided. The excess vertical gate lines VGL may be disposed in the dummy areas DMA as line patterns VVSP extending from the second side, in the second direction DR2, of the display area DA to the first side, in the second direction DR2, of the display area DA without being connected to the horizontal gate lines HGL.

For example, if the display device 10 includes multiple pixels SP arranged in 4320 rows and 7680 columns, 4320 horizontal gate lines HGL may be provided, and at least 4320×3 (i.e., 12960) vertical gate lines VGL may need to be provided accordingly. In case that 12960 vertical gate lines VGL are provided, 1.6875 (=12960/7680) vertical gate lines VGL may be allocated to each column of pixels SP. However, as the number of vertical gate lines VGL allocated to each column of pixels SP should be a natural number, at least two vertical gate lines VGL may need to be provided for each column of pixels SP. For example, a total of 15360 (=7680×2) vertical gate lines VGL may be provided. Thus, a total of 2400 (=15360-12960) excess vertical gate lines VGL may be further provided.

The excess vertical gate lines VGL may be disposed in the dummy areas DMA as line patterns VVSP extending from the second side, in the second direction DR2, of the display area DA to the first side, in the second direction DR2, of the display area DA without being connected to the horizontal gate lines HGL, and the dummy areas DMA may be distributed throughout the display area DA. In some embodiments, the dummy areas DMA may be disposed in gaps between the flexible films 210, but the disclosure is not limited thereto. FIG. 3 illustrates that the dummy areas DMA may extend in the second direction DR2, may be disposed in the gaps between the flexible films 210, and may be arranged along the first direction DR1.

It will hereinafter be described how multiple subpixels SPn of each of the pixels SP are connected to multiple lines.

Figure 4:
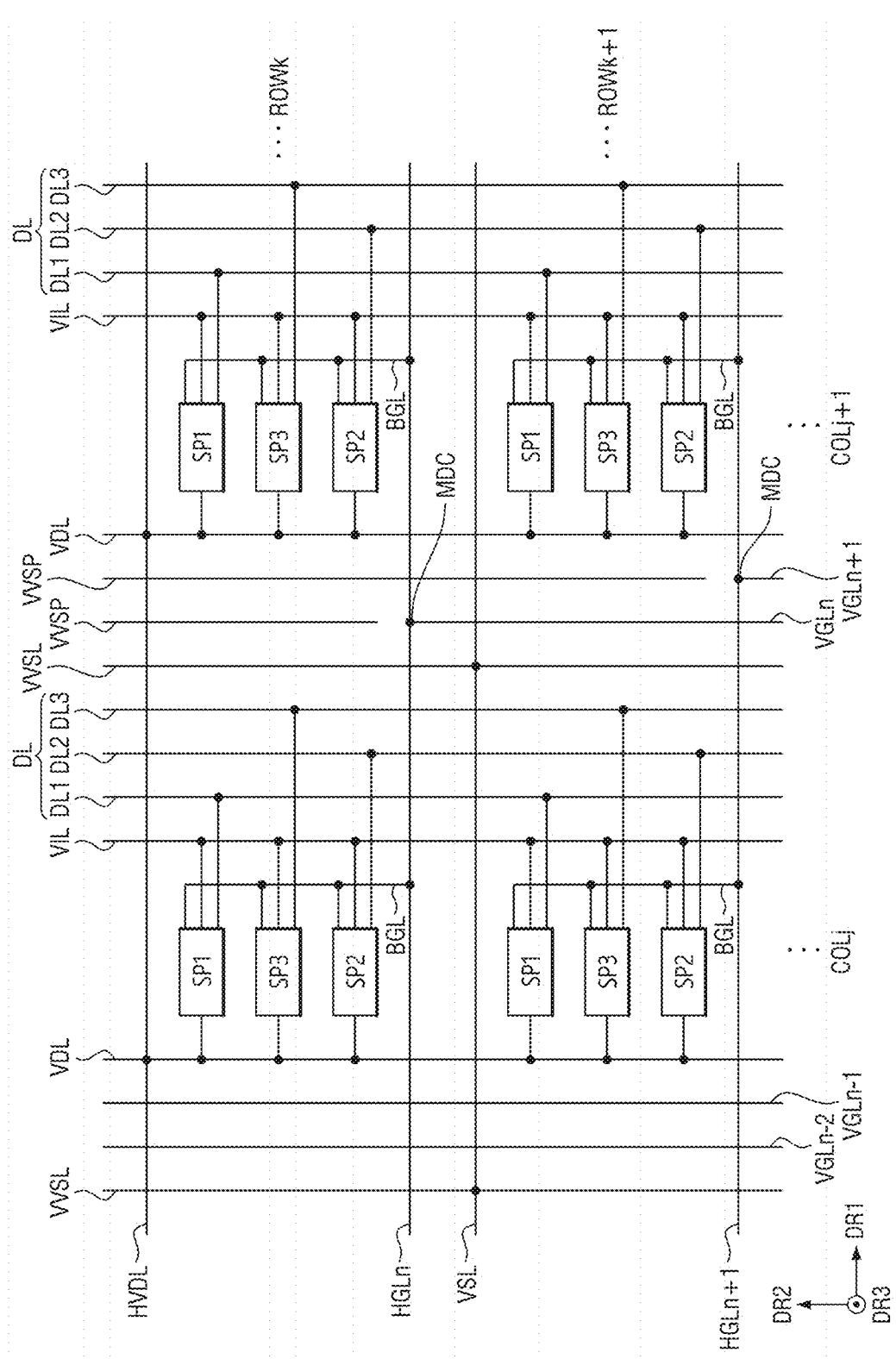
FIG. 4 schematically illustrates pixels and lines near an extension line that divides line patterns and vertical gate lines of the display device of FIG. 1.
Figure 5:
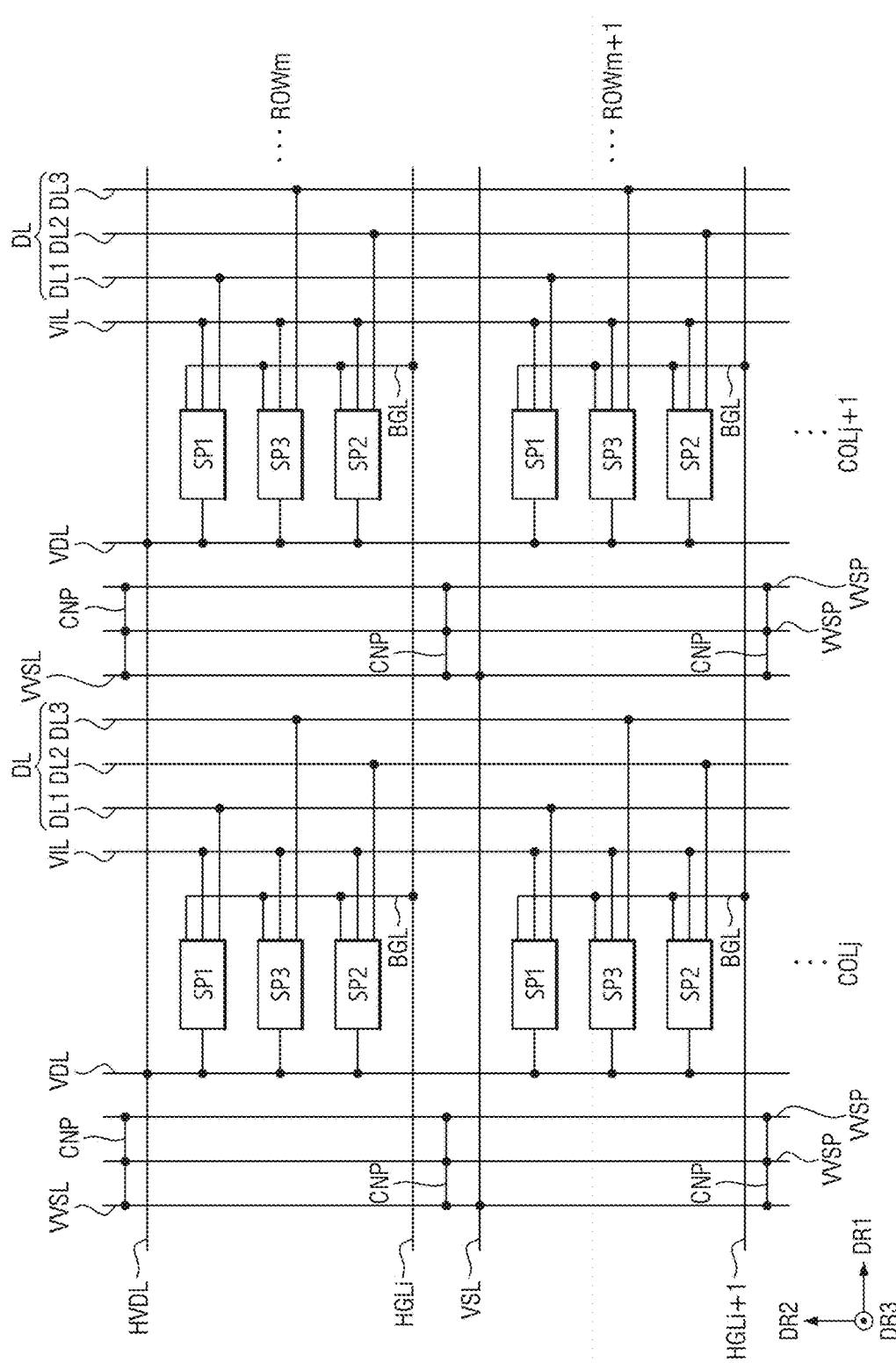
FIG. 5 schematically illustrates pixels and lines in a remainder area and a dummy area of the display device of FIG. 1.

FIG. 4 schematically illustrates pixels and lines near an extension line that divides line patterns and vertical gate lines of the display device of FIG. 1. FIG. 5 schematically illustrates pixels and lines in a remainder area and a dummy area of the display device of FIG. 1.

Referring to FIGS. 4 and 5, each of the pixels SP may include first, second, and third subpixels SP1, SP2, and SP3. The pixel circuits of first subpixels SP1, the pixel circuits of third subpixels SP3, and the pixel circuits of second subpixels SP2 may be sequentially arranged along the opposite direction of the second direction DR2, but the disclosure is not limited thereto.

The first subpixels SP1, the second subpixels SP2, and the third subpixels SP3 may be connected to first voltage lines VDL, initialization voltage lines VIL, and data lines DL.

The first lines VDL may extend in the second direction DR2. The first voltage lines VDL may be disposed on first sides or the left sides of the first subpixels SP1, the second subpixels SP2, and the third subpixels SP3. The first voltage lines VDL may provide a driving voltage or a high-potential voltage to transistors of each of the first subpixels SP1, the second subpixels SP2, and the third subpixels SP3.

A horizontal voltage line HVDL may extend in the first direction DR1. The horizontal voltage line HVDL may be disposed on the upper sides of the horizontal gate lines HGL. The horizontal voltage line HVDL may be connected to the first voltage lines VDL.

The initialization voltage lines VIL may extend in the second direction DR2. The initialization voltage lines VIL may be disposed on first sides, in the first direction DR1, of the auxiliary gate lines BGL, but the disclosure is not limited thereto. The initialization voltage lines VIL may be disposed between the auxiliary gate lines BGL and the data lines DL. The initialization voltage lines VIL may provide an initialization voltage to the pixel circuits of the first subpixels SP1, the pixel circuits of the second subpixels SP2, and the pixel circuits of the third subpixels SP3. The initialization voltage lines VIL may receive sensing signals from the pixel circuits of the first subpixels SP1, the pixel circuits of the second subpixels SP2, and the pixel circuits of the third subpixels SP3 and provide the sensing signals to the display driving units 220 of FIG. 1.

The gate lines GL may include the vertical gate lines VGL, the horizontal gate lines HGL, and the auxiliary gate lines BGL.

The vertical gate lines VGL may extend in the second direction DR2. At least one vertical gate line VGL may be disposed between each pair of adjacent pixels SP. The vertical gate lines VGL may be connected between the display driving units 220 and the horizontal gate lines HGL. The vertical gate lines VGL may intersect the horizontal gate lines HGL. The vertical gate lines VGL may provide the gate signals from the display driving units 220 to the horizontal gate lines HGL.

For example, as illustrated in FIG. 4, an n-th vertical gate line VGLn (where n is a positive integer) and a (n+1)-th vertical gate line VGLn+1 may be disposed between pixels SP in a j-th column COLj (where j is a positive integer) and pixels SP in a (j+1)-th column COLj+1, near one of the extension lines MDCL of the display area DA. The vertical gate lines VGL may be disposed in parallel between data lines DL connected to a column of pixels SP on their first sides and a first voltage line VDL connected to a column of pixels SP on their second sides. For example, the n-th vertical gate line VGLn and the (n+1)-th vertical gate line VGLn+1 may be disposed between data lines DL connected to the pixels SP in the j-th column COLj and a first voltage line VDL connected to the pixels SP in the (j+1)-th column COLj+1.

The n-th vertical gate line VGLn may be connected to an n-th horizontal gate line HGLn through a contact MDC and may be insulated from the other horizontal gate lines HGL. The (n+1)-th vertical gate line VGLn+1 may be connected to an (n+1)-th horizontal gate line HGLn+1 through a contact MDC and may be insulated from the other horizontal gate lines HGL.

One or more vertical gate lines VGL may be disposed on first sides of pixels SP in each column. For example, (n−2)-th and (n−1)-th vertical gate lines VGLn−2 and VGLn−1 may be disposed on first sides of the pixels SP in the j-th column COLj. The (n−2)-th and (n−1)-th vertical gate lines VGLn−2 and VGLn−1 may be disposed on a first side of the first voltage line VDL connected to the pixels SP in the (j+1)-th column COLj+1.

The horizontal gate lines HGL may extend in the first direction DR1. The horizontal gate lines HGL may be disposed on second sides, in the second direction DR2, of the second subpixels SP2. The horizontal gate lines HGL may be connected between the vertical gate lines VGL and the auxiliary gate lines BGL. The horizontal gate lines BGL may provide the gate signals from the vertical gate lines VGL to the auxiliary gate lines BGL.

For example, the n-th horizontal gate line HGLn may be disposed on second sides, in the second direction DR2, of the pixel circuits of second subpixels SP2 in a k-th row ROWk (where k is a positive integer). The n-th horizontal gate line HGLn may be connected to the (n−1)-th vertical gate line VGLn through a contact MDC and may be insulated from the other vertical gate lines VGL. The (n+1)-th horizontal gate line HGLn+1 may be disposed on second sides, in the second direction DR2, of the pixel circuits of second subpixels SP2 in a (k+1)-th row ROWk+1. The (n+1)-th horizontal gate line HGLn+1 may be connected to the (n+1)-th vertical gate line VGLn+1 through a contact MDC and may be insulated from the other vertical gate lines VGL.

The auxiliary gate lines BGL may extend in the opposite direction of the second direction DR2 from the horizontal gate lines HGL. The auxiliary gate lines BGL may be disposed on the right sides of the first subpixels SP1, the second subpixels SP2, and the third subpixels SP3. The auxiliary gate lines BGL may provide gate signals from the horizontal gate lines HGL to the pixel circuits of the first subpixels SP1, the pixel circuits of the second subpixels SP2, and the pixel circuits of the third subpixels SP3.

The data lines DL may extend in the second direction DR2. The data lines DL may provide data voltages to the pixels SP. The data lines DL may include first data lines DL1, second data lines DL2, and third data lines DL3.

The first data lines DL1 may extend in the second direction DR2. The first data lines DL1 may be disposed on first sides, in the first direction DR1, of the initialization voltage lines VIL. The first data lines DL1 may provide the data voltages from the display driving units 220 to the pixel circuits of the first subpixels SP1.

The second data lines DL2 may extend in the second direction DR2. The second data lines DL2 may be disposed on the first sides, in the first direction DR1, of the initialization voltage lines VIL. The second data lines DL2 may provide the data voltages from the display driving units 220 to the pixel circuits of the second subpixels SP2.

The third data lines DL3 may extend in the second direction DR2. The third data lines DL3 may be disposed on the first sides, in the first direction DR1, of the initialization voltage lines VIL. The third data lines DL3 may provide the data voltages from the display driving units 220 to the pixel circuits of the third subpixels SP3.

The vertical voltage lines VVSL may extend in the second direction DR2. The vertical voltage lines VVSL may be disposed on first sides, in the first direction DR1, of the third data lines DL3. The vertical voltage lines VVSL may be connected between the power supply unit 250 and a second voltage line VSL. The vertical voltage lines VVSL may provide a low-potential voltage from the power supply unit 250 to the second voltage line VSL.

The second voltage line VSL may extend in the first direction DR1. The second voltage line VSL may be disposed on the second sides, in the second direction DR2, of the pixel circuits of the second subpixels SP2 or on first sides, in the second direction DR2, of the pixel circuits of the first subpixels SP1. The second voltage line VSL may provide the low-potential voltage from the vertical voltage lines VVSL to a light-emitting element layer EDL (of FIGS. 12 and 14) of each of the first subpixels SP1, the second subpixels SP2, and the third subpixels SP3.

The line patterns VVSP may be disposed on the same lines as the vertical gate lines VGL. For example, as illustrated in FIG. 4, the n-th vertical gate line VGLn may extend from the first side, in the second direction DR2, of the display area DA to a contact MDC near the k-th and (k+1)-th rows ROWk and ROWk+1, i.e., near an extension line MDCL (of FIG. 3) of the display area DA, and a line pattern VVSP may extend from near the contact MDC to the second side, in the second direction DR2, of the display area DA.

Referring to FIG. 5, pixels SP in an m-th row ROWm (where m is a positive integer) and pixels SP in an (m+1)-th row ROWm+1 may be pixels SP disposed in one of the dummy areas DMA or the remainder areas RSA of FIG. 3.

If the pixels SP in each of the m-th and (m+1)-th rows ROWm and ROWm+1 are disposed in one of the remainder areas RSA, the (k+1)-th, k-th, (m+1)-th, and m-th rows ROWk+1, ROWk, ROWm+1, and ROWm may all refer to the relative locations of pixels SP in the second direction DR2 with respect to the j-th and (j+1)-th columns COLj and COLj+1.

Accordingly, line patterns VVSP on second sides, in the first direction DR1, of pixels SP in the m-th or (m+1)-th row ROWm or ROWm+1 and the j-th column COLj may correspond to the (n−2)-th and (n−1)-th vertical gate lines VGLn−2 and VGLn−1, and line patterns VVSP on second sides, in the first direction DR1, of pixels SP in the m-th or (m+1)-th row ROWm or ROWm+1 and the (j+1)-th column COLj+1 may correspond to the n-th and (n+1)-th vertical gate lines VGLn and VGLn+1. An i-th horizontal gate line HGLi (where I is a positive integer) corresponding to the m-th row ROWm and an (i+1)-th horizontal gate line HGLi+1 corresponding to the (m+1)-th row ROWm+1 may not be connected to line patterns VVSP.

The line patterns VVSP may be electrically insulated from the vertical gate lines VGL. Thus, at least one line pattern VVSP may be disposed between each pair of adjacent pixels SP. The line patterns VVSP may intersect the horizontal gate lines HGL, the horizontal voltage line HVDL, and the second voltage line VSL.

As the line patterns VVSP are electrically connected to the vertical voltage lines VVSL and the second voltage line VSL in a remainder area RSA or a dummy area DMA of the display area DA, as illustrated in FIG. 5, RC delays in the second voltage line VSL can be reduced, and driving margins can be secured.

Power connectors CNP may be disposed in the remainder areas RSA or the dummy areas DMA, but not in the rest of the display area DA.

The pixel circuits of a subpixel SPn will hereinafter be described.

Figure 6:
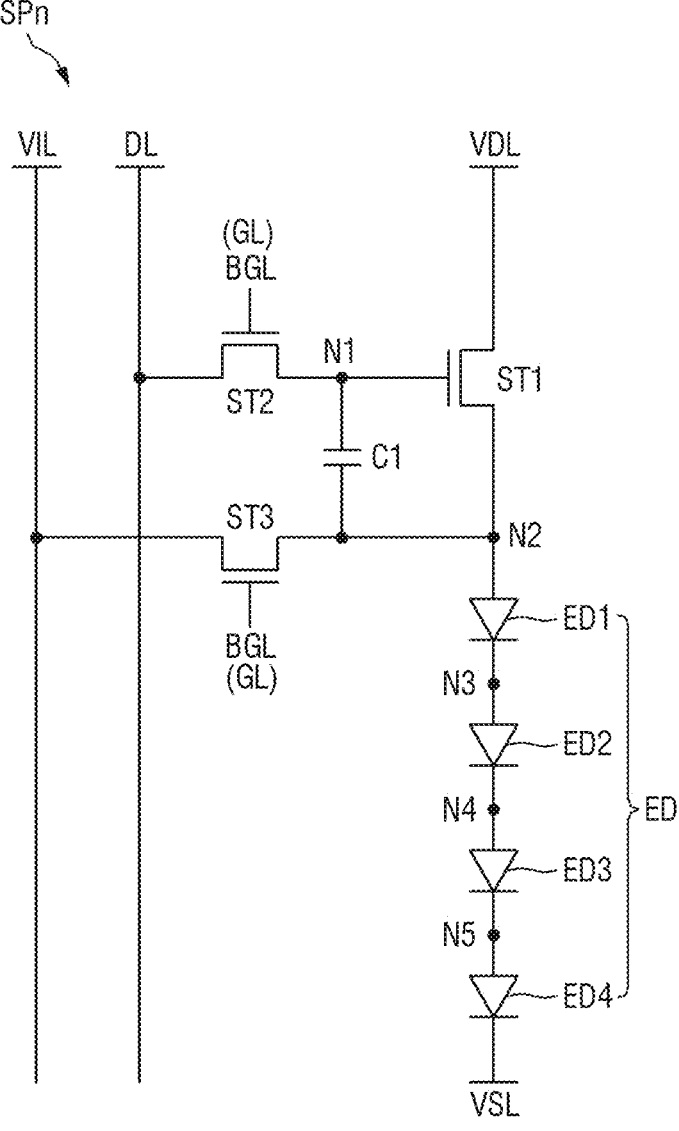
FIG. 6 is a schematic diagram of an equivalent circuit diagram of a subpixel of the display device of FIG. 1.

FIG. 6 is a schematic diagram of an equivalent circuit of a subpixel of the display device of FIG. 1.

Referring to FIG. 6, a subpixel SPn may be connected to a first voltage line VDL, a data line DL, an initialization voltage line VIL, an auxiliary gate line BGL, and a second voltage line VSL.

The subpixel SPn may include first, second, and third transistors ST1, ST2, and ST3, a first capacitor C1, and multiple light-emitting elements ED.

The first transistor ST1 may include a gate electrode, a drain electrode, and a source electrode. The gate electrode of the first transistor ST1 may be connected to a first node N1, the drain electrode of the first transistor ST1 may be connected to the first voltage line VDL, and the source electrode of the first transistor ST1 may be connected to a second node N2. The first transistor ST1 may control a drain-source current (or a driving current) based on a data voltage applied to its gate electrode.

The light-emitting elements ED may include first, second, third, and fourth light-emitting elements ED1, ED2, ED3, and ED4. The first, second, third, and fourth light-emitting elements ED1, ED2, ED3, and ED4 may be connected in series. The first, second, third, and fourth light-emitting elements ED1, ED2, ED3, and ED4 may receive the driving current and may emit light. The amount of light emitted by the light-emitting elements ED or the luminance of the light-emitting elements ED may be proportional to the magnitude of the diving current. The light-emitting elements ED may be inorganic light-emitting elements including an inorganic semiconductor, but the disclosure is not limited thereto.

A first electrode of the first light-emitting element ED1 may be connected to the second node N2, and a second electrode of the first light-emitting element ED1 may be connected to a third node N3. The first electrode of the first light-emitting element ED1 may be connected to the source electrode of the first transistor ST1, a drain electrode of the third transistor ST3, and a second electrode of the first capacitor C1 through the second node N2. The second electrode of the first light-emitting element ED1 may be connected to a first electrode of the second light-emitting element ED2 through the third node N3.

The first electrode of the second light-emitting element ED2 may be connected to the third node N3, and a second electrode of the second light-emitting element ED2 may be connected to a fourth node N4. The first electrode of the second light-emitting element ED2 may be connected to the second electrode of the first light-emitting element ED1 through the third node N3, and the second electrode of the second light-emitting element ED2 may be connected to a first electrode of the third light-emitting element ED3 through the fourth node N4.

The first electrode of the third light-emitting element ED3 may be connected to the fourth node N4, and a second electrode of the third light-emitting element ED3 may be connected to a fifth node N5. The first electrode of the third light-emitting element ED3 may be connected to the second electrode of the second light-emitting element ED2 through the fourth node N4, and the second electrode of the third light-emitting element ED3 may be connected to a first electrode of the fourth light-emitting element ED4 through the fifth node N5.

The first electrode of the fourth light-emitting element ED4 may be connected to the fifth node N5, and a second electrode of the fourth light-emitting element ED4 may be connected to the second voltage line VSL. The first electrode of the fourth light-emitting element ED4 may be connected to the second electrode of the third light-emitting element ED3 through the fifth node N5.

FIG. 6 illustrates that four light-emitting elements ED, i.e., the first, second, third, and fourth light-emitting elements ED1, ED2, ED3, and ED4, are connected in series, but the number of light-emitting elements ED connected in series is not particularly limited. In other embodiments, two light-emitting elements ED may be connected in series.

The second transistor ST2 may be turned on by a gate signal from the auxiliary gate line BGL or the gate line GL to electrically connect the data line DL and the first node N1, which is the gate electrode of the first transistor ST1. The second transistor ST2 may be turned on by the gate signal from the gate line GL to provide a data voltage to the first node N1. A gate electrode of the second transistor ST2 may be connected to the auxiliary gate line BGL, a drain electrode of the second transistor ST2 may be connected to the data line DL, and a source electrode of the second transistor ST2 may be connected to the first node N1. The source electrode of the second transistor ST2 may be connected to the gate electrode of the first transistor ST1 and a first electrode of the first capacitor C1 through the first node N1.

The third transistor ST3 may be turned on by the gate signal from the auxiliary gate line BGL or the gate line GL to electrically connect the initialization voltage line VIL and the second node N2, which is the source electrode of the first transistor ST1. The third transistor ST3 may be turned on by the gate signal from the gate line GL to provide an initialization voltage to the second node N2. A gate electrode of the third transistor ST3 may be connected to the auxiliary gate line BGL, a drain electrode of the third transistor ST3 may be connected to the second node N2, and a source electrode of the third transistor ST3 may be connected to the initialization voltage line VIL. The drain electrode of the third transistor ST3 may be connected to the source electrode of the first transistor ST1, the second electrode of the first capacitor C1, and the first electrode of the first light-emitting element ED1 through the second node N2.

Figure 7:
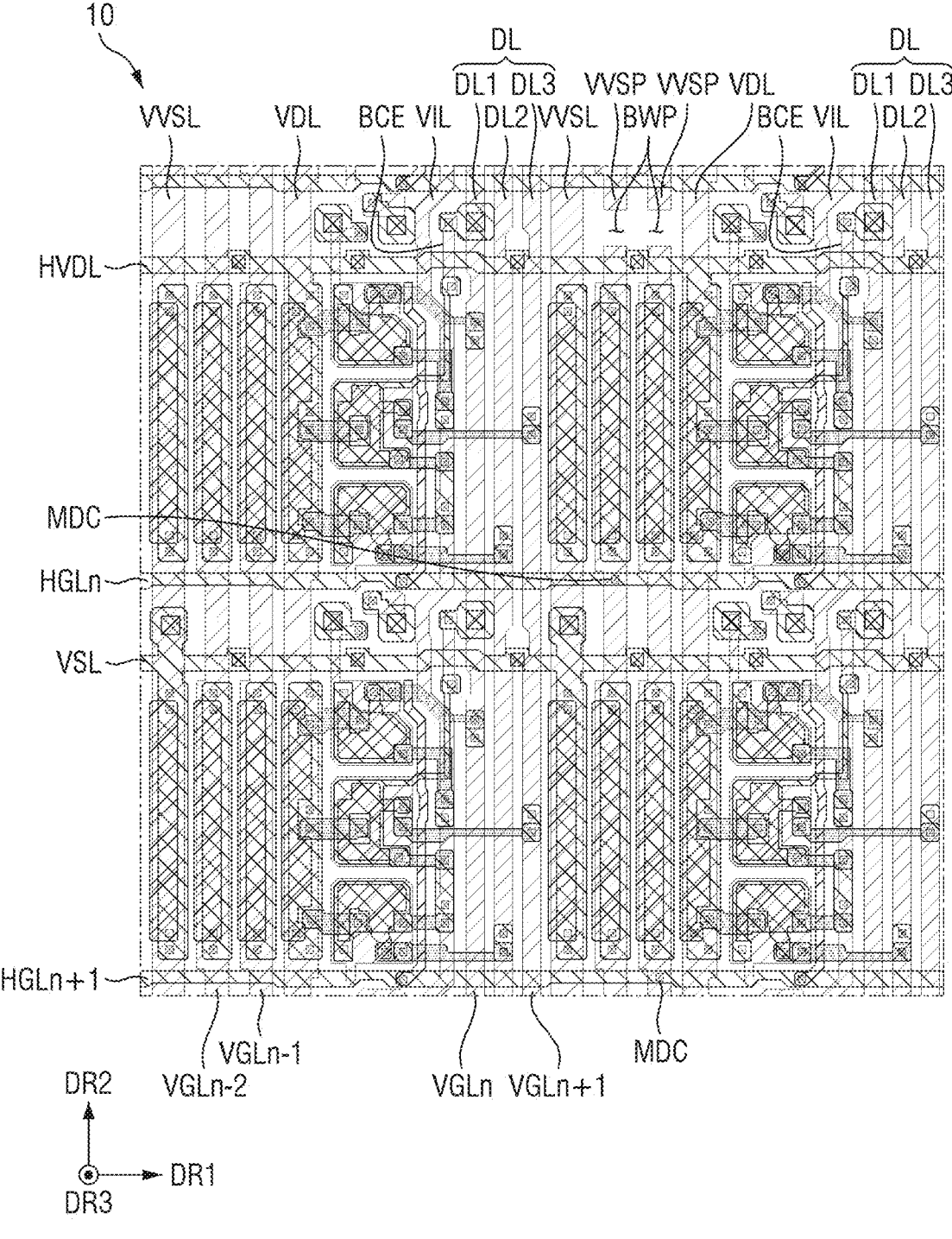
FIG. 7 is a schematic plan view illustrating a pixel element layer that forms pixels near an extension line that divides line patterns and vertical gate lines of the display device of FIG. 1.
Figure 8:
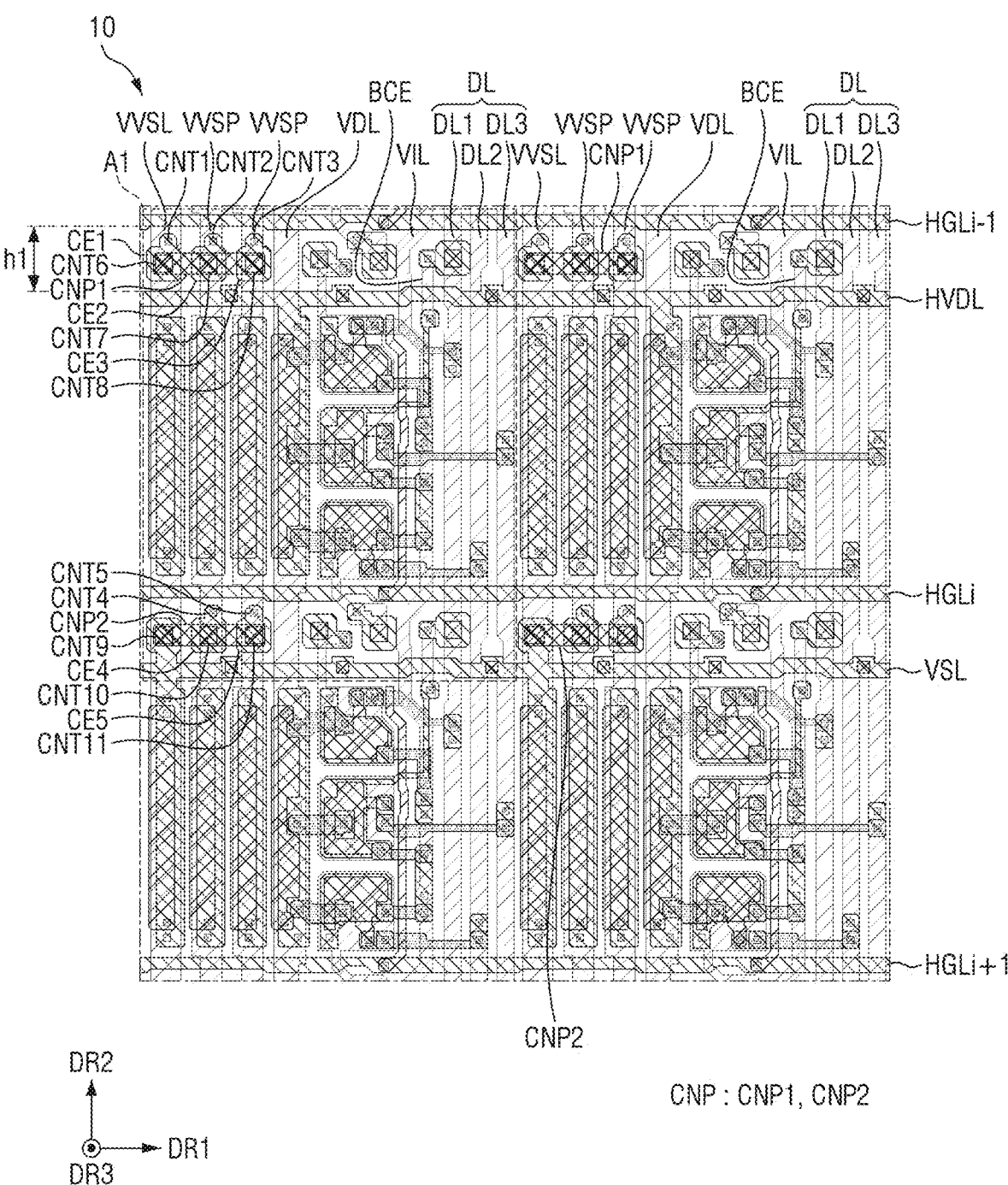
FIG. 8 is a schematic view illustrating a pixel element layer that forms pixels in a remainder area or a dummy area of the display device of FIG. 1 and power connectors of the display device of FIG. 1.

FIG. 7 is a schematic plan view illustrating a pixel element layer that forms pixels near an extension line that divides line patterns and vertical gate lines of the display device of FIG. 1. FIG. 8 is a schematic view illustrating a pixel element layer that forms pixels in a remainder area or a dummy area of the display device of FIG. 1 and power connectors of the display device of FIG. 1.

Referring to FIG. 7, the n-th and (n+1)-th vertical gate lines VGLn and VGLn+1 may extend from the first side, in the second direction DR2, of the display area DA to their respective contacts MDC near an extension line MDCL (of FIG. 3) of the display area DA, and line patterns VVSP may extend from near the contacts MDC to the second side, in the second direction DR2, of the display area DA. The line patterns VVSP may be isolated from the n-th and (n+1)-th vertical gate lines VGLn and VGLn+1 in the second direction DR2 by disconnection parts BWP and may thus be electrically insulated.

Referring to FIG. 8, line patterns VVSP may be electrically connected to vertical voltage lines VVSL and a second voltage line VSL via power connectors CNP, in a remainder area RSA or a dummy area DMA of the display area DA. Thus, RC delays in the second voltage line VSL can be reduced, and driving margins can be secured. The power connectors CNP may include first power connectors CNP1 and second power connectors CNP2.

The first power connectors CNP1 may be disposed on a first side, in the second direction DR2, of a horizontal voltage line HVDL and may be electrically connected to first connecting electrodes CE1, second connecting electrodes CE2, and third connecting electrodes CE3, which are disposed below the first power connectors CNP1. For example, the first power connectors CNP1 may be electrically connected to the first connecting electrodes CE1 through sixth contact holes CNT6, to the second connecting electrodes CE2 through seventh contact holes CNT7, and to the third connecting electrodes CE3 through eighth contact holes CNT8.

The first connecting electrodes CE1 may be electrically connected to vertical voltage lines VVSL therebelow through first contact holes CNT1, the second connecting electrodes CE2 may be electrically connected to line patterns VVSP therebelow through second contact holes CNT2, and the third connecting electrodes CE3 may be electrically connected to line patterns VVSP therebelow through third contact holes CNT3. Accordingly, the vertical voltage lines VVSL and the line patterns VVSP may be electrically connected via the first power connectors CNP1.

The first connecting electrodes CE1, the second connecting electrodes CE2, and the third connecting electrodes CE3 may be disposed between the horizontal voltage line HVDL and an (i-1)-th horizontal gate line HGLi-1 on a first side, in the second direction DR2, of the horizontal voltage line HVDL. As a distance h1 is secured between the horizontal voltage line HVDL and the (i-1)-th horizontal gate line HGLi-1, space can be secured for arranging the first contact holes CNT1, the second contact holes CNT2, and the third contact holes CNT3.

The second power connectors CNP2 may be disposed on a first side, in the second direction DR2, of the second voltage line VSL and may be electrically connected to parts of the second voltage line VSL, fourth connecting electrodes CE4 and fifth connecting electrodes CE5, which are all disposed below the second power connectors CNP2. For example, the second power connectors CNP2 may be electrically connected to parts of the second voltage line VSL through ninth contact holes CNT9, to the fourth connecting electrodes CE4 through tenth contact holes CNT10, and to the fifth connecting electrodes CE5 through eleventh contact holes CNT11.

Parts of the second voltage line VSL may be electrically connected to vertical voltage lines VVSL therebelow, the fourth connecting electrodes CE4 may be electrically connected to line patterns VVSP therebelow through fourth contact holes CNT4, and the fifth connecting electrodes CE5 may be electrically connected to line patterns VVSP therebelow through fifth contact holes CNT5. Accordingly, the vertical voltage lines VVSL and the line patterns VVSP may be electrically connected via the second power connectors CNP2.

However, if the line patterns VVSP are already electrically connected to the vertical voltage lines VVSL and the second voltage line VSL during the alignment of light-emitting elements ED (of FIG. 22), first and second electric fields IEL1 and IEL2 (of FIG. 22) for aligning the light-emitting elements ED may be adversely affected, and as a result, the degree of alignment of the light-emitting elements ED may be degraded. To address this problem, the power connectors CNP may be formed after the alignment of the light-emitting elements ED, and the line patterns VVSP may be electrically connected to the vertical voltage lines VVSL and the second voltage line VSL. This will be described later.

The structure of the stack of elements that form a pixel SP will hereinafter be described.

Figure 9:
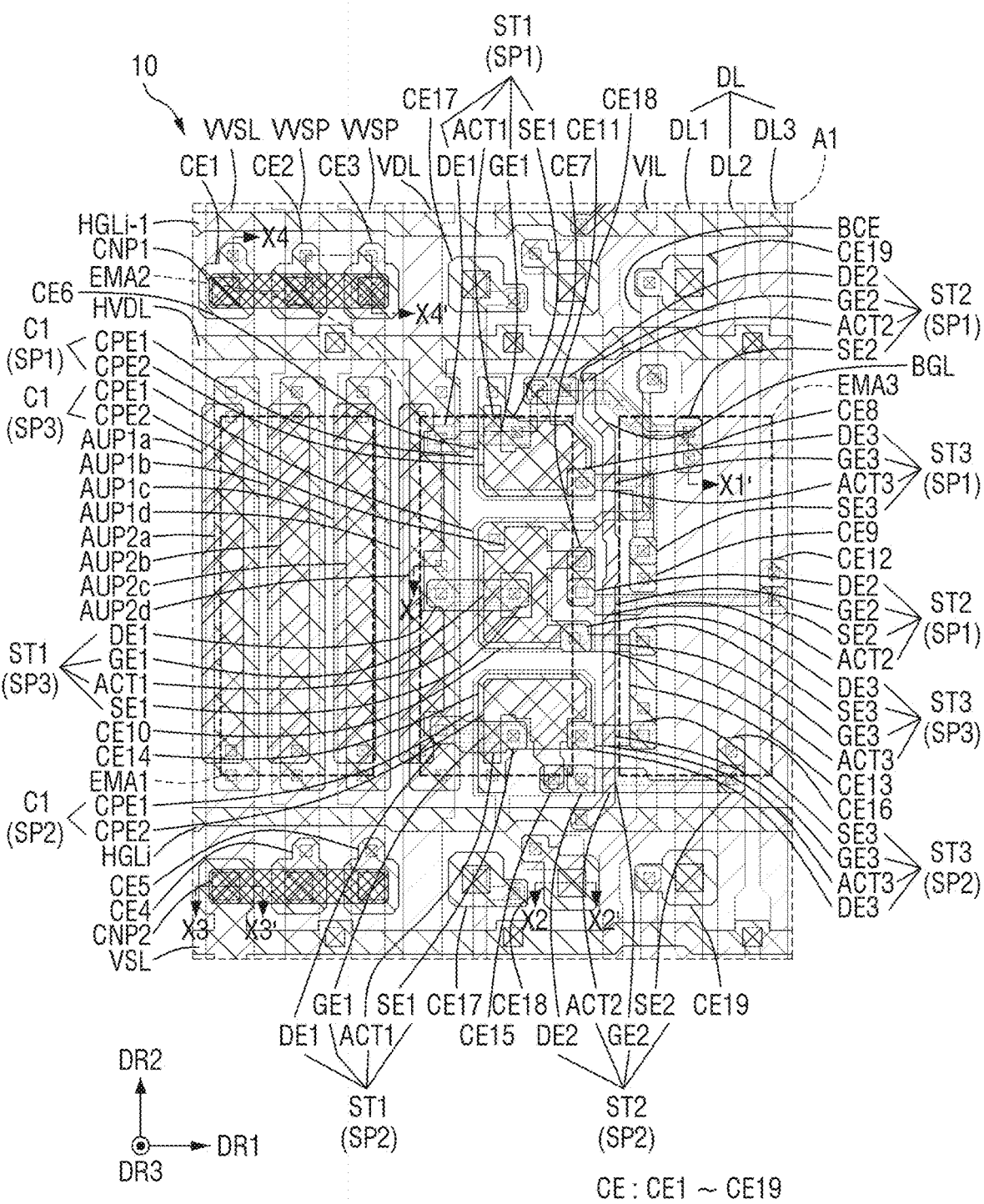
FIGS. 9 and 10 are enlarged schematic plan views of an area A1 of FIG. 8.
Figure 10:
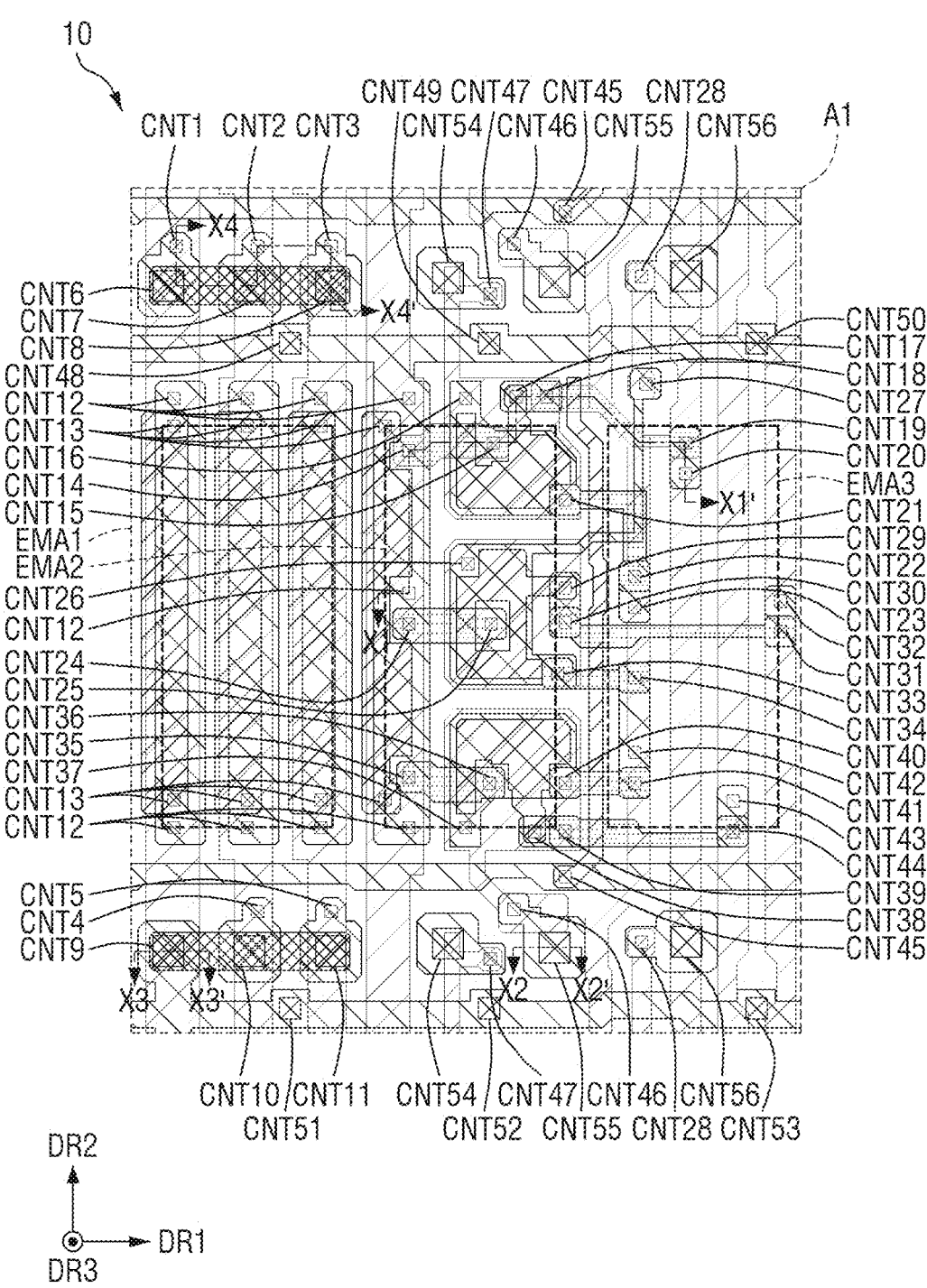
Figure 11:
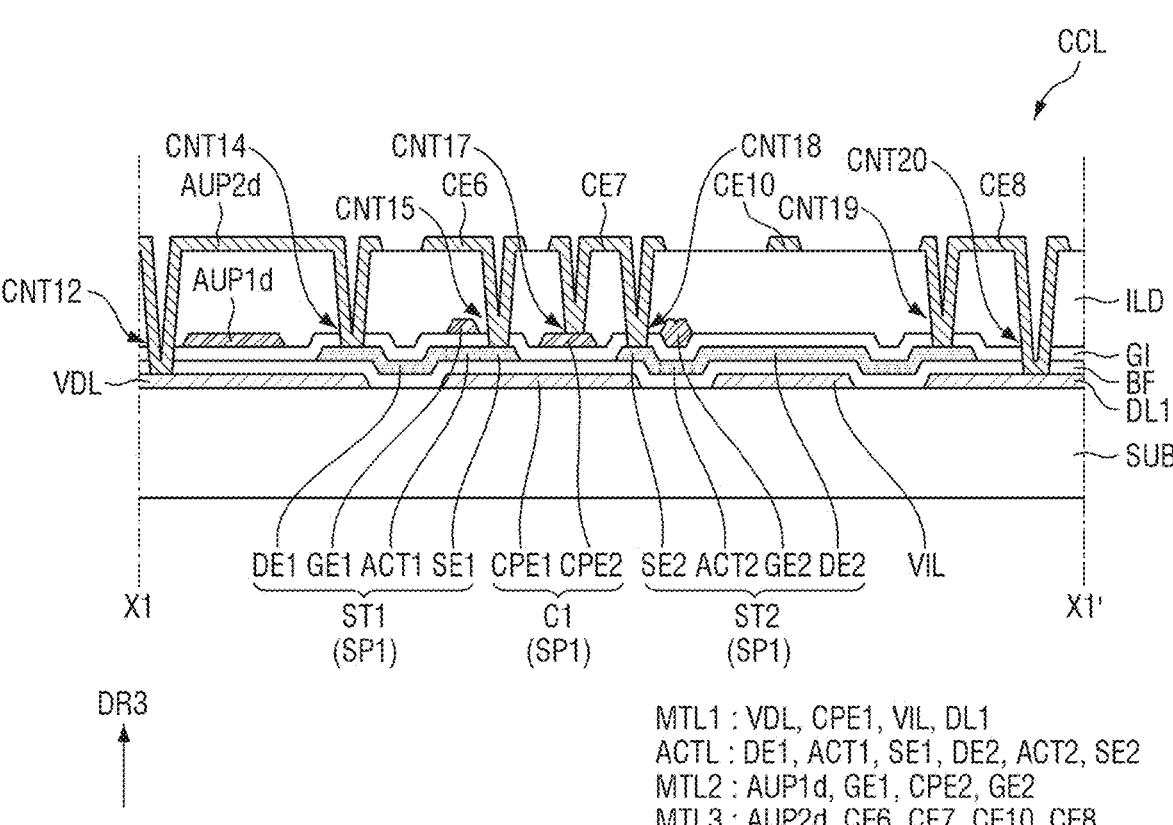
FIG. 11 is a schematic cross-sectional view taken along line X1-X1' of FIGS. 9 and 10.
Figure 12:
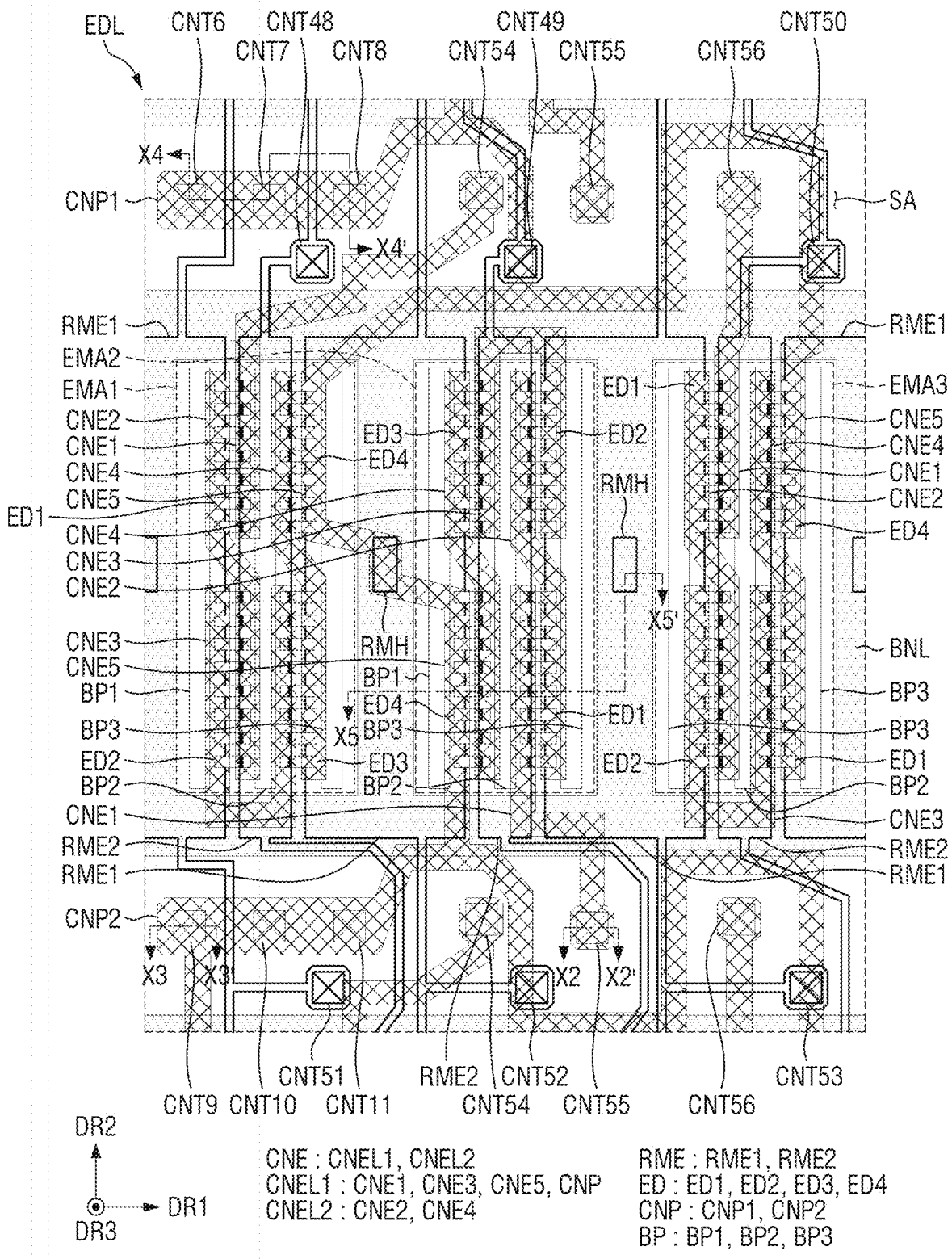
FIG. 12 is a schematic plan view of a light-emitting element layer on a circuit element layer of the display device of FIG. 1.
Figure 13:
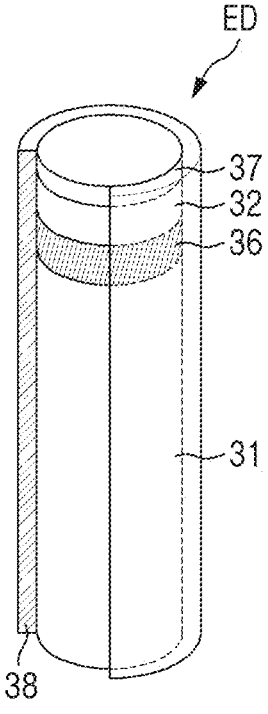
FIG. 13 is a schematic perspective view of the light-emitting element of the display device of FIG. 1.
Figure 14:
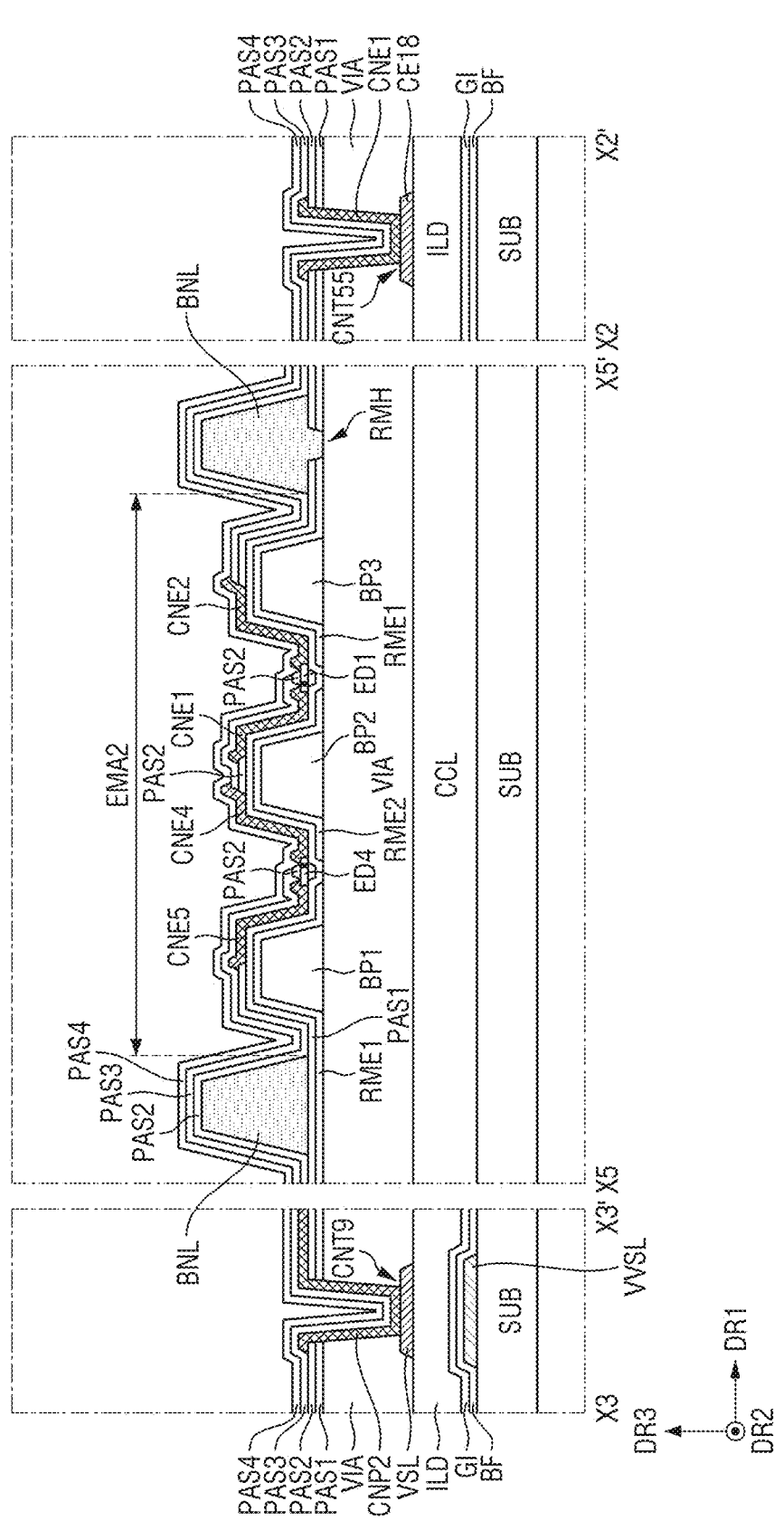
FIG. 14 is a schematic cross-sectional view taken along lines X5-X5' of FIG. 12 and lines X2-X2' and X3-X3' of FIGS. 9, 10, and 12.
Figure 15:
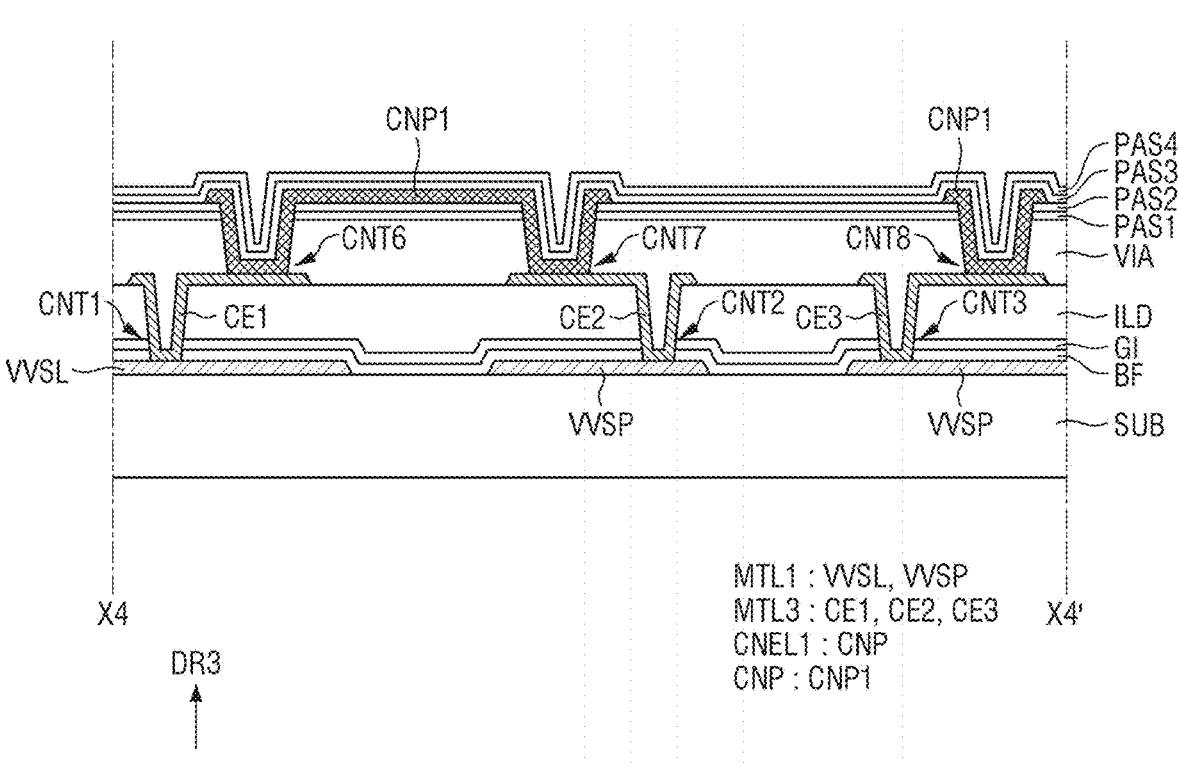
FIG. 15 is a schematic cross-sectional view taken along line X4-X4' of FIGS. 9, 10, and 12.

FIGS. 9 and 10 are enlarged schematic plan views of an area A1 of FIG. 8. FIG. 11 is a schematic cross-sectional view taken along line X1-X1' of FIGS. 9 and 10. FIG. 12 is a schematic plan view of a light-emitting element layer on a circuit element layer of the display device of FIG. 1. FIG. 13 is a schematic perspective view of the light-emitting element of the display device of FIG. 1. FIG. 14 is a schematic cross-sectional view taken along line X5-X5' of FIG. 12 and lines X2-X2' and X3-X3' of FIGS. 9, 10, and 12. FIG. 15 is a schematic cross-sectional view taken along line X4-X4' of FIGS. 9, 10, and 12.

Referring to FIGS. 9 through 15, a pixel SP of the display device 10 may have a structure in which a substrate SUB, a circuit element layer CCL, a via insulating layer VIA, and a light-emitting element layer EDL are sequentially stacked on each other. FIGS. 9 through 11 illustrate the structure of the circuit element layer CCL, FIGS. 12 through 14 illustrate the structure of the light-emitting element layer EDL on the circuit element layer CCL, and FIG. 15 illustrates the structure of the power connector CNP of FIG. 12.

FIGS. 9, 10, and 12 illustrate first, second, and third emission areas EMA1, EMA2, and EMA3. The first emission area EMA1 may be an area where light-emitting elements ED electrically connected to a first subpixel SP1 are disposed, the second emission area EMA2 may be an area where light-emitting elements ED electrically connected to a second subpixel SP2 are disposed, and the third emission area EMA3 may be an area where light-emitting elements ED electrically connected to a third subpixel SP3 are disposed.

The structure of the circuit element layer CCL will hereinafter be described with reference to FIGS. 9 through 11. FIG. 9 illustrates the elements of the circuit element layer CCL of the pixel SP and the first power connector CNP1 on the circuit element layer CCL, FIG. 10 illustrates first through fifty-sixth contact holes CNT1 through CNT56 for explaining how the elements of the circuit element layer CCL may be electrically connected to the first power connector CNP1, and FIG. 11 illustrates how first and second transistors ST1 and ST2 of the first subpixel SP1 may be stacked on each other, for explaining how the elements of the circuit element layer CCL may be stacked on each other.

The circuit element layer CCL may include a first metal layer MTL1, a semiconductor layer ACTL, a second metal layer MTL2, and a third metal layer MTL3 as conductive layers and may include a buffer layer BF, a gate insulating layer GI, and an interlayer insulating layer ILD as insulating layers. The circuit element layer CCL may be disposed on the substrate SUB and may have a structure where the first metal layer MTL1, the buffer layer BF, the semiconductor layer ACTL, the gate insulating layer GI, the second metal layer MTL2, the interlayer insulating layer ILD, and the third metal layer MTL3 are sequentially stacked on each other.

The first metal layer MTL1 may include a vertical voltage line VVSL, line patterns VVSP, a first voltage line VDL, first capacitor electrodes CPE1 of the first, second, and third subpixels SP1, SP2, and SP3, an initialization voltage line VIL, a lower connecting electrode BCE, and first, second, and third data lines DL1, DL2, and DL3, which are sequentially arranged along the first direction DR1. In some embodiments, two line patterns VVSP may be disposed between the vertical voltage line VVSL and the first voltage line VDL, but the number of line patterns VVSP is not particularly limited. FIGS. 9 and 10 illustrate that two line patterns VVSP may be disposed between the vertical voltage line VVSL and the first voltage line VDL.

The vertical voltage line VVSL, the line patterns VVSP, the first voltage line VDL, the initialization voltage line VIL, the first data line DL1, the second data line DL2, and the third data line DL3 may generally extend in the second direction DR2.

The first capacitor electrodes CPE1 of the first, second, and third subpixels SP1, SP2, and SP3 may be disposed between the first voltage line VDL and the initialization voltage line VIL. For example, the first capacitor electrode CPE1 of the second subpixel SP2, the first capacitor electrode CPE1 of the third subpixel SP3, and the first capacitor electrode CPE1 of the first subpixel SP1 may be sequentially arranged in the second direction DR2. The first capacitor electrodes CPE1 of the first, second, and third subpixels SP1, SP2, and SP3 may correspond to the second electrode of the first capacitor C1 of FIG. 6.

The first metal layer MTL1 may include a metal. In some embodiments, the first metal layer MTL1 may include at least one of molybdenum (Mo), aluminum (Al), platinum (Pt), palladium (Pd), silver (Ag), magnesium (Mg), gold (Au), nickel (Ni), neodymium (Nd), iridium (Jr), chromium (Cr), calcium (Ca), titanium (Ti), tantalum (Ta), tungsten (W), and copper (Cu), but the disclosure is not limited thereto.

The buffer layer BF may be disposed on the first metal layer MTL1. The buffer layer BF may be formed to have substantially the same thickness along the planar profile of the first metal layer MTL1.

The semiconductor layer ACTL may be disposed on the buffer layer BF. The semiconductor layer ACTL may include active areas (ACT1, ACT2, and ACT3), drain electrodes (DE1, DE2, and DE3), and source electrodes (SE1, SE2, and SE3) of the first, second, and third subpixels SP1, SP2, and SP3.

For example, the semiconductor layer ACTL may include a first source electrode SE1, a first drain electrode DE1, and a first active area ACT1 of a first transistor ST1 of each of the first, second, and third subpixels SP1, SP2, and SP3, a second source electrode SE2, a second drain electrode DE2, and a second active area ACT2 of a second transistor ST2 of each of the first, second, and third subpixels SP1, SP2, and SP3, and a third source electrode SE3, a third drain electrode DE3, and a third active area ACT3 of a third transistor ST3 of each of the first, second, and third subpixels SP1, SP2, and SP3.

The first source electrode SE1, the first drain electrode DE1, and the first active area ACT1 of the first transistor ST1 of each of the first, second, and third subpixels SP1, SP2, and SP3 may be integrally formed, the second source electrode SE2, the second drain electrode DE2, and the second active area ACT2 of the second transistor ST2 of each of the first, second, and third subpixels SP1, SP2, and SP3 may be integrally formed, and the third source electrode SE3, the third drain electrode DE3, and the third active area ACT3 of the third transistor ST3 of each of the first, second, and third subpixels SP1, SP2, and SP3 may be integrally formed.

The first source electrode SE1 and the first drain electrode DE1 of the first transistor ST1 of each of the first, second, and third subpixels SP1, SP2, and SP3 may correspond to the source and drain electrodes, respectively, of the first transistor ST1 of FIG. 6, the second source electrode SE2 and the second drain electrode DE2 of the second transistor ST2 of each of the first, second, and third subpixels SP1, SP2, and SP3 may correspond to the source and drain electrodes, respectively, of the second transistor ST2 of FIG. 6, and the third source electrode SE3 and the third drain electrode DE3 of the third transistor ST3 of each of the first, second, and third subpixels SP1, SP2, and SP3 may correspond to the source and drain electrodes, respectively, of the third transistor ST3 of FIG. 6.

As will be described later, the first active areas ACT1 of the first transistors ST1 of the first, second, and third subpixels SP1, SP2, and SP3 may overlap first gate electrodes GE1 of the first, second, and third subpixels SP1, SP2, and SP3 of the second metal layer MTL2 in the third direction DR3, the second active areas ACT2 of the second transistors ST2 of the first, second, and third subpixels SP1, SP2, and SP3 may overlap second gate electrodes GE2 of the first, second, and third subpixels SP1, SP2, and SP3 of the second metal layer MTL2 in the third direction DR3, and the third active areas ACT3 of the third transistors ST3 of the first, second, and third subpixels SP1, SP2, and SP3 may overlap third gate electrodes GE3 of the first, second, and third subpixels SP1, SP2, and SP3 of the second metal layer MTL2 in the third direction DR3.

The semiconductor layer ACTL may include polycrystalline silicon, monocrystalline silicon, and/or an oxide semiconductor. In other embodiments, the semiconductor layer ACTL may include polycrystalline silicon. The oxide semiconductor may be an oxide semiconductor containing indium (In). For example, the oxide semiconductor may be at least one of indium tin oxide (ITO), indium zinc oxide (IZO), indium gallium oxide (IGO), indium zinc tin oxide (IZTO), indium gallium tin oxide (IGTO), indium gallium zinc oxide (IGZO), and indium gallium zinc tin oxide (IGZTO).

The gate insulating layer GI may be disposed on the active layer ACTL. The gate insulating layer GI may be formed to have substantially the same thickness along the planar profile of the active layer ACTL.

The second metal layer MTL2 may be disposed on the gate insulating layer GI. The second metal layer MTL2 may include a first lower auxiliary electrode AUP1a, a second lower auxiliary electrode AUP1b, a third lower auxiliary electrode AUP1c, a fourth lower auxiliary electrode AUP1d, second capacitor electrodes CPE2 of the first, second, and third subpixels SP1, SP2, and SP3, and auxiliary gate lines BGL, which are sequentially arranged along the first direction DR1.

The first, second, third, and fourth lower auxiliary electrodes AUP1a, AUP1b, AUP1c, and AUP1d may be sequentially arranged along the first direction DR1. The first lower auxiliary electrode AUP1a may overlap the vertical voltage line VVSL in the third direction DR3, the second and third lower auxiliary electrodes AUP1b and AUP1c may overlap their respective line patterns VVSP in the third direction DR3, and the fourth lower auxiliary electrode AUP1d may overlap the first voltage line VDL in the third direction DR3.

The first, second, third, and fourth lower auxiliary electrodes AUP1a, AUP1b, AUP1c, and AUP1d may be electrically connected to the vertical voltage line VVSL, the line patterns VVSP, and the first voltage line VDL through the twelfth contact hole CNT12. The twelfth contact hole CNT12 may penetrate the gate insulating layer GI and the buffer layer BF, which are disposed below the second metal layer MTL2. The first, second, third, and fourth lower auxiliary electrodes AUP1a, AUP1b, AUP1c, and AUP1d may be electrically connected to the vertical voltage line VVSL, the line patterns VVSP, and the first voltage line VDL and may thus reduce the line resistances of the vertical voltage line VVSL, the line patterns VVSP, and the first voltage line VDL.

The second capacitor electrodes CPE2 of the first, second, and third subpixels SP1, SP2, and SP3 may be disposed in the second metal layer MTL2. For example, the second capacitor electrode CPE2 of the second subpixel SP2, the second capacitor electrode CPE2 of the third subpixel SP3, and the second capacitor electrode CPE2 of the first subpixel SP1 may be sequentially arranged along the second direction DR2.

The second capacitor electrodes CPE2 of the first, second, and third subpixels SP1, SP2, and SP3 may correspond to the first electrode of the first capacitor C1 of FIG. 6. For example, the second capacitor electrode CPE2 of the first subpixel SP1 may overlap the first capacitor electrode CPE1 of the first subpixel SP1 in the third direction DR3 to form a first capacitor C1 of the first subpixel SP1, the second capacitor electrode CPE2 of the second subpixel SP2 may overlap the first capacitor electrode CPE1 of the second subpixel SP2 in the third direction DR3 to form a first capacitor C1 of the second subpixel SP2, and the second capacitor electrode CPE2 of the third subpixel SP3 may overlap the first capacitor electrode CPE1 of the third subpixel SP3 in the third direction DR3 to form a first capacitor C1 of the third subpixel SP3.

Parts of the second capacitor electrodes CPE2 of the first, second, and third subpixels SP1, SP2, and SP3 may be the first gate electrodes GE1 of the first, second, and third subpixels SP1, SP2, and SP3. For example, part of the second capacitor electrode CPE2 of the second subpixel SP2 that overlaps the first active area ACT1 of the second subpixel SP2 may be the first gate electrode GE1 of the second subpixel SP2, part of the second capacitor electrode CPE2 of the third subpixel SP3 that overlaps the first active area ACT1 of the third subpixel SP3 may be the first gate electrode GE1 of the third subpixel SP3. The first gate electrodes GE1 of the first, second, and third subpixels SP1, SP2, and SP3 may correspond to the gate electrode of the first transistor ST1 of FIG. 6.

The auxiliary gate line BGL may extend in the second direction DR2. The auxiliary gate line BGL may be disposed on first sides, in the first direction DR1, of the second capacitor electrodes CPE2 of the first, second, and third subpixels SP1, SP2, and SP3.

Parts of the auxiliary gate line BGL may be the second gate electrodes GE2 of the first, second, and third subpixels SP1, SP2, and SP3. For example, part of the auxiliary gate line BGL that overlaps the second active area ACT2 of the first subpixel SP1 may be the second gate electrode GE2 of the first subpixel SP1, part of the auxiliary gate line BGL that overlaps the second active area ACT2 of the second subpixel SP2 may be the second gate electrode GE2 of the second subpixel SP2, and part of the auxiliary gate line BGL that overlaps the second active area ACT2 of the third subpixel SP3 may be the second gate electrode GE2 of the third subpixel SP3. The second gate electrodes GE2 of the first, second, and third subpixels SP1, SP2, and SP3 may correspond to the gate electrode of the second transistor ST2 of FIG. 6.

Other parts of the auxiliary gate line BGL may be the third gate electrodes GE3 of the first, second, and third subpixels SP1, SP2, and SP3. For example, part of the auxiliary gate line BGL that overlaps the third active area ACT3 of the first subpixel SP1 may be the third gate electrode GE3 of the first subpixel SP1, part of the auxiliary gate line BGL that overlaps the third active area ACT3 of the second subpixel SP2 may be the third gate electrode GE3 of the second subpixel SP2, and part of the auxiliary gate line BGL that overlaps the third active area ACT3 of the third subpixel SP3 may be the third gate electrode GE3 of the third subpixel SP3. The third gate electrodes GE3 of the first, second, and third subpixels SP1, SP2, and SP3 may correspond to the gate electrode of the third transistor ST3 of FIG. 6.

The second metal layer MTL2 may include a metal. In some embodiments, the second metal layer MTL2 may include at least one of Mo, Al, Pt, Pd, Ag, Mg, Au, Ni, Nd, Ir, Cr, Ca, Ti, Ta, W, and Cu, but the disclosure is not limited thereto.

The interlayer insulating layer ILD may be disposed on the second metal layer MTL2. In some embodiments, the interlayer insulating layer ILD may planarize step differences formed by its underlying layers, but the disclosure is not limited thereto.

The third metal layer MTL3 may be disposed on the interlayer insulating layer ILD. The third metal layer MTL3 may include (i–1)-th and i-th horizontal gate lines HGLi–1 and HGLi, a horizontal voltage line HVDL, and a second voltage line VSL, which generally extend in the first direction DR1, first, second, third, and fourth upper auxiliary electrodes AUP2a, AUP2b, AUP2c, and AUP2d, which generally extend in the second direction DR2, and connecting electrodes CE, which are distributed in the display area DA.

The (i–1)-th and i-th horizontal gate lines HGLi–1 and HGLi, the horizontal voltage line VDL, and the second voltage line VSL may generally extend in the first direction DR1 and may be electrically connected to the elements thereabove or therebelow through contact holes.

The (i–1)-th and i-th horizontal gate lines HGLi–1 and HGLi may be electrically connected to auxiliary gate lines BGL of the second metal layer MTL2 through forty-fifth contact holes CNT45. The forty-fifth contact holes CNT45 may penetrate the interlayer insulating layer ILD.

The horizontal voltage line HVDL may be electrically connected to a second alignment electrode RME2 (of FIGS. 12 and 14), which is disposed above the third metal layer MTL3, through the forty-eighth, forty-ninth, and fiftieth contact holes CNT48, CNT49, and CNT50. This will be described later.

The second voltage line VSL may be electrically connected to a first alignment electrode RME1 (of FIGS. 12 and 14), which is disposed above the third metal layer MTL3, through the fifty-first, fifty-second, and fifty-third contact holes CNT51, CNT52, and CNT53. This will be described later.

The second voltage line VSL may include a protrusion protruding in the second direction DR2 from part of the second voltage line VSL that overlaps the vertical voltage line VVSL. The protrusion may be connected to the second power connector CNP2, which is included in a first contact electrode layer CNEL1 (of FIGS. 12 and 14) above the third metal layer MTL3, through the ninth contact hole CNT9. This will be described later.

The first, second, third, and fourth upper auxiliary electrodes AUP2a, AUP2b, AUP2c, and AUP2d may be sequentially arranged along the first direction DR1. The first upper auxiliary electrode AUP2a may overlap the vertical voltage line VVSL in the third direction DR3, the second and third upper auxiliary electrodes AUP2b and AUP2c may overlap their respective line patterns VVSP in the third direction DR3, and the fourth upper auxiliary electrode AUP2d may overlap the first voltage line VDL in the third direction DR3.

The first, second, third, and fourth upper auxiliary electrodes AUP2a, AUP2b, AUP2c, and AUP2d may be electrically connected to the vertical voltage line VVSL, the line patterns VVSP, and the first voltage line VDL through the thirteenth contact hole CNT13. The thirteenth contact hole CNT13 may penetrate the interlayer insulating layer ILD, the gate insulating layer GI, and the buffer layer BF, which are disposed below the third metal layer MTL3. The first, second, third, and fourth upper auxiliary electrodes AUP2a, AUP2b, AUP2c, and AUP2d may be electrically connected to the vertical voltage line VVSL, the line patterns VSP, and the first voltage line VDL and may thus reduce the line resistances of the vertical voltage line VVSL, the line patterns VSP, and the first voltage line VDL.

The fourth upper auxiliary electrode AUP2d may be integrally formed with the horizontal voltage line HVDL and may protrude from the horizontal voltage line HVDL in the second direction DR2. The fourth upper auxiliary electrode AUP2d may be electrically connected to the first drain electrode DE1 of the first subpixel SP1 through the fourteenth contact hole CNT14, to the first drain electrode DE1 of the third subpixel SP3 through the twenty-fourth contact hole CNT24, and to the first drain electrode DE1 of the second subpixel SP2 through the thirty-fifth contact hole CNT35. Accordingly, the first drain electrodes DE1 of the first, second, and third subpixels SP1, SP2, and SP3 may be electrically connected to the horizontal voltage line HVDL and the first voltage line VDL. The fourteenth, twenty-fourth, and thirty-fifth contact holes CNT14, CNT24, and CNT35 may penetrate the interlayer insulating layer ILD and the gate insulating layer GI.

The connecting electrodes CE may include first through nineteenth connecting electrodes CE1 through CE19, which are distributed in the display area DA. The first through nineteenth connecting electrodes CE1 through CE19 may be spaced apart from one another.

The first connecting electrode CE1 may overlap the vertical voltage line VVSL in the third direction DR3 and may be electrically connected to the vertical voltage line VVSL through the first contact hole CNT1. The first contact hole CNT1 may penetrate the interlayer insulating layer ILD, the gate insulating layer GI, and the buffer layer BF, which are disposed below the third metal layer MTL3. Also, the first connecting electrode CE1 may be electrically connected to the first power connector CNP1 through the sixth contact hole CNT6. This will be described later.

The second connecting electrode CE2 may overlap the line pattern VVSP therebelow in the third direction DR3 and may be electrically connected to the line pattern VVSP therebelow through the second contact hole CNT2. The second contact hole CNT2 may penetrate the interlayer insulating layer ILD, the gate insulating layer GI, and the buffer layer BF, which are disposed below the third metal layer MTL3. Also, the second connecting electrode CE2 may be electrically connected to the first power connector CNP1 through the seventh contact hole CNT7. This will be described later.

The third connecting electrode CE3 may overlap the line pattern VVSP therebelow in the third direction DR3 and may be electrically connected to the line pattern VVSP therebelow through the third contact hole CNT3. The third contact hole CNT3 may penetrate the interlayer insulating layer ILD, the gate insulating layer GI, and the buffer layer BF, which are disposed below the third metal layer MTL3. Also, the third connecting electrode CE3 may be electrically connected to the first power connector CNP1 through the eighth contact hole CNT8. This will be described later.

The fourth connecting electrode CE4 may overlap the line pattern VVSP therebelow in the third direction DR3 and may be electrically connected to the line pattern VVSP therebelow through the fourth contact hole CNT4. The fourth contact hole CNT4 may penetrate the interlayer insulating layer ILD, the gate insulating layer GI, and the buffer layer BF, which are disposed below the third metal layer MTL3. The fourth connecting electrode CE4 may be adjacent to the second voltage line VSL, and the horizontal voltage line HVDL and the i-th horizontal gate line HGLi may be disposed between the second and fourth connecting electrodes CE2 and CE4. The second and fourth connecting electrodes CE2 and CE4 may be electrically connected to the same line pattern VVSP. Also, the fourth connecting electrode CE4 may be electrically connected to the second power connector CNP2 through the tenth contact hole CNT10. This will be described later.

The fifth connecting electrode CE5 may overlap the line pattern VVSP therebelow in the third direction DR3 and may be electrically connected to the line pattern VVSP therebelow through the fifth contact hole CNT5. The fifth contact hole CNT5 may penetrate the interlayer insulating layer ILD, the gate insulating layer GI, and the buffer layer BF, which are disposed below the third metal layer MTL3. The fifth connecting electrode CE5 may be adjacent to the second voltage line VSL, and the horizontal voltage line HVDL and the i-th horizontal gate line HGLi may be disposed between the third and fifth connecting electrodes CE3 and CE5. The third and fifth connecting electrodes CE3 and CE5 may be electrically connected to the same line pattern VVSP. Also, the fifth connecting electrode CE5 may be electrically connected to the second power connector CNP2 through the eleventh contact hole CNT11. This will be described later.

The sixth connecting electrode CE6 may generally overlap the first and second capacitor electrodes CPE1 and CPE2 of the first subpixel SP1 in the third direction DR3. The sixth connecting electrode CE6 may be electrically connected to the first source electrode SE1 of the first subpixel SP1 through the fifteenth contact hole CNT15, to the first capacitor electrode CPE1 of the first subpixel SP1 through the sixteenth contact hole CNT16, and to the third drain electrode DE3 of the first subpixel SP1 through the twenty-first contact hole CNT21. The fifteenth and twenty-first contact holes CNT15 and CNT21 may penetrate the interlayer insulating layer ILD and the gate insulating layer GI, and the sixteenth contact hole CNT16 may penetrate the interlayer insulating layer ILD, the gate insulating layer GI, and the buffer layer BF.

The seventh connecting electrode CE7 may electrically connect the second capacitor electrode CPE2 and the second drain electrode DE2 of the first subpixel SP1. For example, the seventh connecting electrode CE7 may be electrically connected to the second capacitor electrode CPE2 of the first subpixel SP1 through the seventeenth contact hole CNT17, which penetrates the interlayer insulating layer ILD, and to the second drain electrode DE2 of the first subpixel SP1 through the eighteenth contact hole CNT18, which penetrates the interlayer insulating layer ILD and the gate insulating layer GI.

The eighth connecting electrode CE8 may electrically connect the second source electrode SE2 of the first subpixel SP1 and the first data line DL1. For example, the eighth connecting electrode CE8 may be electrically connected to the second source electrode SE2 of the first subpixel SP1 through the nineteenth contact hole CNT19, which penetrates the interlayer insulating layer ILD and the gate insulating layer GI, and to the first data line DL1 through the twentieth contact hole CNT20, which penetrates the interlayer insulating layer ILD, the gate insulating layer GI, and the buffer layer BF.

The ninth connecting electrode CE9 may electrically connect the third source electrode SE3 of the first subpixel SP1 and the initialization voltage line VIL. For example, the ninth connecting electrode CE9 may be electrically connected to the third source electrode SE3 of the first subpixel SP1 through the twenty-second contact hole CNT22, which penetrates the interlayer insulating layer ILD and the gate insulating layer GI, and to the initialization voltage line VIL through the twenty-third contact hole CNT23, which penetrates the interlayer insulating layer ILD, the gate insulating layer GI, and the buffer layer BF.

The tenth connecting electrode CE10 may generally overlap the first and second capacitor electrodes CPE1 and CPE2 of the third subpixel SP3 in the third direction DR3. The tenth connecting electrode CE10 may be electrically connected to the first source electrode SE1 of the third subpixel SP3 through the twenty-fifth contact hole CNT25, to the first capacitor electrode CPE1 of the third subpixel SP3 through the twenty-sixth contact hole CNT26, and to the third drain electrode DE3 of the third subpixel SP3 through the thirty-third contact hole CNT33. The twenty-fifth and thirty-third contact holes CNT25 and CNT33 may penetrate the interlayer insulating layer ILD and the gate insulating layer GI, and the twenty-sixth contact hole CNT26 may penetrate the interlayer insulating layer ILD, the gate insulating layer GI, and the buffer layer BF.

Part of the tenth connecting electrode CE10 may be electrically connected to the lower connecting electrode BCE. For example, the tenth connecting electrode CE10 may be connected to the lower connecting electrode BCE through the twenty-seventh contact hole CNT27, which penetrates the interlayer insulating layer ILD, the gate insulating layer GI, and the buffer layer BF. Accordingly, the lower connecting electrode BCE may be electrically connected to the first capacitor electrode CPE1 of the third subpixel SP3.

The eleventh connecting electrode CE11 may electrically connect the second capacitor electrode CPE2 and the second drain electrode DE2 of the third subpixel SP3. For example, the eleventh connecting electrode CE11 may be electrically connected to the second capacitor electrode CPE2 of the third subpixel SP3 through the twenty-ninth contact hole CNT29, which penetrates the interlayer insulating layer ILD, and to the second drain electrode DE2 of the third subpixel SP3 through the thirtieth contact hole CNT30, which penetrates the interlayer insulating layer ILD and the gate insulating layer GI.

The twelfth connecting electrode CE12 may electrically connect the second source electrode SE2 of the third subpixel SP3 and the third data line DL3. For example, the twelfth connecting electrode CE12 may be electrically connected to the second source electrode SE2 of the third subpixel SP3 through the thirty-first contact hole CNT31, which penetrates the interlayer insulating layer ILD and the gate insulating layer GI, and to the third data line DL3 through the thirty-second contact hole CNT32, which penetrates the interlayer insulating layer ILD, the gate insulating layer GI, and the buffer layer BF.

The thirteenth connecting electrode CE13 may electrically connect the third source electrode SE3 of the third subpixel SP3 and the third source electrode SE3 of the second subpixel SP2. For example, the thirteenth connecting electrode CE13 may be electrically connected to the third source electrode SE3 of the third subpixel SP3 through the thirty-fourth contact hole CNT34, which penetrates the interlayer insulating layer ILD and the gate insulating layer GI, to the initialization voltage line VIL through the forty-second contact hole CNT42, which penetrates the interlayer insulating layer ILD, the gate insulating layer GI, and the buffer layer BF, and to the third source electrode SE3 of the second subpixel SP2 through the forty-first contact hole CNT41, which penetrates the interlayer insulating layer ILD and the gate insulating layer GI.

The fourteenth connecting electrode CE14 may generally overlap the first and second capacitor electrodes CPE1 and CPE2 of the second subpixel SP2 in the third direction DR3. The fourteenth connecting electrode CE14 may be electrically connected to the first source electrode SE1 of the second subpixel SP2 through the thirty-sixth contact hole CNT36, to the first capacitor electrode CPE1 of the second subpixel SP2 through the thirty-seventh contact hole CNT37, and to the third drain electrode DE3 of the second subpixel SP2 through the fortieth contact hole CNT40. The thirty-sixth and fortieth contact holes CNT36 and CNT40 may penetrate the interlayer insulating layer ILD and the gate insulating layer GI, and the thirty-seventh contact hole CNT37 may penetrate the interlayer insulating layer ILD, the gate insulating layer GI, and the buffer layer BF.

The fifteenth connecting electrode CE15 may electrically connect the second capacitor electrode CPE2 and the second drain electrode DE2 of the second subpixel SP2. For example, the fifteenth connecting electrode CE15 may be electrically connected to the second capacitor electrode CPE2 of the second subpixel SP2 through the thirty-eighth contact hole CNT38, and to the second drain electrode DE2 of the second subpixel SP2 through the thirty-ninth contact hole CNT39, which penetrates the interlayer insulating layer ILD and the gate insulating layer GI.

The sixteenth connecting electrode CE16 may electrically connect the second source electrode SE2 of the second subpixel SP2 and the second data line DL2. For example, the sixteenth connecting electrode CE16 may be electrically connected to the second source electrode SE2 of the second subpixel SP2 through the forty-fourth contact hole CNT44, which penetrates the interlayer insulating layer ILD and the gate insulating layer GI, and to the second data line DL2 through the forty-third contact hole CNT43, which penetrates the interlayer insulating layer ILD, the gate insulating layer GI, and the buffer layer BF.

The seventeenth connecting electrode CE17 may connect the first capacitor electrode CPE1 of the first subpixel SP1 and a second contact electrode CNE2 in the first emission area EMA1. For example, the seventh connecting electrode CE17 may be electrically connected to the first capacitor electrode CPE1 of the first subpixel SP1 through the forty-seventh contact hole CNT47, which penetrates the interlayer insulating layer ILD, the gate insulating layer GI, and the buffer layer BF, and to the second contact electrode CNE2 in the emission area EMA1 through the fifty-fourth contact hole CNT54. This will be described later.

The eighteenth connecting electrode CE18 may connect the first capacitor electrode CPE1 of the second subpixel SP2 and a second contact electrode CNE2 in the second emission area EMA2. For example, the eighteenth connecting electrode CE18 may be electrically connected to the first capacitor electrode CPE1 of the second subpixel SP2 through the forty-sixth contact hole CNT46, which penetrates the interlayer insulating layer ILD, the gate insulating layer GI, and the buffer layer BF, and to the second contact electrode CNE2 in the second emission area EMA2 through the fifty-fifth contact hole CNT55. This will be described later.

The nineteenth connecting electrode CE19 may connect the lower connecting electrode BCE and a second contact electrode CNE2 in the third emission area EMA3. For example, the nineteenth connecting electrode CE19 may be electrically connected to the lower connecting electrode BCE through the twenty-eighth contact hole CNT28, which penetrates the interlayer insulating layer ILD, the gate insulating layer GI, and the buffer layer BF, and to the second contact electrode CNE2 in the first emission area EMA1 through the fifty-sixth contact hole CNT56. This will be described later.

The third metal layer MTL3 may include a metal. In some embodiments, the third metal layer MTL3 may include at least one of Mo, Al, Pt, Pd, Ag, Mg, Au, Ni, Nd, Ir, Cr, Ca, Ti, Ta, W, and Cu, but the disclosure is not limited thereto.

At least one of the first, second, and third emission areas EMA1, EMA2, and EMA3 on the circuit element layer CCL may overlap the line patterns VVSP in the third direction DR3. In some embodiments, the first emission area EMA1 may overlap the line patterns VVSP in the third direction DR3, but the disclosure is not limited thereto. FIGS. 9 and 10 illustrate that the first emission area EMA1 may overlap the line patterns VVSP in the third direction DR3.

If during the alignment of light-emitting elements ED in the first emission area EMA1 with the use of an electric field, the line patterns VVSP are electrically connected to the vertical voltage line VVSL or the second voltage line VSL to reduce RC delays, the alignment of the light-emitting elements ED may be adversely affected because of the line patterns VVSP overlapping the first emission area EMA1, and as a result, the degree of alignment of the light-emitting elements ED may be lowered.

Therefore, a power connector CNP, which electrically connects the line patterns VVSP to the vertical voltage line VVSL or the second voltage line VSL to reduce RC delays, may need to be formed after the alignment of the light-emitting elements ED.

The structure of the light-emitting element layer EDL on the circuit element layer CCL and the structure of the power connector CNP included in the light-emitting element layer EDL will hereinafter be described. FIG. 12 is a plan view illustrating inner banks BP, an outer bank BNL, an alignment electrode layer RME, light-emitting elements ED, and a contact electrode layer CNE in the light-emitting element layer EDL, FIG. 14 is a cross-sectional view illustrating the second emission area EMA2 for explaining the structure of the light-emitting element layer EDL, and FIG. 15 illustrates how a power connector CNP and line patterns VVSP may be electrically connected.

Referring to FIGS. 12 through 15, the via insulating layer VIA may be disposed on the circuit element layer CCL, and the light-emitting element layer EDL may be disposed on the via insulating layer VIA. The via insulating layer VIA may include an organic insulating material such as, for example, polyimide, and may form a flat top surface by compensating for step differences formed by various lines or wires in the circuit element layer CCL.

The light-emitting element layer EDL may include the inner banks BP, the alignment electrode layer RME, a first insulating layer PAS1, the outer bank BNL, the light-emitting elements ED, a second insulating layer PAS2, the contact electrode layer CNE, a third insulating layer PAS3, and a fourth insulating layer PAS4. The contact electrode layer CNE may be divided into first and second contact electrode layers CNEL1 and CNEL2 depending on the stacking order. For example, the first contact electrode layer CNEL1 may be stacked earlier than the second contact electrode layer CNEL2.

The light-emitting element layer EDL may have substantially the same structure in the first, second, and third emission areas EMA1, EMA2, and EMA3. For convenience, the structure of the light-emitting element layer EDL in the second emission area EMA2 will hereinafter be described, and a detailed description of the light-emitting element layer EDL in the first or third emission area EMA1 or EMA3 will be omitted.

The inner banks BP may be disposed on the via insulating layer VIA. The inner banks BP may extend in the second direction DR2 in a plan view. The inner banks BP may include first, second, and third inner banks BP1, BP2, and BP3, which are spaced apart from one another and are sequentially arranged along the first direction DR1. The first, second, and third inner banks BP1, BP2, and BP3 may be disposed in the first, second, and third emission areas EMA1, EMA2, and EMA3, respectively.

The inner banks BP may include a transparent organic insulating material such as polyimide, but the disclosure is not limited thereto. For example, the inner banks BP may further include a color pigment such as a black pigment.

The alignment electrode layer RME may be disposed on the inner banks BP and the via insulating layer VIA. In some embodiments, the alignment electrode layer RME may completely cover the inner banks BP, but the disclosure is not limited thereto. FIGS. 12 and 13 illustrate that the alignment electrode layer RME completely covers the inner banks BP.

The alignment electrode layer RME may include first alignment electrodes RME1 and a second alignment electrode RME2, which are alternately arranged along the first direction DR1. The first alignment electrodes RME1 and the second alignment electrode RME2 may be electrodes to which alignment signals for aligning the light-emitting elements ED are applied during the fabrication of the display device 10.

Each of the first, second, and third emission areas EMA1, EMA2, and EMA3 may include two first alignment electrodes RME1 and one second alignment electrode RME2 between the two first alignment electrodes RME1. The light-emitting elements ED may be aligned in gaps between the first alignment electrodes RME1 and the second alignment electrode RME2.

The first alignment electrodes RME1 may be disposed on both sides, in the first direction DR1, of each of the first, second, and third emission areas EMA1, EMA2, and EMA3. For example, the first alignment electrodes RME1 may be disposed on first and second sides, in the first direction DR1, of the second emission area EMA2.

Each of the first alignment electrodes RME1 may extend across multiple emission areas. For example, the first alignment electrode RME1 on the second side, in the first direction DR1, of the second emission area EMA2 may also be disposed on a first side, in the first direction DR1, of the first emission area EMA1, and the first alignment electrode RME1 on the first side, in the first direction DR1, of the second emission area EMA2 may also be disposed on a second side, in the first direction DR1, of the third emission area EMA3. In the second emission area EMA2, one of the first alignment electrodes RME1 may be disposed on the first inner bank BP1, and the other first alignment electrodes RME1 may be disposed on the third inner bank BP3.

One second alignment electrode RME2 may be disposed in each of the first, second, and third emission areas EMA1, EMA2, and EMA3. For example, in the second emission area EMA2, the second alignment electrode RME2 may be disposed in a gap between the first alignment electrodes RME1. In the second emission area EMA2, the second alignment electrode RME2 may be disposed on the second inner bank BP2.

The first alignment electrode RME1 on the first inner bank BP1 may be disposed on the top surface of part of the via insulating layer VIA between the first and second inner banks BP1 and BP2, beyond the first inner bank BP1. The first alignment electrode RME1 on the first inner bank BP1 may extend toward the second inner bank BP2, on the top surface of the via insulating layer VIA between the first and second inner banks BP1 and BP2.

The second alignment electrode RME2 on the second inner bank BP2 may be disposed on the top surface of the part of the via insulating layer VIA between the first and second inner banks BP1 and BP2 and on the top surface of part of the via insulating layer VIA between the second and third inner banks BP2 and BP3, beyond the second inner bank BP2. The second alignment electrode RME2 may extend toward the first inner bank BP1, on the top surface of the part of the via insulating layer VIA between the first and second inner banks BP1 and BP2, and may also extend toward the third inner bank BP3, on the top surface of the part of the via insulating layer VIA between the second and third inner banks BP2 and BP3.

The first alignment electrode RME1 on the third inner bank BP3 may be disposed on the top surface of the part of the via insulating layer VIA between the second and third inner banks BP2 and BP3, beyond the third inner bank BP3. The first alignment electrode RME1 on the third inner bank BP3 may extend toward the second inner bank BP2, on the top surface of the part of the via insulating layer VIA between the second and third inner banks BP2 and BP3.

The first alignment electrodes RME1 may be electrically connected to the second voltage line VSL through the fifty-first, fifty-second, and fifty-third contact holes CNT51, CNT52, and CNT53. The fifty-first, fifty-second, and fifty-third contact holes CNT51, CNT52, and CNT53 may penetrate the via insulating layer VIA. Accordingly, as an alignment signal for aligning the light-emitting elements ED, a low-potential voltage may be applied to the first alignment electrodes RME via the second voltage line VSL.

For example, in the second emission area EMA2, the first alignment electrode RME1 on the first inner bank BP1 may be electrically connected to the second voltage line VSL through the fifty-first contact hole CNT51, and the first alignment electrode RME1 on the third inner bank BP3 may be electrically connected to the second voltage line VSL through the fifty-second contact hole CNT52.

The second alignment electrode RME2 may be electrically connected to the horizontal voltage line HVDL through the forty-eighth, forty-ninth-, and fiftieth contact holes CNT48, CNT49, and CNT50. The forty-eighth, forty-ninth-, and fiftieth contact holes CNT48, CNT49, and CNT50 may penetrate the via insulating layer VIA. Accordingly, as an alignment signal for aligning the light-emitting elements ED, a high-potential voltage may be applied to the second alignment electrode RME2 via the horizontal voltage line HVDL.

Pores RMH may be formed in the first alignment electrodes RME1. The pores RMH may release outgas from the circuit element layer CCL during the fabrication of the display device 10. The pores RMH may penetrate the first alignment electrodes RME1 to expose the top surface of the via insulating layer VIA. The pores RMH may overlap the outer bank BNL in the third direction DR3.

The alignment electrode layer RME may include a metal such as Ag, Cu, and/or Al, an alloy of Al, Ni, and/or lanthanum (La), or a stack of a layer of a metal such as Ti, Mo, and/or niobium (Nb) and an alloy of Al, Ni, and/or La. In some embodiments, the alignment electrode layer RME may be formed as a double layer or a multilayer in which at least one layer of an alloy of Al and at least one layer of Ti, Mo, and/or Nb are stacked on each other.

The first alignment layer PAS1 may be disposed on the alignment electrode layer RME. The first alignment layer PAS1 may be disposed in the entire display area DA. The first insulating layer PAS1 may include an insulating material. Thus, the first insulating layer PAS1 may protect the alignment electrode layer RME and may insulate the first alignment electrodes RME1 and the second alignment electrode RME2 from one another. The first insulating layer PAS1 may be disposed to cover the alignment electrode layer RME before the formation of the outer bank BNL and may thus prevent the alignment electrode layer RME from being damaged during the formation of the outer bank BNL.

The first insulating layer PAS1 may be bent at least once in the gaps between the first alignment electrodes RME1 and the second alignment electrode RME2 to be positioned on the top surface of the via insulating layer VIA, exposed between the first alignment electrodes RME1 and the second alignment electrode RME2. The first insulating layer PAS1 may prevent the light-emitting elements ED disposed thereon from being in direct contact with, and damaged by, other members.

The pores RMH may be formed in the first insulating layer PAS1. The pores RMH may penetrate the first insulating layer PAS1 to expose the top surface of the via insulating layer VIA. The pores RMH may overlap the outer bank BNL in the third direction DR3.

The outer bank BNL may be disposed on the first insulating layer PAS1. The outer bank BNL may be formed to surround the first, second, and third emission areas EMA1, EMA2, and EMA3. In other words, the outer bank BNL may define the first, second, and third emission areas EMA1, EMA2, and EMA3. The outer bank BNL may prevent ink INK (of FIGS. 21 and 22) having the light-emitting elements ED dispersed therein from spilling over to neighboring emission areas during the fabrication of the display device 10.

Parts of the outer bank BNL may be repeatedly arranged along the second direction DR2 to be spaced apart from one another. For example, the outer bank BNL may be disposed not only in one pixel SP, but also in other pixels SP adjacent to the pixel SP in the second direction DR2. Gaps, in the second direction DR2, between the parts of the outer bank BNL may be defined as subareas SA.

The outer bank BNL, like the inner banks BP, may include a transparent organic insulating material such as polyimide, but the disclosure is not limited thereto. For example, the outer bank BNL may further include a color pigment such as a black pigment.

The gaps between the first alignment electrodes RME1 and the second alignment electrode RME2 may be provided in each of the first, second, and third emission areas EMA1, EMA2, and EMA3, and the light-emitting elements ED may be disposed on the first insulating layer PAS1, which covers the gaps between the first alignment electrodes RME1 and the second alignment electrode RME2.

Referring to FIG. 13, a light-emitting element ED may be a light-emitting diode (LED), particularly, an ILED having a size of several nanometers or micrometers and formed of an inorganic material. If an electric field is formed in a particular direction between two opposite electrodes, the light-emitting element ED may be aligned between the two electrodes where polarities are formed.

The light-emitting element ED may have a shape that extends in one direction. In some embodiments, the light-emitting element ED may have the shape of a cylinder, a rod, a wire, or a tube, but the shape of the light-emitting element ED is not particularly limited.

The light-emitting element ED may include semiconductor layers doped with a dopant of an arbitrary conductivity type (e.g., a p type or an n type). The semiconductor layers may receive electric signals from an external power source to emit light of a particular wavelength range. The light-emitting element ED may include a first semiconductor layer 31, a second semiconductor layer 32, the light-emitting layer 36, an electrode layer 37, and the insulating film 38.

The first semiconductor layer 31 of the light-emitting element ED may include an n-type semiconductor. The first semiconductor layer 31 may include a semiconductor material, i.e., $Al_xGa_yIn_{1-x-y}N$ (where $0 \leq x \leq 1$, $0 \leq y \leq 1$, and $0 \leq x+y \leq 1$). In one example, the first semiconductor layer 31 may include at least one of AlGaInN, GaN, AlGaN, InGaN, AlN, and InN that are doped with an n-type dopant. The n-type dopant may be Si, Ge, and/or Sn.

The second semiconductor layer 32 of the light-emitting element ED may be disposed on the first semiconductor layer 31 with the light-emitting layer 36 interposed therebetween. The second semiconductor layer 32 may include a p-type semiconductor. The second semiconductor layer 32 may include a semiconductor material, i.e., $Al_xGa_yIn_{1-x-y}N$ (where $0 \leq x \leq 1$, $0 \leq y \leq 1$, and $0 \leq x+y \leq 1$). In one example, the second semiconductor layer 32 may include at least one of AlGaInN, GaN, AlGaN, InGaN, AlN, and InN that are doped with a p-type dopant. The p-type dopant may be Mg, Zn, Ca, Se, and/or Ba.

Both end portions of the light-emitting element ED may have different polarities. For convenience, an end portion of the light-emitting element ED adjacent to the second semiconductor layer 32 will hereinafter be referred to as a first end portion, and an end portion of the light-emitting element ED adjacent to the first semiconductor layer 31 will hereinafter be referred to as a second end portion. The first and second end portions may be positioned at opposite locations of the light-emitting element ED.

The first and second end portions of the light-emitting element ED may have different polarities. Also, first end portions of different light-emitting elements ED may all have the same polarity, and second end portions of the different light-emitting elements ED may all have the same polarity. The first end portion of the light-emitting element ED of FIG. 13 may correspond to the first electrode of the light-emitting element ED of FIG. 6, and the second end portion of the light-emitting element ED of FIG. 13 may correspond to the second electrode of the light-emitting element ED of FIG. 6.

FIG. 13 illustrates that the first and second semiconductor layers 31 and 32 are formed as single layers, but the disclosure is not limited thereto. In other embodiments, each of the first and second semiconductor layers 31 and 32 may include more than one layer such as, for example, a clad layer or a tensile strain barrier reducing (TSBR) layer, depending on the material of the light-emitting layer 36.

The light-emitting layer 36 of the light-emitting element ED may be disposed between the first and second semiconductor layers 31 and 32. The light-emitting layer 36 may include a single- or multi-quantum well structure material. In a case where the light-emitting layer 36 includes a material having a multi-quantum well structure, the light-emitting layer 36 may have a structure in which multiple quantum layers and multiple well layers are alternately stacked on each other. The light-emitting layer 36 may emit light by combining electron-hole pairs in accordance with electric signals applied thereto via the first and second semiconductor layers 31 and 32. The light-emitting layer 36 may include a material such as AlGaN or AlGaInN. In particular, in a case where the light-emitting layer 36 has a multi-quantum well structure in which multiple quantum layers and multiple well layers are alternately stacked on each other, the quantum layers may include a material such as AlGaN or AlGaInN, and the well layers may include a material such as GaN or AlInN.

The light-emitting layer 36 may have a structure in which a semiconductor material having a large band gap energy and a semiconductor material having a small band gap energy are alternately stacked on each other or may include group-III or group-V semiconductor materials depending on the wavelength of light to be emitted. The type of light emitted by the light-emitting layer 36 is not particularly limited. In other embodiments, the light-emitting layer 36 may emit red- or green-wavelength light, instead of blue-wavelength light.

The electrode layer 37 of the light-emitting element ED may be an ohmic connecting electrode, but the disclosure is not limited thereto. In other embodiments, the electrode layer 37 may be a Schottky connecting electrode. The light-emitting element ED may include at least one electrode layer 37. The light-emitting element ED may include more than one electrode layer 37, but the disclosure is not limited thereto. In other embodiments, the electrode layer 37 may not be provided.

The electrode layer 37 may reduce the resistance between the light-emitting element ED and electrodes or connecting electrodes in case that the light-emitting element ED is electrically connected to the electrodes or the connecting electrodes. The electrode layer 37 may include a conductive metal. In one example, the electrode layer 37 may include at least one of Al, Ti, In, Au, Ag, ITO, IZO, and ITZO.

The insulating film 38 of the light-emitting element ED may protect the first and second semiconductor layers 31 and 32 and the electrode layer 37. The insulating film 38 can prevent any short circuit that may occur in the light-emitting element 36 in case that the light-emitting element ED is in direct contact with electrodes to which electric signals are applied. Also, the insulating film 38 can prevent the degradation of the emission efficiency of the light-emitting element ED.

The insulating film 38 may be disposed to surround the first and second semiconductor layers 31 and 32 and the electrode layer 37. In one example, the insulating film 38 may be disposed to surround at least the light-emitting layer 36, but to expose both end portions, in the length direction, of the light-emitting element ED. The insulating film 38 may be formed to be rounded in a cross-sectional view, in a region adjacent to at least one end of the light-emitting element ED.

The insulating film 38 may include a material with insulating properties such as, for example, silicon oxide ($SiO_x$), silicon nitride ($SiN_x$), silicon oxynitride ($SiO_xN_y$), aluminum nitride ($AlN_x$), aluminum oxide ($AlO_x$), zirconium oxide ($ZrO_x$), hafnium oxide ($HfO_x$), and/or titanium oxide ($TiO_x$). The insulating film 38 is illustrated as being a single-layer film, but the disclosure is not limited thereto. In other embodiments, in some embodiments, the insulating film 38 may be formed as a multilayer film in which multiple layers are stacked on each other.

Referring again to the second emission area EMA2 of FIG. 12, the light-emitting elements ED may include first light-emitting elements ED1 and second light-emitting elements ED2, which are disposed between the second and third inner banks BP2 and BP3, and third light-emitting elements ED3 and fourth light-emitting elements ED4, which are disposed between the first and second inner banks BP1 and BP2. The first light-emitting elements ED1 and the second light-emitting elements ED2 may be disposed to be spaced apart from one another in the second direction DR2, and the third light-emitting elements ED3 and the fourth light-emitting elements ED4 may be disposed to be spaced apart from one another in the second direction DR2.

The first light-emitting elements ED1 and the fourth light-emitting elements ED4 may face one another in the first direction DR1, and the second light-emitting elements ED2 and the third light-emitting elements ED3 may face one another in the first direction DR1. For example, the first end portions of the first light-emitting elements ED1 may face the first end portions of the fourth light-emitting elements ED4, and the first end portions of the second light-emitting elements ED2 may face the second end portions of the third light-emitting elements ED3. For example, the first end portions of the first light-emitting elements ED1 and the first end portions of the second light-emitting elements ED2 may be disposed on the second alignment electrode RME2 on the second inner bank BP2, and the second end portions of the first light-emitting elements ED1 and the second end portions of the second light-emitting elements ED2 may be disposed on the first alignment electrode RME1 on the third inner bank BP3. Also, the first end portions of the third light-emitting elements ED3 and the first end portions of the fourth light-emitting elements ED4 may be disposed on the second alignment electrode RME2 on the second inner bank BP2, and the second end portions of the third light-emitting elements ED3 and the second end portions of the fourth light-emitting elements ED4 may be disposed on the first alignment electrode RME1 on the first inner bank BP1.

The layout of the light-emitting elements ED may vary depending on the layout of the contact electrode layer CNE. For example, the layout of the light-emitting elements ED may differ from the second emission area EMA2 to the first and third emission areas EMA1 and EMA3.

For example, the first light-emitting elements ED1 may be disposed in a lower right part of the second emission area EMA2 (i.e., on a first side, in the first direction DR1, of the second emission area EMA2 and on a second side, in the second direction DR2, of the second emission area EMA2), the second light-emitting elements ED2 may be disposed in an upper right part of the second emission area EMA2 (i.e., on the first side, in the first direction DR1, of the second emission area EMA2 and on a first side, in the second direction DR2, of the second emission area EMA2), the third light-emitting elements ED3 may be disposed in an upper left part of the second emission area EMA2 (i.e., on a second side, in the first direction DR1, of the second emission area EMA2 and on the first side, in the second direction DR2, of the second emission area EMA2), and the fourth light-emitting elements ED4 may be disposed in a lower right part of the second emission area EMA2 (i.e., on the second side, in the first direction DR1, of the second emission area EMA2 and on the second side, in the second direction DR2, of the second emission area EMA2).

On the contrary, the third light-emitting elements ED3 may be disposed in a lower right part of the first or third emission area EMA1 or EMA3 (i.e., on a first side, in the first direction DR1, of the first or third emission area EMA1 or EMA3 and on a second side, in the second direction DR2, of the first or third emission area EMA1 or EMA3), the fourth light-emitting elements ED4 may be disposed in an upper right part of the second emission area EMA2 (i.e., on the first side, in the first direction DR1, of the first or third emission area EMA1 or EMA3 and on a first side, in the second direction DR2, of the first or third emission area EMA1 or EMA3), the first light-emitting elements ED1 may be disposed in an upper left part of the second emission area EMA2 (i.e., on a second side, in the first direction DR1, of the first or third emission area EMA1 or EMA3 and on the first side, in the second direction DR2, of the first or third emission area EMA1 or EMA3), and the second light-emitting elements ED2 may be disposed in a lower right part of the second emission area EMA2 (i.e., on the second side, in the first direction DR1, of the first or third emission area EMA1 or EMA3 and on the second side, in the second direction DR2, of the first or third emission area EMA1 or EMA3).

Referring to FIGS. 12 and 14, the second insulating layer PAS2 may be disposed on the light-emitting elements ED, the first insulating layer PAS1, and the outer bank BNL. The second insulating layer PAS2 may include pattern parts, which extend in the first direction DR1 between the inner banks (BP1 and BP2) and are disposed on the light-emitting elements ED. The pattern parts may be disposed to surround parts of the outer surfaces of each of the light-emitting elements ED, but may not cover both sides or both ends of each of the light-emitting elements ED. The pattern parts may form linear or island patterns in each emission area, in a plan view.

The pattern parts of the second insulating layer PAS2 may protect and fix the light-emitting elements ED during the fabrication of the display device 10. Also, the second insulating layer PAS2 may be disposed to fill the space between the first insulating layer PAS1 and the light-emitting elements ED.

The first contact electrode layer CNEL1 of the contact electrode layer CNE may be disposed on the second insulating layer PAS2. The first contact electrode layer CNEL1 may include power connectors CNP, which are disposed in subareas SA, and first, third, and fifth contact electrodes CNE1, CNE3, and CNE5, which are disposed in each of the first, second, and third emission areas EMA1, EMA2, and EMA3.

The power connectors CNP may include first and second power connectors CNP1 and CNP2, which are disposed on first and second sides, respectively, in the second direction DR2, of the outer bank BNL.

Referring to FIG. 15, the first power connector CNP1 may be electrically connected to the first connecting electrode CNE1 through a sixth contact hole CNT6, to the second connecting electrode CNE2 through a seventh contact hole CNT7, and to the third connecting electrode CNE3 through an eighth contact hole CNT8. Accordingly, the vertical voltage line VVSL and multiple line patterns VVSP may be electrically connected via the first power connector CNP1. The sixth, seventh, and eighth contact holes CNT6, CNT7, and CNT8 may penetrate the second insulating layer PAS2, the first insulating layer PAS1, and the via insulating layer VIA.

The second power connector CNP2 may electrically connect the vertical voltage line VVSL and the line patterns VVSP through ninth, tenth, and eleventh contact holes CNT9, CNT10, and CNT11. The second power connector CNP2, the vertical voltage line VVSL, and the line patterns VVSP may be connected to one another in substantially the same manner as described above with regard to the first power connector CNP1, and thus, a detailed description of the second power connector CNP2 will be omitted.

As the first and second power connectors CNP1 and CNP2 are formed after the alignment of the light-emitting elements ED, the line patterns VVSP may not affect the alignment of the light-emitting elements ED because the vertical voltage line VVSL and the line patterns VVSP are not connected to one another during the alignment of the light-emitting elements ED, even if the line patterns VVSP overlap some of the first, second, and third emission areas EMA1, EMA2, and EMA3.

The first contact electrode CNE1 of each of the first, second, and third emission areas EMA1, EMA2, and EMA3 may extend in the second direction DR2. The first contact electrode CNE1 of each of the first, second, and third emission areas EMA1, EMA2, and EMA3 may be in contact with the first end portions of the first light-emitting elements ED1 of a corresponding emission area.

The first contact electrode CNE1 of each of the first, second, and third emission areas EMA1, EMA2, and EMA3 may be electrically connected to a first voltage line VDL through fifty-fourth, fifth-fifth, and fifty-sixth contact holes CNT54, CNT55, and CNT56. The fifty-fourth, fifth-fifth, and fifty-sixth contact holes CNT54, CNT55, and CNT56 may penetrate the second insulating layer PAS2, the first insulating layer PAS1, and the via insulating layer VIA.

For example, the first contact electrode CNE1 of the first emission area EMA1 may be electrically connected to a seventeenth connecting electrode CE17 through the fifth-fourth contact hole CNT54, the seventeenth connecting electrode CE17 may be electrically connected to a first capacitor electrode CPE1 of the first subpixel SP1, and the first capacitor electrode CPE1 of the first subpixel SP1 may be electrically connected to the first voltage line VDL. Accordingly, the high-potential voltage may be applied to the first contact electrode CNE1 of the first emission area EMA1.

For example, the first contact electrode CNE1 of the second emission area EMA2 may be electrically connected to an eighteenth connecting electrode CE18 through the fifth-fifth contact hole CNT55, the eighteenth connecting electrode CE18 may be electrically connected to a first capacitor electrode CPE1 of the second subpixel SP2, and the first capacitor electrode CPE1 of the second subpixel SP2 may be electrically connected to the first voltage line VDL. Accordingly, the high-potential voltage may be applied to the first contact electrode CNE1 of the second emission area EMA2.

For example, the first contact electrode CNE1 of the third emission area EMA3 may be electrically connected to a nineteenth connecting electrode CE19 through the fifth-sixth contact hole CNT56, the nineteenth connecting electrode CE19 may be electrically connected to a first capacitor electrode CPE1 of the third subpixel SP3, and the first capacitor electrode CPE1 of the third subpixel SP3 may be electrically connected to the first voltage line VDL. Accordingly, the high-potential voltage may be applied to the first contact electrode CNE1 of the third emission area EMA3.

The fifth contact electrode CNE5 of each of the first, second, and third emission areas EMA1, EMA2, and EMA3 may extend in the second direction DR2. The fifth contact electrode CNE5 of each of the first, second, and third emission areas EMA1, EMA2, and EMA3 may be in contact with the second end portions of the fourth light-emitting elements ED4 of a corresponding emission area.

The fifth contact electrodes CNE5 of the first, second, and third emission areas EMA1, EMA2, and EMA3 may be integrally formed in areas that may not overlap the first, second, and third emission areas EMA1, EMA2, and EMA3. FIG. 12 illustrates that the fifth contact electrodes CNE5 of the first and second emission areas EMA1 and EMA2 are connected to each other on the outer bank BNL, between the first and second emission areas EMA1 and EMA2, and the fifth contact electrodes CNE5 of the first and third emission areas EMA1 and EMA3 are connected to each other on first sides, in the second direction DR2, of the second and third emission areas EMA2 and EMA3, but the disclosure is not limited thereto.

The fifth contact electrode CNE5 of each of the first, second, and third emission areas EMA1, EMA2, and EMA3 may be integrally formed with the first power connector CNP1, which is disposed on a first side, in the second direction DR2, of the outer bank BNL, and the second power connector CNP2, which is disposed on a second side, in the second direction DR2, of the outer bank BNL. The first power connector CNP1 may be connected to the second insulating layer PAS2 and to the vertical voltage line VVSL through a sixth contact hole CNT6, which penetrates the second insulating layer PAS2 and the via insulating layer VIA, and the second power connector CNP2 may be electrically connected to a protrusion of the second voltage line VSL through a ninth contact hole CNT9, which penetrates the second insulating layer PAS2, the first insulating layer PAS1, and the via insulating layer VIA. Accordingly, the low-potential voltage may be applied to the fifth contact electrode CNE5 of each of the first, second, and third emission areas EMA1, EMA2, and EMA3, the first and second power connectors CNP1 and CNP2 may be electrically connected, and the low-potential voltage may be applied to the second end portions of the fourth light-emitting elements ED4.

The third contact electrode CNE3 of each of the first, second, and third emission areas EMA1, EMA2, and EMA3 may be bent in a U or N shape. The third contact electrode CNE3 of each of the first, second, and third emission areas EMA1, EMA2, and EMA3 may electrically connect the second end portions of the second light-emitting elements ED2 of a corresponding emission area and the first end portions of the third light-emitting elements ED3 of the corresponding emission area.

The third insulating layer PAS3 may be disposed on the second insulating layer PAS2 and the first contact electrode layer CNEL1. The third insulating layer PAS3 may not cover the first end portions of the light-emitting elements ED. In other words, the third insulating layer PAS3 may not cover end portions of the light-emitting elements ED that are not in contact with the first contact electrode layer CNEL1.

The second contact electrode layer CNEL2 of the contact electrode layer CNE may be disposed on the third insulating layer PAS3. The second contact electrode layer CNEL2 may be electrically insulated from the first contact electrode layer CNEL1 by the third insulating layer PAS3. The second contact electrode layer CNEL2 may include second and fourth contact electrodes CNE2 and CNE4, which are disposed in each of the first, second, and third emission areas EMA1, EMA2, and EMA3.

The second contact electrode CNE2 of each of the first, second, and third emission areas EMA1, EMA2, and EMA3 may electrically connect the first end portions of the first light-emitting elements ED1 of a corresponding emission area and the first end portions of the second light-emitting elements ED2 of the corresponding emission area and may electrically connect the second end portions of the third light-emitting elements ED3 of the corresponding emission area and the first end portions of the fourth light-emitting elements ED4 of the corresponding emission area. Accordingly, the first light-emitting elements ED1, the second light-emitting elements ED2, the third light-emitting elements ED3, and the fourth light-emitting elements ED4 of each of the first, second, and third emission areas EMA1, EMA2, and EMA3 may be connected in series.

The contact electrode layer CNE may include a conductive material. For example, the contact electrode layer CNE may include ITO, IZO, indium tin zinc oxide (ITZO), and/or Al. For example, the contact electrode layer CNE may include a transparent conductive material, and light emitted by the light-emitting elements ED may be output through the contact electrode layer CNE.

The fourth insulating layer PAS4 may be disposed on the second contact electrode layer CNEL2 and the third insulating layer PAS3. The fourth insulating layer PAS4 may protect the above-mentioned elements of the display device 10.

The first, second, third, and fourth insulating layers PAS1, PAS2, PAS3, and PAS4 may include an inorganic insulating material or an organic insulating material. For example, the first, second, third, and fourth insulating layers PAS1, PAS2, PAS3, and PAS4 may include at least one of $SiO_x$, $SiN_x$, and $SiO_xN_y$. The first, second, third, and fourth insulating layers PAS1, PAS2, PAS3, and PAS4 may all include the same material, only some of the first, second, third, and fourth insulating layers PAS1, PAS2, PAS3, and PAS4 may include the same material, or the first, second, third, and fourth insulating layers PAS1, PAS2, PAS3, and PAS4 may all include different materials.

A method of fabricating the display device 10 will hereinafter be described.

FIGS. 16 through 28 schematically illustrate a method of fabricating a display device according to an embodiment of the disclosure.

Figure 16:
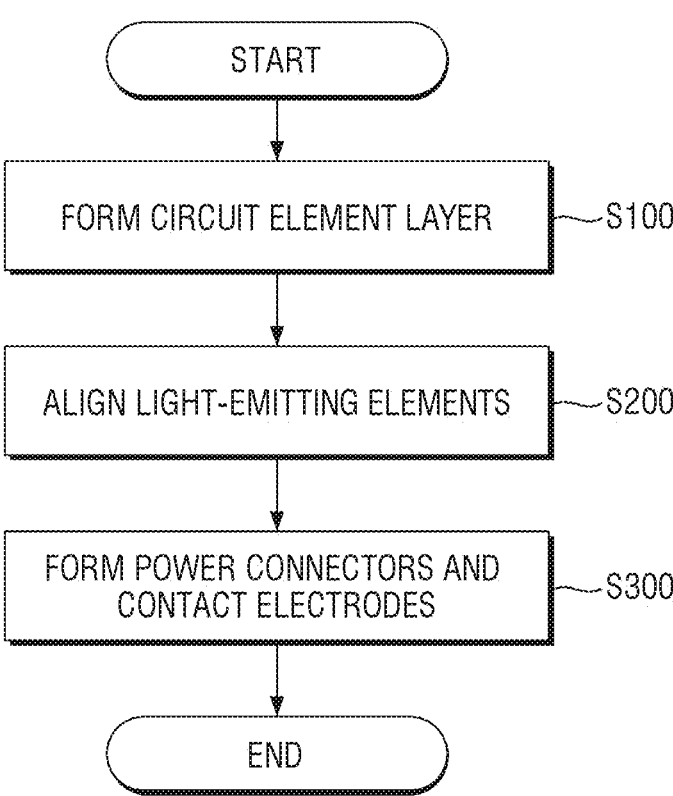
FIGS. 16 through 28 schematically illustrate a method of fabricating a display device according to an embodiment of the disclosure.

Referring to FIG. 16, the method may include forming a circuit element layer CCL (S100), aligning light-emitting elements ED (S200), and forming a power connector CNP and contact electrodes (CNE1, CNE2, CNE3, CNE4, and CNE5) (S300).

Figure 17:
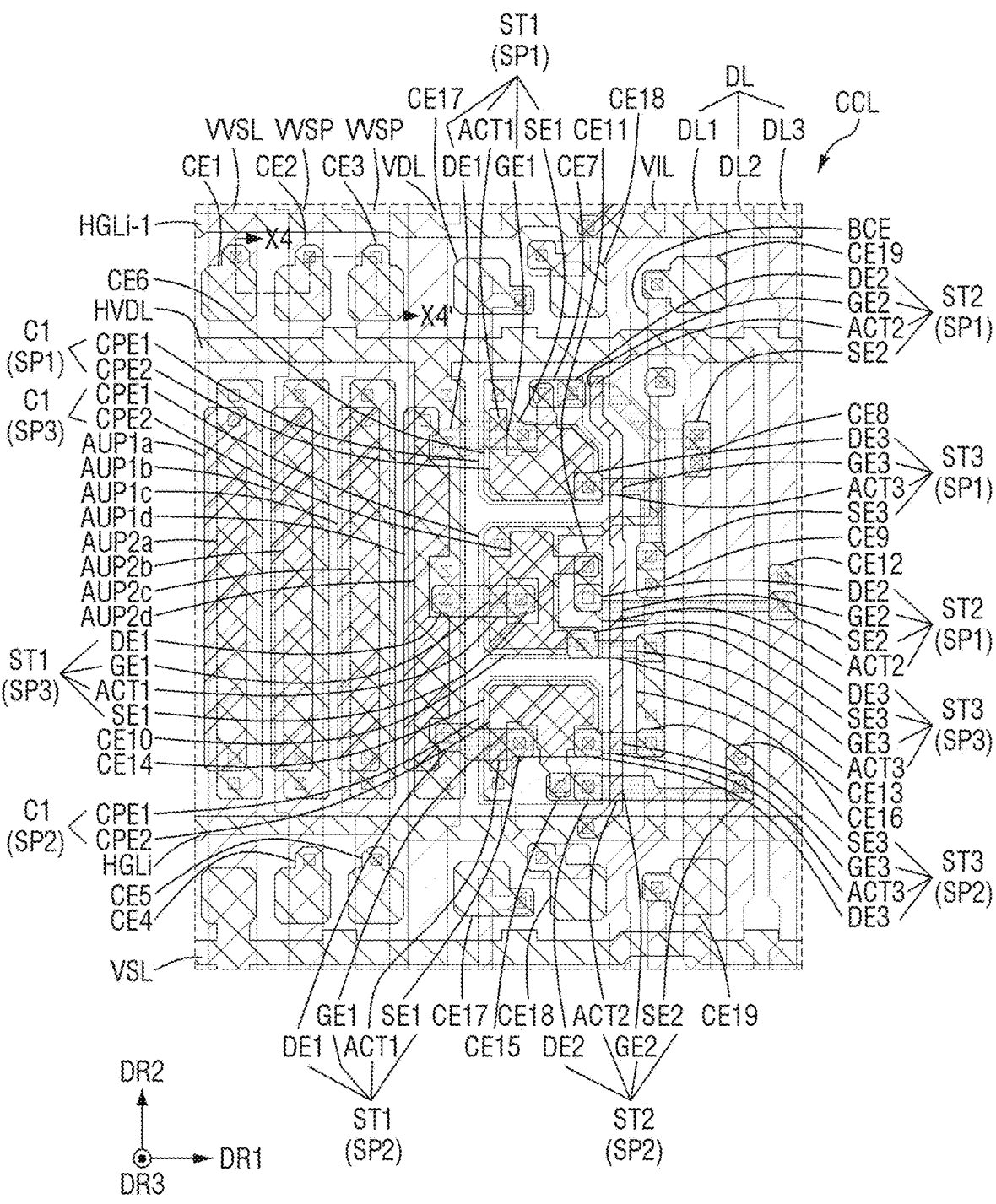
Figure 18:
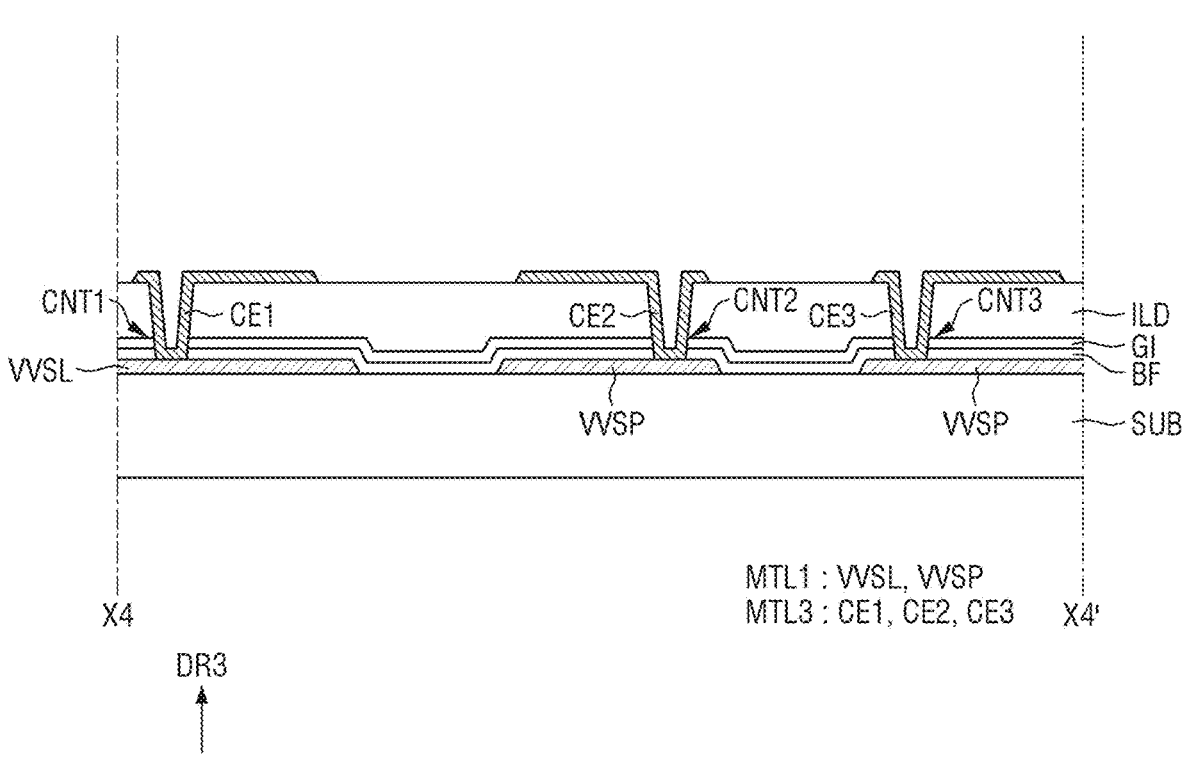

FIGS. 17 and 18 are for explaining S100, FIGS. 19 through 24 are for explaining S200, and FIGS. 25 through 28 are for explaining S300.

Referring to FIGS. 17 and 18, the circuit element layer CCL may be formed on a substrate SUB. The circuit element layer CCL may be formed by sequentially stacking a first metal layer MTL1, a buffer layer BF, a semiconductor layer ACTL, a gate insulating layer GI, a second metal layer MTL2, an interlayer insulating layer ILD, and a third metal layer MTL3. A method to form the circuit element layer CCL may be performed, and thus, a detailed description thereof will be omitted.

Figure 19:
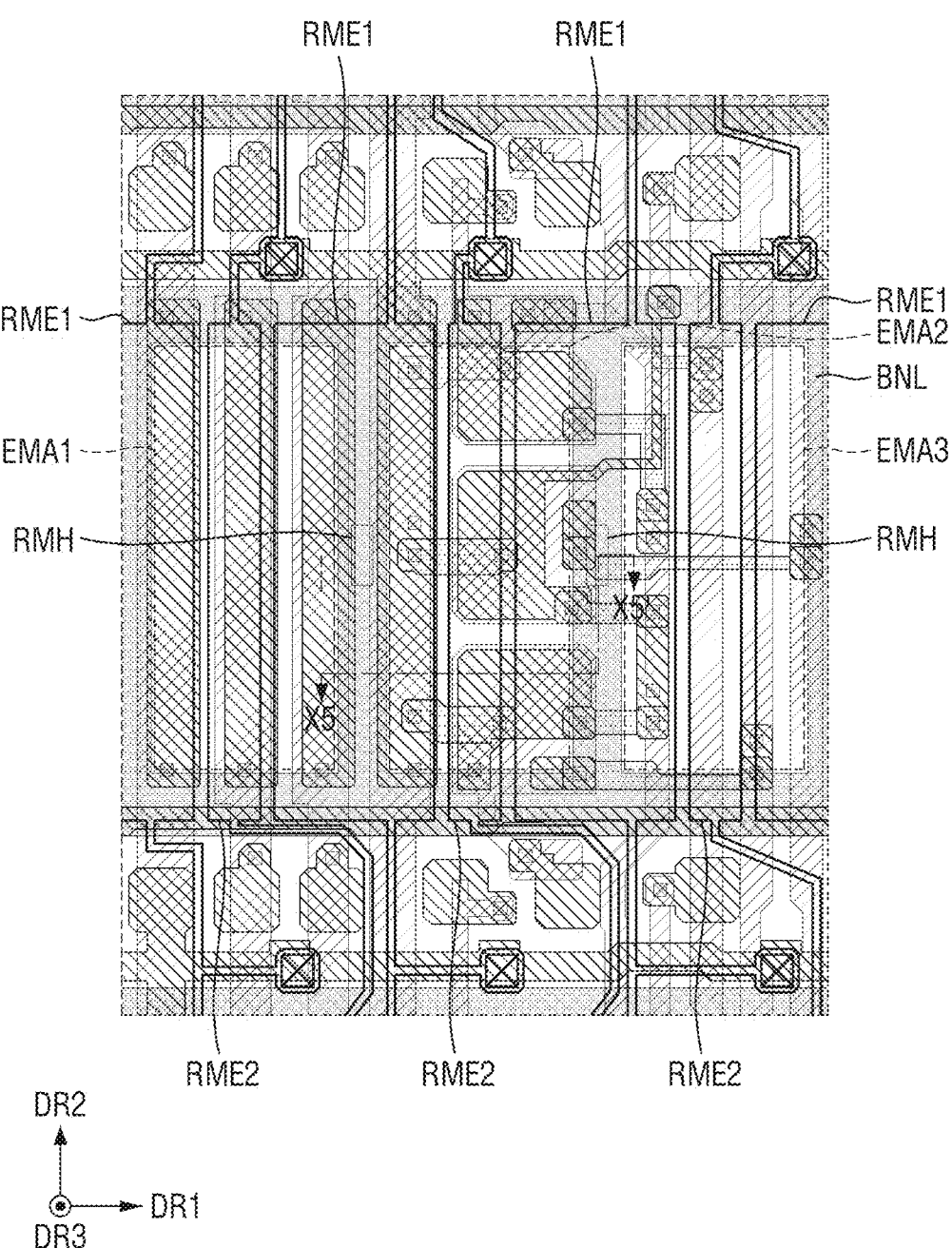
Figure 20:
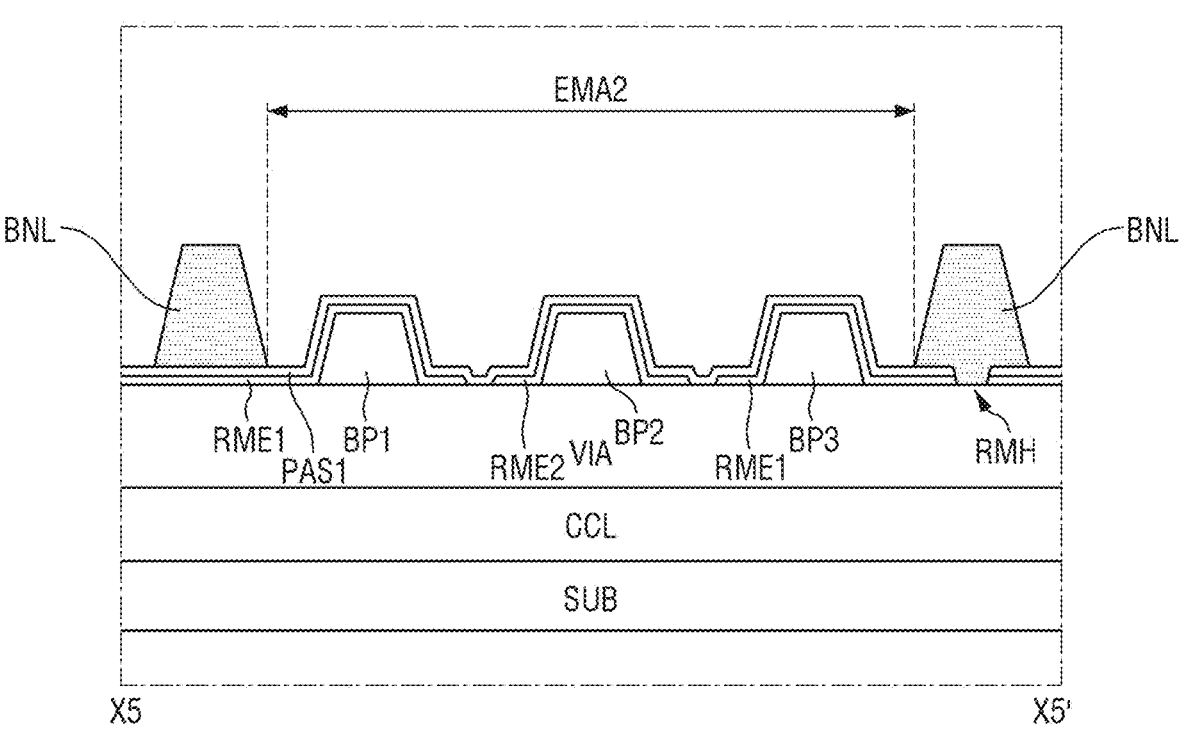
Figure 20:
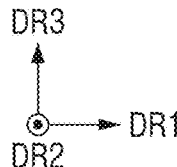

Thereafter, referring to FIGS. 19 and 20, the first, second, and third emission areas EMA1, EMA2, and EMA3 where light-emitting elements ED are to be disposed may be formed on the circuit element layer CCL. The first, second, and third emission areas EMA1, EMA2, and EMA3 may be formed by sequentially forming a via insulating layer VIA, inner banks BP, an alignment electrode layer RME, a first insulating layer PAS1, and an outer bank BNL on the circuit element layer CCL. A method to form the first, second, and third emission areas EMA1, EMA2, and EMA3 may be performed, and thus, a detailed description thereof will be omitted.

Thereafter, at least some of the first, second, and third emission areas EMA1, EMA2, and EMA3 may overlap line patterns VVSP of the circuit element layer CCL in a third direction DR3. In some embodiments, the line patterns VVSP of the circuit element layer CCL may overlap the first emission area EMA1 in the third direction DR3, but the disclosure is not limited thereto. FIG. 19 illustrates that the line patterns VVSP of the circuit element layer CCL may overlap the first emission area EMA1 in the third direction DR3.

Thereafter, referring to FIGS. 21 through 24, light-emitting elements ED may be aligned in each of the first, second, and third emission areas EMA1, EMA2, and EMA3. The light-emitting elements ED may be aligned using a dielectrophoretic force from an electric field generated by alignment signals having different electric potential levels.

Figure 21:
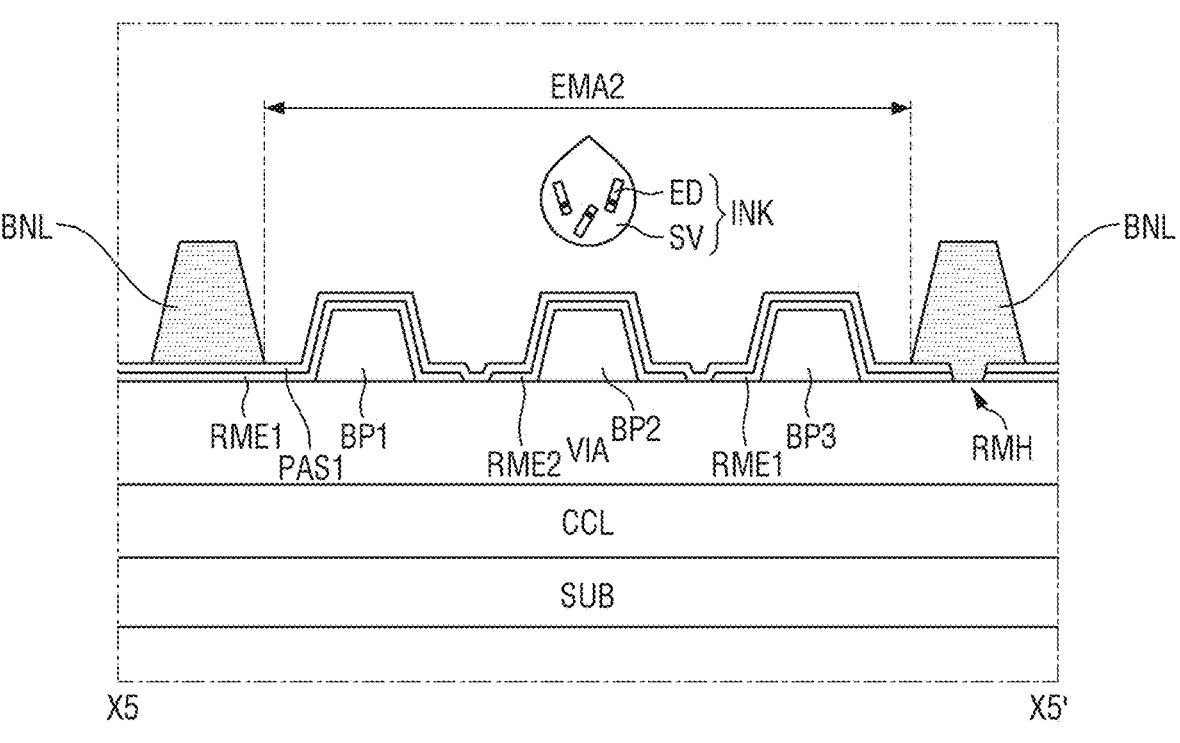
Figure 21:
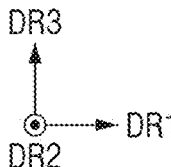
Figure 22:
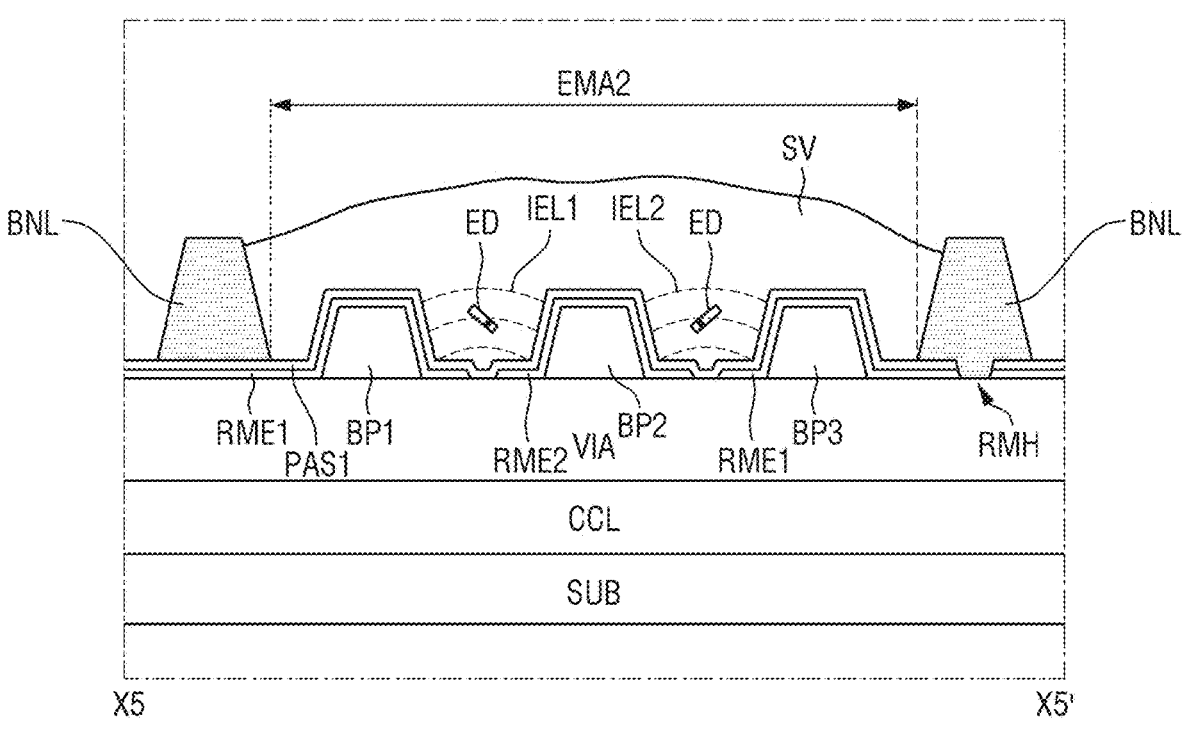
Figure 22:
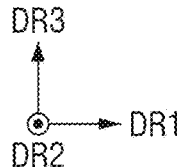
Figure 23:
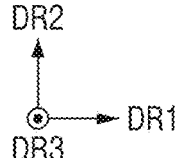
Figure 24:
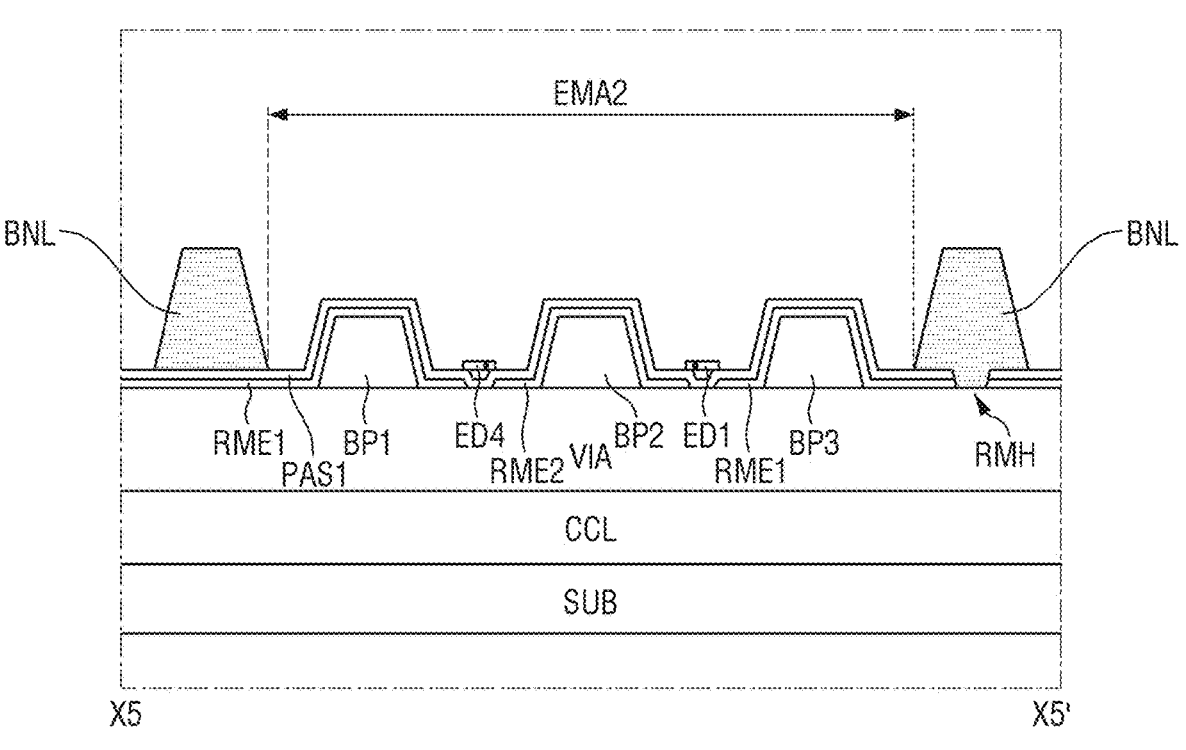
Figure 24:
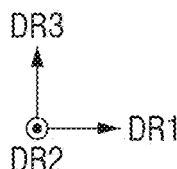
Figure 25:
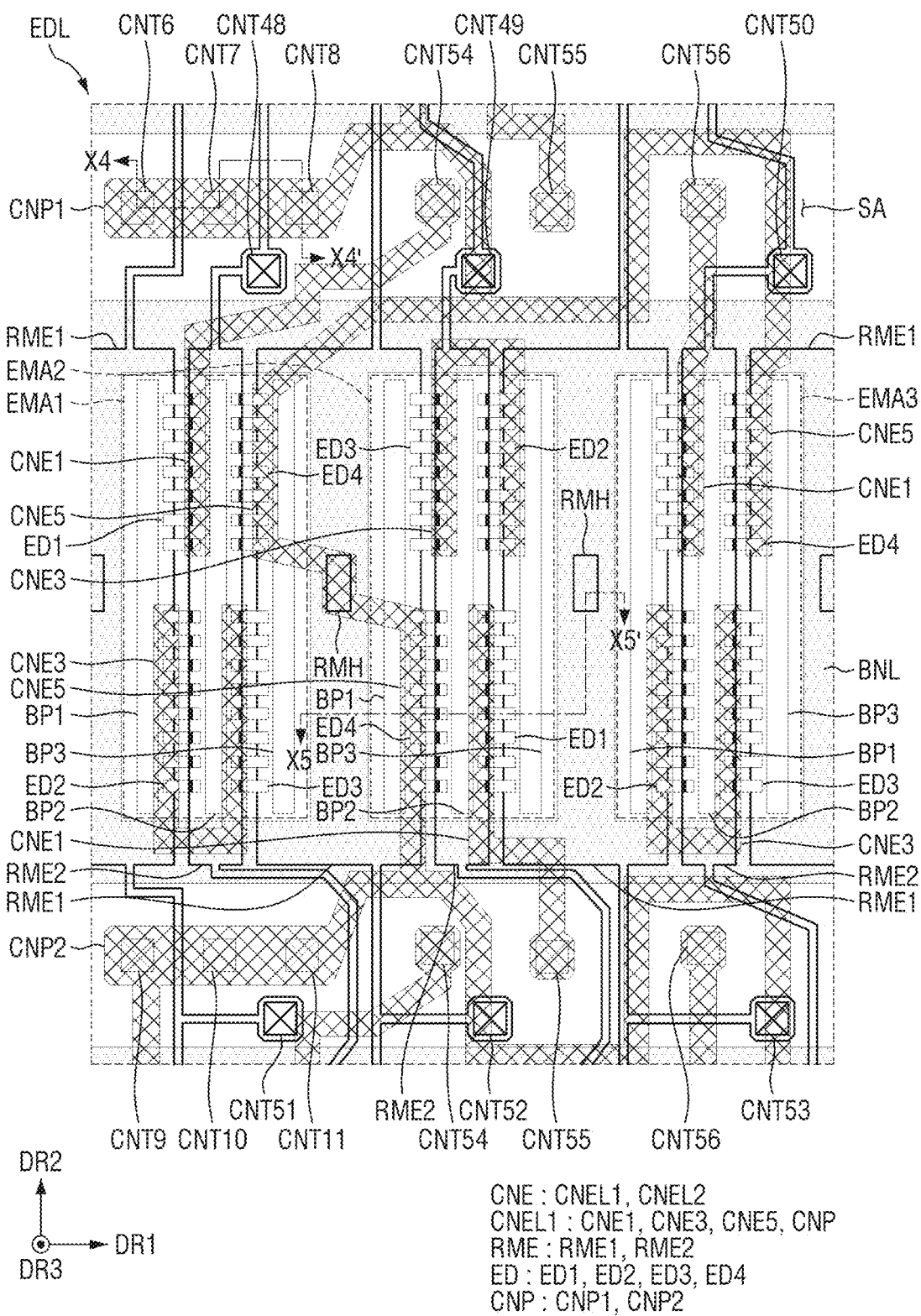
Figure 26:
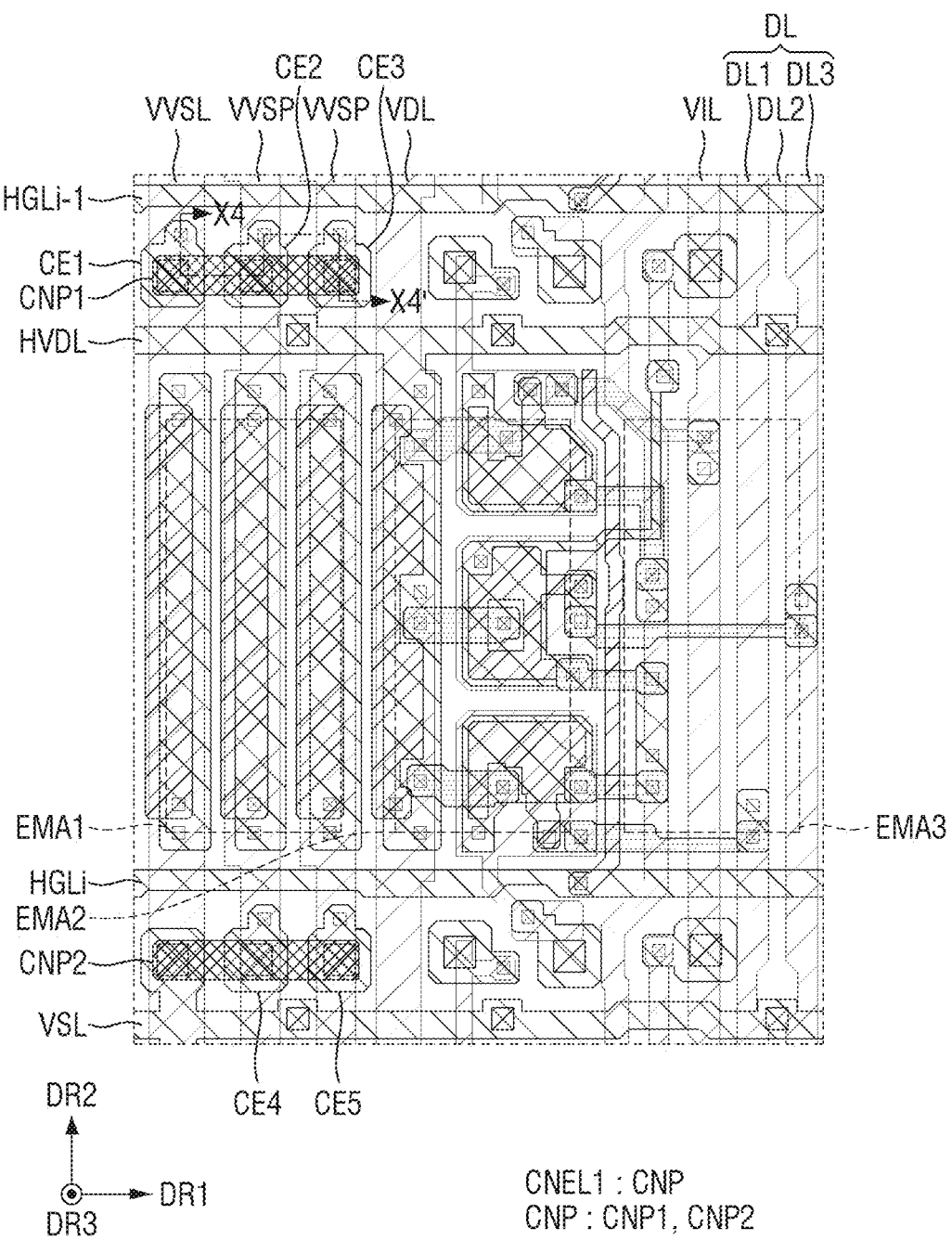
Figure 27:
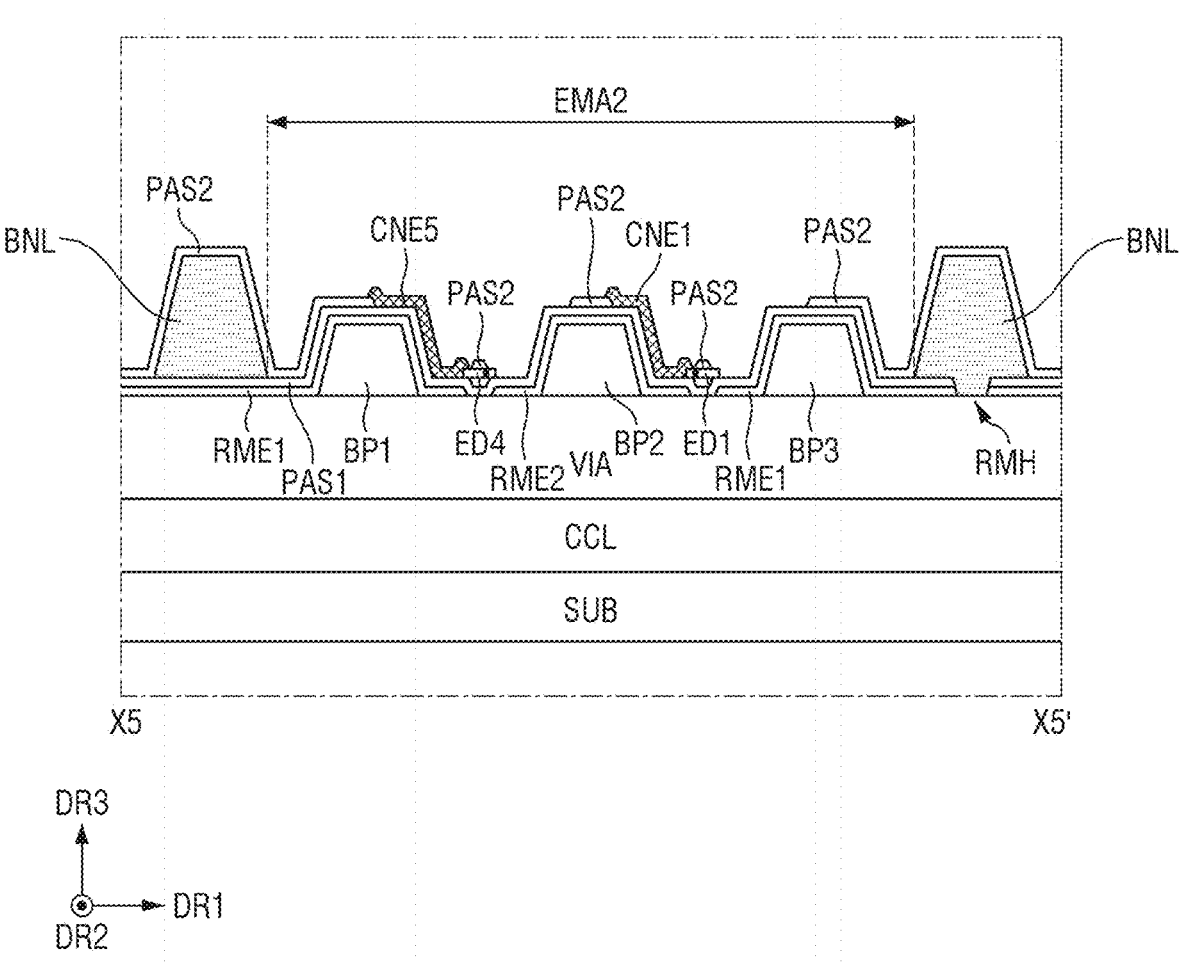

Specifically, the alignment of the light-emitting elements ED may include ejecting ink INK including a solvent SV having the light-emitting elements ED dispersed therein into the first, second, and third emission areas EMA1, EMA2, and EMA3, as illustrated in FIG. 21, forming first and second electric fields IEL1 and IEL2, as illustrated in FIGS. 22 through 24, by applying alignment signals having different electric potential values to first alignment electrodes RME1 and a second alignment electrode RME2, and aligning the light-emitting elements ED by using dielectrophoretic forces from the first and second electric fields IEL1 and IEL2.

The alignment signals may include a first alignment signal having substantially the same electric potential level as the above-mentioned high-potential voltage, and a second alignment signal having the same electric potential level as the above-mentioned low-potential voltage.

The type of electric field may vary depending on from where each of the alignment signals is applied. For example, the first electric field IEL1 may be an electric field generated in case that the first alignment signal is applied in the first direction DR1 and the second alignment signal is applied in the opposite direction of the first direction DR1, and the second electric field IEL2 may be an electric field generated in case that the second alignment signal is applied in the first direction DR1 and the first alignment signal is applied to the opposite direction of the first direction DR1.

The orientation of the light-emitting elements ED may vary depending on the type of electric field. For example, in case that in the first electric field IEL1, the light-emitting elements ED may be oriented such that the first end portions of the light-emitting elements ED may face the first direction DR1, and in case that in the second electric field IEL2, the light-emitting elements ED may be oriented such that the second end portions of the light-emitting elements ED may face the opposite direction of the first direction DR1.

Accordingly, as illustrated in FIG. 22, the second alignment signal may be applied to the first alignment electrode RME1 on a first inner bank BP1, and the first alignment signal may be applied to the first alignment electrode RME1 on a third inner bank BP3. The first electric field IEL1 may be generated between the first alignment electrode RME1 on the first inner bank BP1 and the second alignment electrode RME2 on a second inner bank BP2, and the second electric field IEL2 may be generated between the first alignment electrode RME1 on the third inner bank BP3 and the second alignment electrode RME2 on the second inner bank BP2.

If the first and second electric fields IEL1 and IEL2 are generated at undesignated locations, the orientation of the light-emitting elements ED may change so that the light-emitting elements ED may not be able to be properly in contact with first and second contact electrodes CNE1 and CNE2 and may fail to emit light. Thus, the first and second electric fields IEL1 and IEL2 may need to be generated at designated locations to properly align the light-emitting elements ED.

However, as already mentioned above, the line patterns VVSP overlap at least some of the first, second, and third emission areas EMA1, EMA2, and EMA3 where the light-emitting elements ED are to be aligned. Thus, if the line patterns VVSP are electrically connected to a vertical voltage line VVSL or a second voltage line VSL in case that the first and second electric fields IEL1 and IEL2 are generated to align the light-emitting elements ED, the low-potential voltage applied to the line patterns VVSP may interfere with the generation of the first and second electric fields IEL1 and IEL2 at designated locations.

Therefore, the line patterns VVSP may need to be electrically insulated from the vertical voltage line VVSL or the second voltage line VSL during the formation of the first and second electric fields IEL1 and IEL2 for aligning the light-emitting elements ED and may need to be electrically connected to the vertical voltage line VVSL or the second voltage line VSL after the alignment of the light-emitting elements ED.

Figure 28:
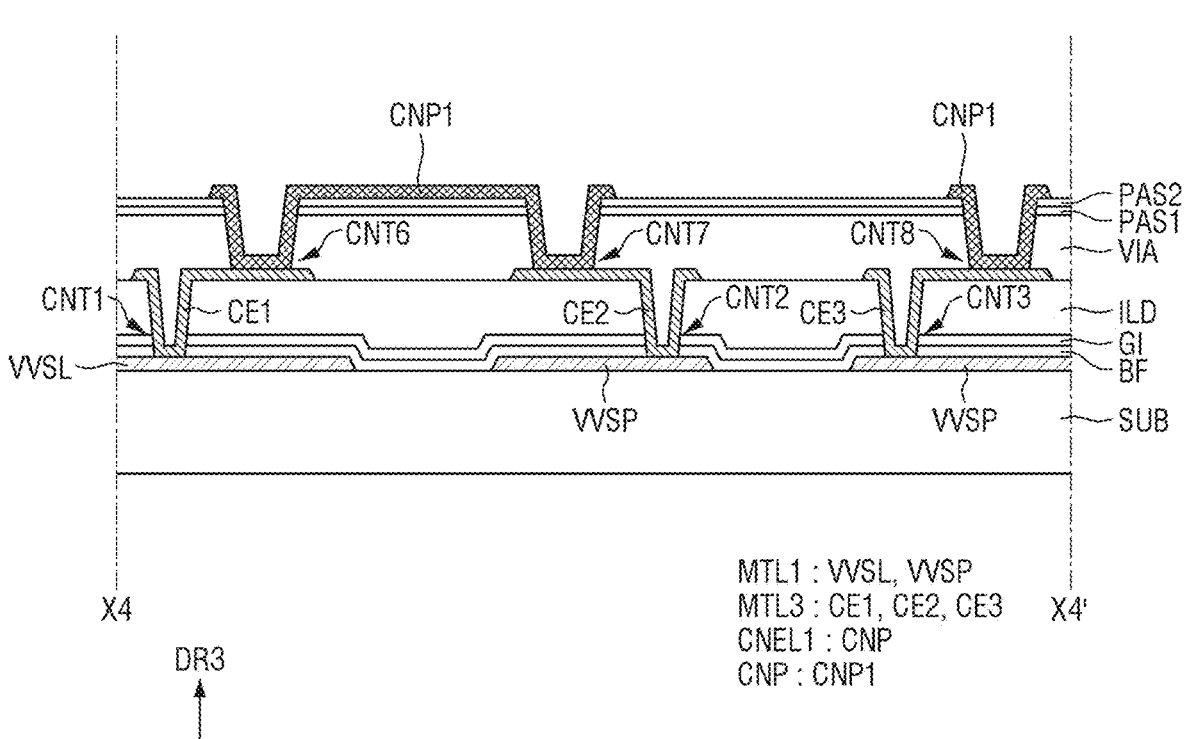

Thereafter, referring to FIGS. 25 through 28, a first contact electrode layer CNEL1, which is in contact with the first end portions of the light-emitting elements ED, may be formed after the alignment of the light-emitting elements ED. The first contact electrode layer CNEL1 may include first contact electrodes CNE1, which are in contact with the first end portions of first light-emitting elements ED1, a fifth contact electrode CNE5, which is in contact with the second end portions of fourth light-emitting elements ED4, third contact electrodes CNE3, which electrically connect the second end portions of second light-emitting elements ED2 and the first end portions of third light-emitting elements ED3, and a power connector CNP, which connects the vertical voltage line VVSL and the line patterns VVSP. FIG. 28 illustrates a first power connector CNP1.

As the first contact electrode layer CNEL1 may be formed after the alignment of the light-emitting elements ED, the degree of alignment of the light-emitting elements ED can be improved by electrically connecting the vertical voltage line VVSL and the line patterns VVSP via the power connector CNP. Also, RC delays in the second voltage line VSL can be reduced, and driving margins can be secured. Therefore, the power consumption and heat dissipation of the display device 10 can be improved.

Display devices according to other embodiments of the disclosure will hereinafter be described, focusing on the differences with the display device 10. Like reference numerals indicate like elements through the disclosure, and thus, detailed descriptions thereof will be omitted.

Figure 29:
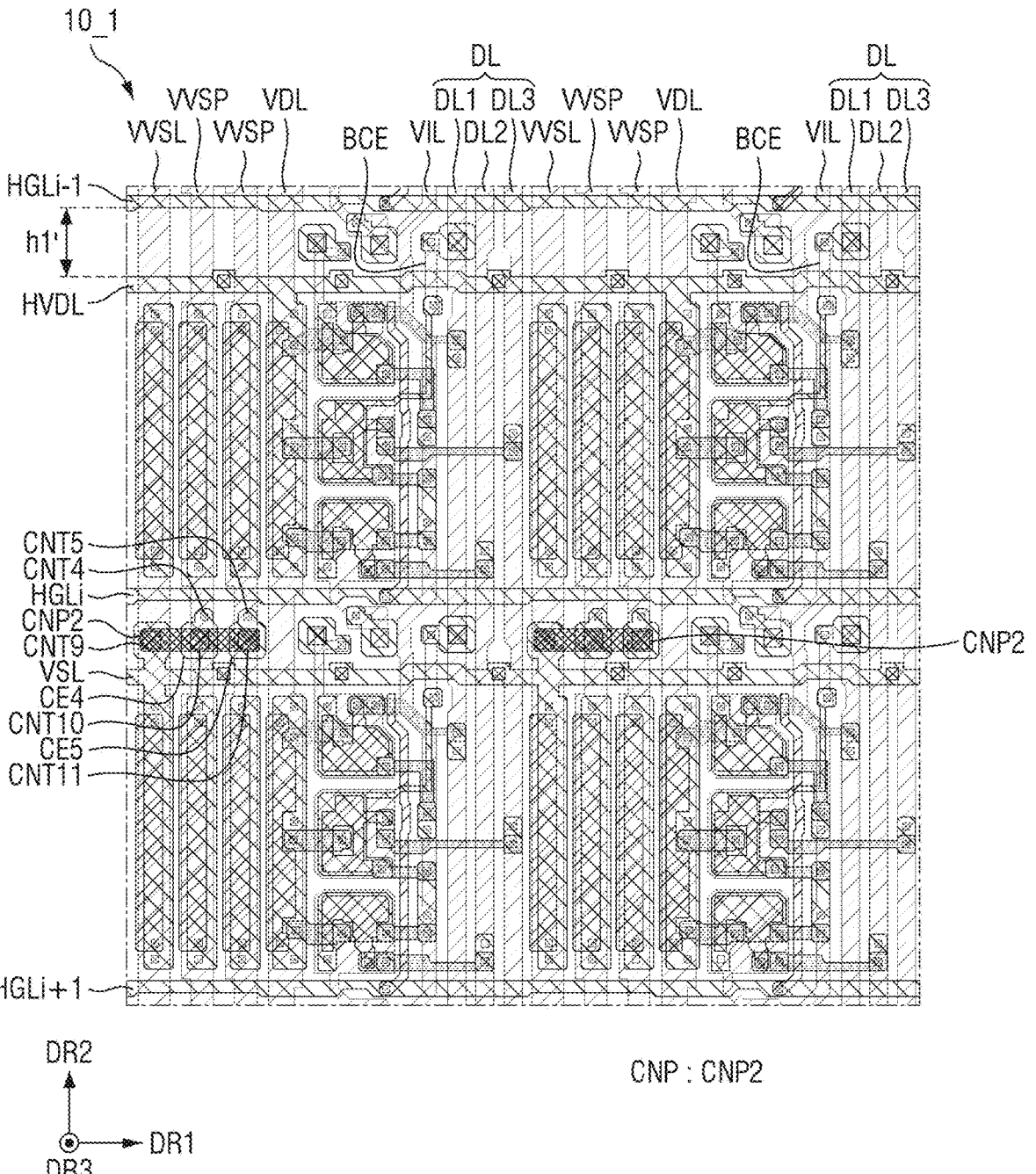
FIG. 29 is a schematic plan view illustrating a circuit element layer that forms pixels in a remainder area or a dummy area of a display device according to another embodiment of the disclosure and power connectors of the display device according to another embodiment of the disclosure.

FIG. 29 is a schematic plan view illustrating a circuit element layer that forms pixels in a remainder area or a dummy area of a display device according to another embodiment of the disclosure and power connectors of the display device according to another embodiment of the disclosure.

Referring to FIG. 29, first power connectors CNP1 may not be provided in a display device 10_1. For example, in the display device 10_1, power connectors CNP may be disposed between a second voltage line VSL and an i-th horizontal gate line HGLi, but not between a horizontal voltage line HVDL and an (i−1)-th horizontal gate lines HGLi−1.

Accordingly, as already mentioned above with reference to FIG. 8, as first contact holes CNT1, second contact holes CNT2, and third contact holes CNT3 are not disposed between the horizontal voltage line HVDL and the (i−1)-th horizontal gate line HGLi−1, a distance h1' between the horizontal voltage line HVDL and the (i−1)-th horizontal gate line HGLi−1 can be reduced, and as a result, the area occupied by pixels SP can be reduced.

Figure 30:
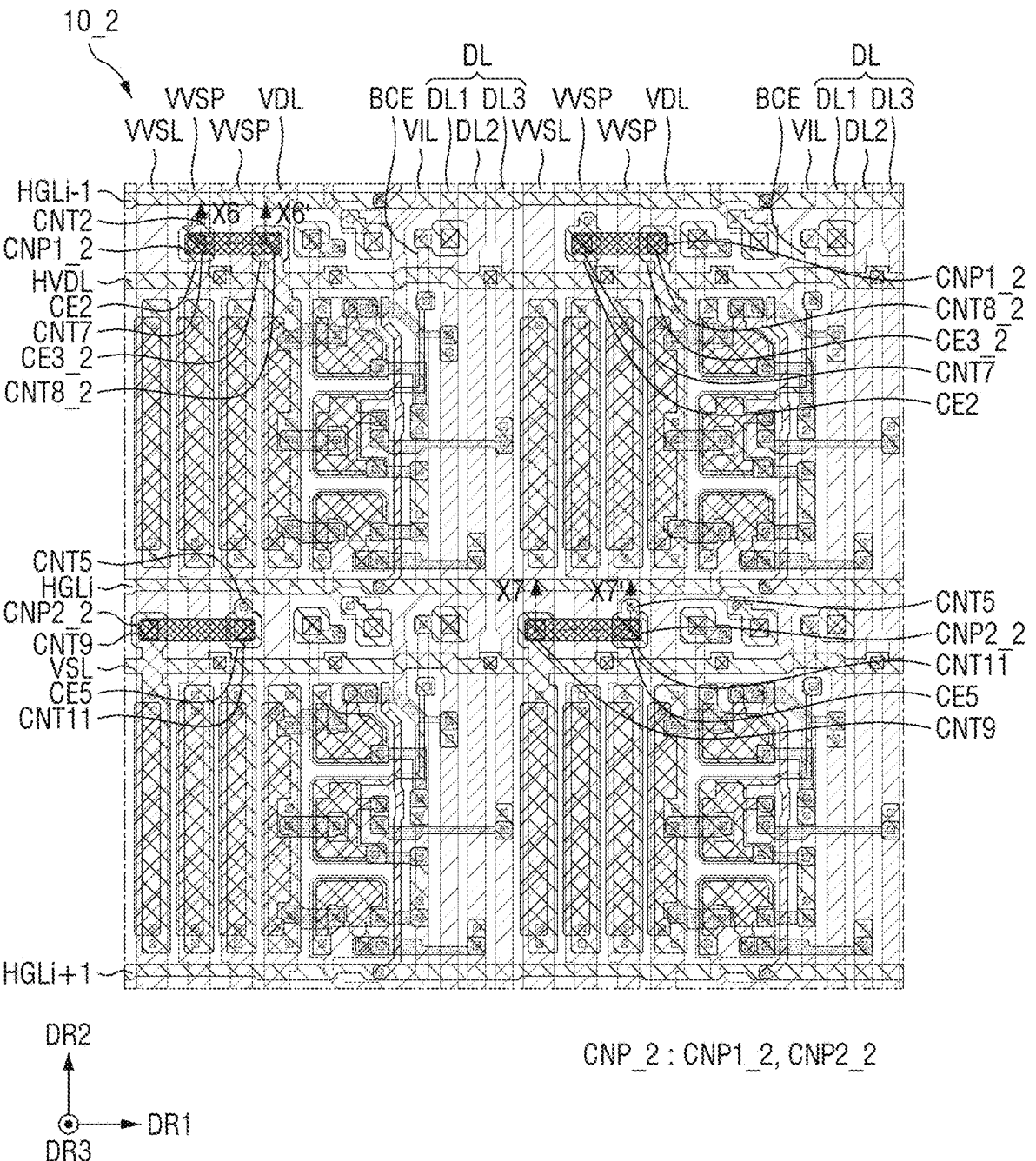
FIG. 30 is a schematic plan view illustrating a circuit element layer that forms pixels in a remainder area or a dummy area of a display device according to another embodiment of the disclosure and power connectors of the display device according to another embodiment of the disclosure.
Figure 31:
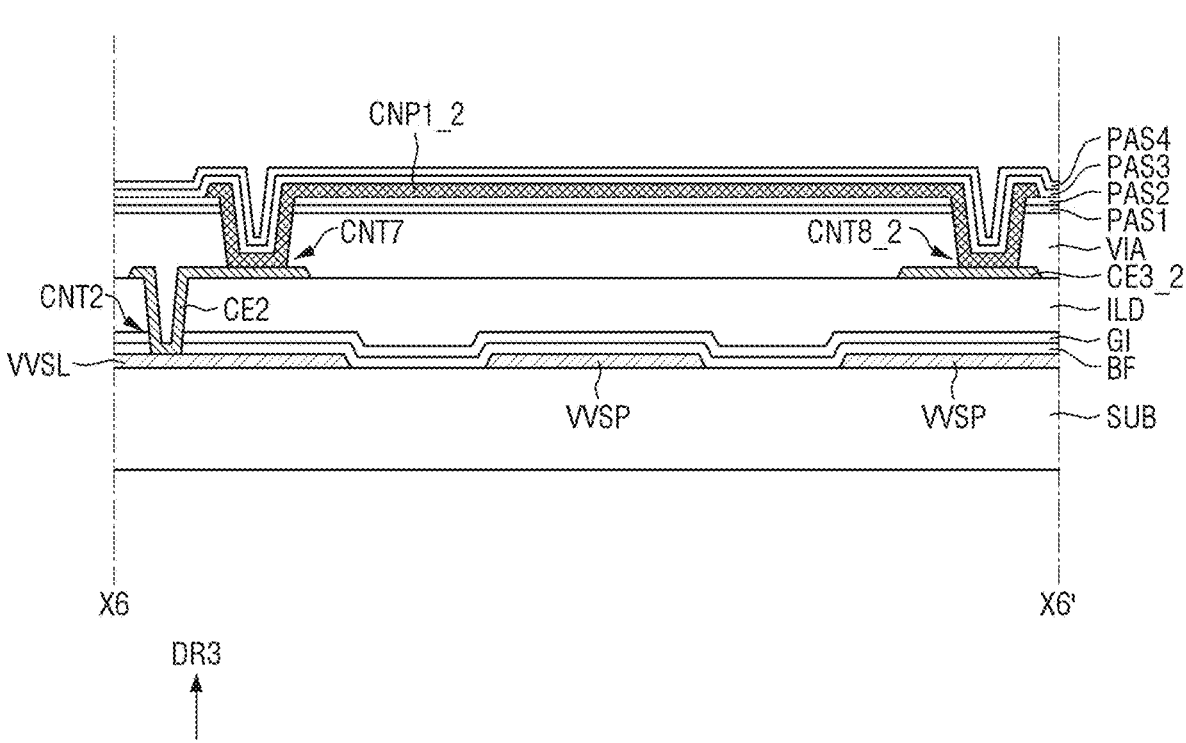
FIG. 31 is a schematic cross-sectional view taken along line X6-X6' of FIG. 30.
Figure 32:
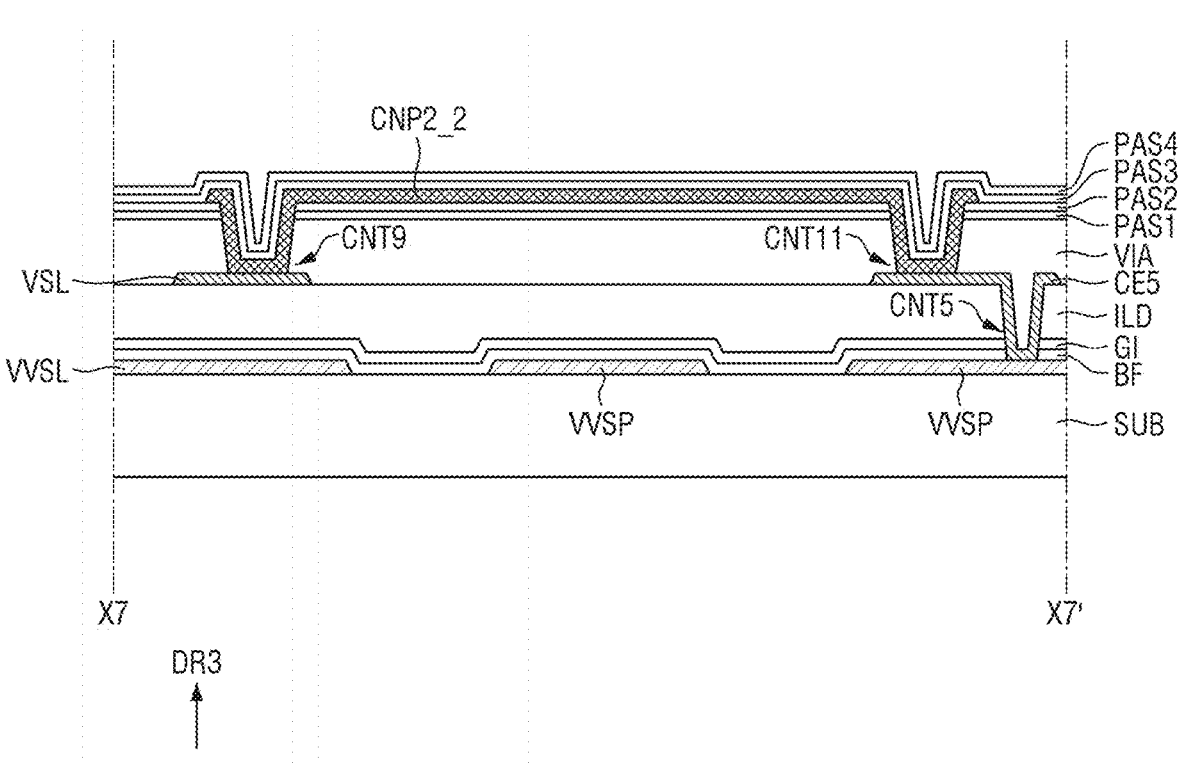
FIG. 32 is a schematic cross-sectional view taken along line X7-X7' of FIG. 30.

FIG. 30 is a schematic plan view illustrating a circuit element layer that forms pixels in a remainder area or a dummy area of a display device according to another embodiment of the disclosure and power connectors of the display device according to another embodiment of the disclosure. FIG. 31 is a schematic cross-sectional view taken along line X6-X6' of FIG. 30. FIG. 32 is a schematic cross-sectional view taken along line X7-X7' of FIG. 30.

Referring to FIGS. 30 through 32, power connectors CNP_2 of a display device 10_2 may selectively connect line patterns VVSP to vertical voltage lines VVSL or first voltage lines VDL.

The power connectors CNP_2 may include first power connectors CNP1_2, which connect the line patterns VVSP and the first voltage lines VDL, and second power connectors CNP2_2, which connect the line patterns VVSP to the vertical voltage lines VVSL. In some embodiments, the first power connectors CNP1_2 may be disposed between an (i–1)-th horizontal gate line HGLi–1 and a horizontal voltage line HVDL and may electrically connect line patterns VVSP near the vertical voltage lines VVSL to the first voltage lines VDL, and the second power connectors CNP2_2 may be disposed between an i-th horizontal gate line HGLi and a second voltage line VSL and may connect line patterns VVSP near the first voltage lines VDL to the vertical voltage lines VVSL. However, the disclosure is not limited to this.

As illustrated in FIG. 31, the first power connectors CNP1_2 may be electrically connected to second connecting electrodes CE2, which are electrically connected to the line patterns VVSP through second contact holes CNT2, through seventh contact holes CNT7. The horizontal voltage line HVDL may include protrusions CE3_2, which protrude in a second direction DR2 at the intersections between the horizontal voltage line HVDL and the first voltage lines VDL, and the protrusions CE3_2 of the horizontal voltage line HVDL may be electrically connected to the first power connectors CNP1_2 through (8_2)-th contact holes CNT8_2, which penetrate a second insulating layer PAS2, a first insulating layer PAS1, and a via insulating layer VIA. The third connecting electrodes CE3 of the display device 10 may not be provided in the display device 10_2. Accordingly, the first power connectors CNP1_2 may be electrically insulated from the line patterns VVSP near the first voltage lines VDL.

As the first power connectors CNP1_2 electrically connect the line patterns VVSP near the vertical voltage lines VVSL to the first voltage lines VDL, a high-potential voltage can be applied to the line patterns VVSP near the vertical voltage lines VVSL, RC delays in the first voltage lines VDL can be reduced, and driving margins can be secured.

As illustrated in FIG. 32, the second power connectors CNP1_2 may be electrically connected to protrusions of a second voltage line VSL through ninth contact holes CNT9 and to fifth connecting electrodes CE5 through eleventh contact holes CNT11. As a result, the second power connectors CNP1_2 may electrically connect the line patterns near the first voltage lines VDL to the vertical voltage lines VVSL. The fourth connecting electrodes CE4 of the display device 10 may not be provided in the display device 10_2. Accordingly, the second power connectors CNP2_2 may be electrically insulated from the line patterns VVSP near the vertical voltage lines VVSL.

As the power connectors CNP_2 of the display device 10_2 can selectively connect the line patterns VVSP to the vertical voltage lines VVSL or the first voltage lines VDL, not only RC delays in the second voltage line VSL, but also RC delays in the first voltage lines VDL can be reduced, and driving margins can be secured.

Figure 33:
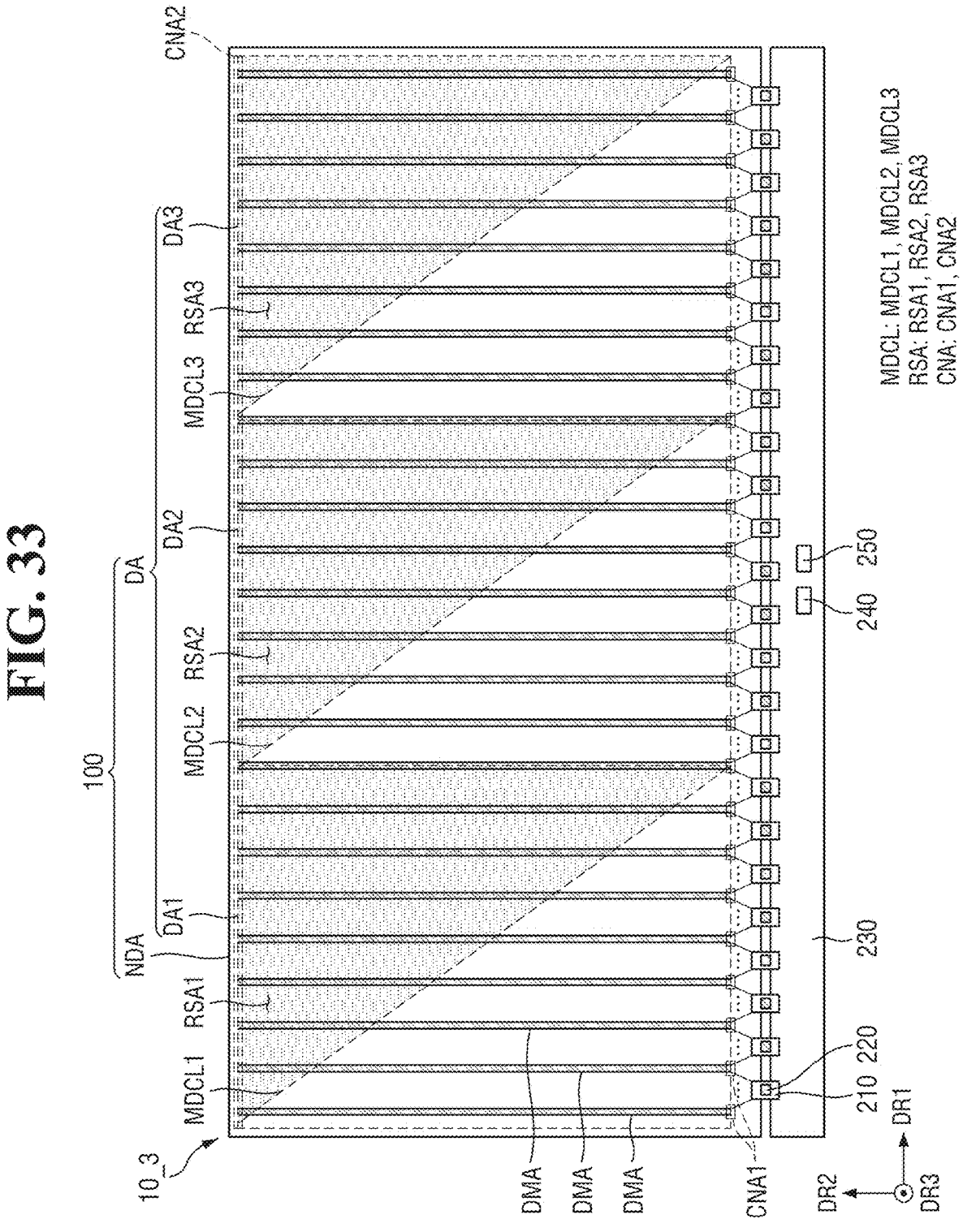
FIG. 33 is a schematic plan view illustrating connecting areas of a display device according to another embodiment of the disclosure where power connectors are disposed.

FIG. 33 is a schematic plan view illustrating connecting areas of a display device according to another embodiment of the disclosure where power connectors are disposed.

Referring to FIG. 33, power connectors CNP of a display device 10_3 may be disposed only along boundaries of a display area DA.

As already mentioned above, the power connectors CNP may be disposed only in remainder areas RSA or dummy areas DMA, but not in the rest of the display area DA.

In the display device 10_3, the power connectors CNP may be disposed only in parts of the remainder areas RSA or the dummy areas DMA adjacent to a non-display area NDA. For example, the power connectors CNP may be disposed only in first connecting areas CNA1, which are parts of the dummy areas DMA at a second-side end, in a second direction DR2, of the display area DA, and in second connecting areas CNA2, which are parts of the remainder areas DMA at a first-side end, in a second direction DR2, of the display area DA.

Therefore, the layout of the power connectors CNP in the display device 10_3 can be minimized, and the area occupied by pixels SP can be reduced.

In concluding the detailed description, those skilled in the art will appreciate that many variations and modifications can be made to the embodiments without substantially departing from the principles of the disclosure. Therefore, the disclosed embodiments are used in a generic and descriptive sense only and not for purposes of limitation.

What is claimed is:

1. A display device comprising:
a light-emitting element layer disposed on a substrate; and
a circuit element layer disposed between the substrate and the light-emitting element layer, wherein
the circuit element layer includes:
a first metal layer including data lines, a first voltage line, and first metal patterns, which are all disposed in a same layer and extend in a first direction and are spaced apart from one another in a second direction intersecting the first direction; and
an upper gate line, which is disposed on the first metal layer and extends in the second direction, and
the light-emitting element layer includes:
first alignment electrodes and a second alignment electrode, which are disposed in a same layer and are spaced apart from one another;
light-emitting elements, which are disposed in gaps between the first alignment electrodes and the second alignment electrode;
a first contact electrode, which is disposed on the light-emitting elements and is in contact with first end portions of the light-emitting elements; and
a first power connector, which is disposed in a same layer as the first contact electrode and electrically connects the first voltage line and the first metal patterns.

2. The display device of claim 1, further comprising:
an interlayer insulating layer disposed between the first metal layer and the upper gate line, wherein
the first metal layer further includes a lower gate line, which extends in the first direction,
the upper gate line is electrically connected to the lower gate line through a contact penetrating the interlayer insulating layer, and
the lower gate line and the first metal patterns are spaced apart from one another in the first direction and are electrically insulated from one another.

3. The display device of claim 2, wherein gaps between the lower gate line and the first metal patterns are disposed between the first metal patterns and the contact.

4. The display device of claim 3, wherein the lower gate line and the first voltage line are electrically insulated from each other.

5. The display device of claim 2, further comprising:
a via insulating layer disposed between the light-emitting element layer and the circuit element layer;
a first connecting electrode disposed in a same layer as the upper gate line and electrically connected to the first voltage line through a first contact hole penetrating the interlayer insulating layer; and
a second connecting electrode disposed in the same layer as the upper gate line and electrically connected to the first metal patterns through a second contact hole penetrating the interlayer insulating layer, wherein the first power connector is in direct contact with the first connecting electrode through a third contact hole penetrating the via insulating layer and is in direct contact with the second connecting electrode through a fourth contact hole penetrating the via insulating layer.

6. The display device of claim 5, wherein the first alignment electrodes and the second alignment electrode are disposed on the via insulating layer, the display device further comprises a first insulating layer disposed on the first alignment electrodes and the second alignment electrode, and the light-emitting elements are disposed on the first insulating layer.

7. The display device of claim 6, wherein the third and fourth contact holes penetrate the first insulating layer, and the third and fourth contact holes penetrate the via insulating layer.

8. The display device of claim 6, further comprising:

a bank layer disposed on the first insulating layer and defining an emission area where the light-emitting elements are disposed, wherein at least part of the emission area overlaps the first metal patterns in a thickness direction.

9. The display device of claim 8, wherein the first power connector does not overlap the emission area in the thickness direction, and the first power connector does not overlap the bank layer in the thickness direction.

10. The display device of claim 1, wherein the first metal layer further includes second metal patterns, which extend in the first direction, the second metal patterns are spaced apart from the data lines, the first voltage line, and the first metal patterns in the second direction, and the first power connector electrically connects the first voltage line, the first metal patterns, and the second metal patterns.

11. The display device of claim 10, wherein first, second, and third display areas, which are sequentially arranged in the second direction, are defined on the substrate, the first metal layer further includes first, second, and third lower gate lines, which extend in the first direction and are spaced apart from one another, the first lower gate line overlaps the first display area, the second lower gate line overlaps the second display area, the third lower gate line overlaps the third display area, and the upper gate line extends in the second direction across the first, second, and third display areas and is electrically connected to the first, second, and third lower gate lines through first, second, and third contacts, respectively.

12. The display device of claim 11, wherein the first metal patterns are electrically insulated from the first, second, and third lower gate lines, and the second metal patterns are electrically insulated from the first, second, and third lower gate lines.

13. The display device of claim 1, further comprising:

a second power connector disposed in a same layer as the first power connector, wherein the first metal layer further includes a second voltage line and second metal patterns, which extend in the first direction, the second voltage line and the second metal patterns are spaced apart from the data lines, the first voltage line, and the first metal patterns in the second direction, first and second voltages, which have different electric potential levels, are applied to the first and second voltage lines, respectively, and the second power connector electrically connects the second voltage line and the second metal patterns.

14. The display device of claim 13, wherein the first and second power connectors are electrically connected.

15. The display device of claim 14, wherein the first metal patterns and the second metal patterns are disposed in a gap between the first and second voltage lines.

* * * * *